(12) United States Patent
Huynh et al.

(10) Patent No.: US 9,213,788 B2
(45) Date of Patent: Dec. 15, 2015

(54) METHODS AND APPARATUS FOR CONSTRUCTING AND ANALYZING COMPONENT-BASED MODELS OF ENGINEERING SYSTEMS

(75) Inventors: Dinh Bao Phuong Huynh, Cambridge, MA (US); David John Knezevic, Boston, MA (US); Anthony Tyr Patera, Lincoln, MA (US); Harriet Li, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 542 days.

(21) Appl. No.: 13/398,717

(22) Filed: Feb. 16, 2012

(65) Prior Publication Data
US 2013/0103369 A1   Apr. 25, 2013

Related U.S. Application Data

(60) Provisional application No. 61/551,401, filed on Oct. 25, 2011.

(51) Int. Cl.
*G06F 17/10* (2006.01)
*G06F 17/50* (2006.01)
*G06F 17/13* (2006.01)

(52) U.S. Cl.
CPC ............ *G06F 17/5018* (2013.01); *G06F 17/13* (2013.01)

(58) Field of Classification Search
None
See application file for complete search history.

(56) References Cited

U.S. PATENT DOCUMENTS

| | | | |
|---|---|---|---|
| 4,858,146 A | 8/1989 | Shebini | |
| 5,442,569 A * | 8/1995 | Osano | 716/107 |
| 8,531,451 B2 * | 9/2013 | Mital et al. | 345/419 |
| 2004/0236450 A1 * | 11/2004 | Bryant et al. | 700/108 |
| 2009/0259447 A1 * | 10/2009 | Langemyr et al. | 703/2 |
| 2009/0322739 A1 * | 12/2009 | Rubin et al. | 345/419 |
| 2011/0060704 A1 * | 3/2011 | Rubin et al. | 706/12 |
| 2012/0179426 A1 * | 7/2012 | Fontes et al. | 703/1 |
| 2013/0197886 A1 * | 8/2013 | Langemyr et al. | 703/2 |

OTHER PUBLICATIONS

Schiavo et al. Object-Oriented Modelling of Flexible Beams Mutibody Sys Dyn, 15:263-286, 2006.*
Dymola Dymola Dynamic Modeling Laboratory User's Manual Version 5.0 1992-2002.*
Rozza et al. Reduced Basis Approximation and a Posteriori Error Estimation for Affinely Parametrized Elliptic Coercive Partial Differential Equations Arch Comput Methods Eng, 15: 229-275, 2008.*

(Continued)

*Primary Examiner* — Omar Fernandez Rivas
*Assistant Examiner* — Cuong Luu
(74) *Attorney, Agent, or Firm* — Wolf, Greenfield & Sacks, P.C.

(57) ABSTRACT

Systems, methods, and apparatus for modeling and analyzing a physical system comprising a plurality of components. In some embodiments, a component type of a component of the plurality of components may be used to access a dataset from a plurality of datasets. The dataset may include a representation of at least one partial differential equation. A model of the component may be constructed based at least in part on the accessed dataset and at least one parameter relating to a physical characteristic of the component, and may be used to compute at least one output value based on at least one input value.

36 Claims, 23 Drawing Sheets

(56) References Cited

OTHER PUBLICATIONS

Taylor Computational Science Module: Analysis of Damaged Panels in Supersonic Flow Dept. of Computer Science and Engineering Wright State University, Dayton, OH, Oct. 1, 2010.*
Zaiczek et al. Import of Distributed Parameter Models into Lump Parameter Model Libraries for the Example of Linearly Deformable Solid Bodies 3rd International Workshop on Equation-Based Object-Oriented Languages and Tools, Oct. 2010.*
Rozza et al., Reduced Basis Approximation and a Posteriori Error Estimation for Affinely Parametrized Elliptic Coercive Partial Differential Equations. Archives of Computational Methods in Engineering. Sep. 2008;15(3):229-275.
Schiavo et al., Object-oriented modeling of flexible beams. Multibody System Dynamics. Jun. 2006;15(3):263-286.
International Search Report and Written Opinion of Application No. PCT/US2012/033090 dated Jun. 12, 2013.
International Preliminary Report on Patentability of Application No. PCT/US2012/033090 dated May 8, 2014.
Antil et al., "Domain decomposition and balanced truncation and model reduction for shape optimization of the Stokes system," *Optimization Methods & Software*, (2010).
Antil et al., "Domain decomposition and model reduction for the numerical solution of PDE constrained optimization problems with localized optimization variables," *Computing and Visualization in Science*, 13(6):249-264 (2010).
Barbič et al., "Real-time Large-deformation Substructuring," *ACM Transaction on Graphics*, 30(4) (SIG GRAPH), Vancouver, Canada. Aug. 2011.
Barrault et al., "An 'empirical interpolation' method: application to efficient reduced-basis discretization of partial differential equations," *Comptes Rendus Mathematique*, 339(9):667-672 (2004).
Bermudez et al., "Galerkin lumped parameter methods for transient problems," *International Journal for Numerical Methods in Engineering*, 87:943-961 (2011).
Binev et al., "Convergence rates for greedy algorithms in reduced basis methods. Technical report," *Aachen Institute for Advanced Study in Computational Engineering Science*, Pre-print: AICES May 2, 2010.
Bjorstad et al., "Iterative methods for the solution of elliptic problems on regions partitioned into substructures," *SIAM Journal on Numerical Analysis*, 23(6):1097-1120 (1986).
Brenner, "The condition number of the Schur complement in domain decomposition," *Numerische Mathematik*, 83:187-203 (1999).
Buffa et al., "A priori convergence of the greedy algorithm for the parametrized reduced basis," *Mathematical Modelling and Numerical Analysis* (2010).
Chen et al., "A seamless reduced basis element methods for 2D maxwell's problem: an introduction," vol. 76. *In spectral and high order methods for partial differential equations—selectected papers from the CASOHOM '09 Conference* (2011).
Craig et al., "Coupling of substructures for dynamic analyses,"AIAA Journal, 6(7):1313-1319 (1968).
Eftang et al., "An 'hp' certified reduced basis method for parametrized elliptic partial differential equations," *SIAM Journal on Scientific Computing*, 32(6):3170-3200 (2010).
Ganesh et al., "A reduced basis method for multiple electromagnetic scattering in three dimensions," *Technical Report*, Sep. 2011, Scientific Computing Group, Brown University, Providence , RI, USA, May 2011.
Haggblad et al., "Model reduction methods for dynamic analyses of large structures," *Computers and Structures*, 47(4-5):735-749 (1993).
Hurty, "Dynamic analysis of structural systems using component modes," *In First AIAA Annual Meeting*, No. 64-487 (Jun. 29-Jul. 2, 1964).
Huynh et al., "A successive constraint linear optimization method for lower bounds of parametric coercivity and inf-sup stability constants," *Comptes Rendus Mathematique*, 345(8):473-478 (2007).
Kirk et al., "A C++ library for parallel adaptive mesh refinement/ coarsening simulations," *Engineering with Computers*, 22(3-4):237-254 (2006).
Knezevic et al., "A high-performance parallel implementation of the certified reduced basis method," *Computer Methods in Applied Mechanics and Engineering*, 200(13-16): 1455-1466 (2011).
Maday et al., "A priori convergence theory for reduced-basis approximations of single-parameter elliptic partial differential equations," *Journal of Scientific Computing*, 17:437-446 (2002).
Maday et al., "The reduced basis element method: application to a thermal fin problem," *SIAM Journal on Scientific Computing*, 26(1):240-258 (2004).
Maday et al., "A reduced-basis element method," *Journal of Scientific Computing*, 17:447-459 (2002).
Nguyen, "A multiscale reduced-basis method for parametrized elliptic partial differential equations with multiple scales," *Journal of Computational Physics*, 227:9807-9822 (2007).
Prud'Homme et al., "Reliable real-time solution of parametrized partial differential equations: reduced-basis output bounds methods," *Journal of Fluids Engineering*, 124(1):70-80 (2002).
Rozza et al., "Reduced basis approximation and a posteriori error estimation for affinely parmetrized elliptic coercive partial differential equations," *Archives Computational Methods in Engineering*, 15(3):229-275 (Sep. 2008).
Sen, "Reduced basis approximation and a posteriori error estimation for many-parameter heat conduction problems," Numerical Heat Transfer, Part B: Fundamentals, 54(5):369-389 (2008).
Seshu, "Substructuring and component mode synthesis," *Shock and Vibration*, 4:199-210 (1997).

* cited by examiner $\psi_{1,L-P,COM}$        $\psi_{2,L-P,COM}$ $\psi_{3,L-P,COM}$        $\psi_{4,L-P,COM}$

METHODS AND APPARATUS FOR CONSTRUCTING AND ANALYZING COMPONENT-BASED MODELS OF ENGINEERING SYSTEMS

CROSS REFERENCE TO RELATED APPLICATIONS

This application claims the benefit of Provisional Application Ser. No. 61/551,401, filed on Oct. 25, 2011, which is incorporated herein by reference in its entirety.

FEDERALLY SPONSORED RESEARCH

This invention was made with government support under Grant No. FA9550-09-1-0613 awarded by the U.S. Air Force Aerospace Research Office of Scientific Research. The government has certain rights in this invention.

BACKGROUND

Computer simulations are one of the most useful tools in modern engineering. To evaluate a proposed solution to a complex engineering problem, an engineer typically uses a Finite Element Analysis (FEA) software tool to construct a mathematical model of the proposed solution and to run FEA simulations based on the mathematical model. For instance, when designing a bridge, a structural engineer can use an FEA tool to construct a model of a proposed design and to run simulations to determine whether any stress "hot spots" exist under various loading conditions.

FEA refers generally to a class of numerical analysis techniques for approximating solutions of partial differential equations. These techniques attempt to break down a complex physical system into simpler subsystems that are analyzed locally. For instance, in the example of the proposed bridge design, a mathematical domain representing the structure of the bridge can be divided into a set of disjoint subdomains each representing a portion of the structure. An unknown function of interest (e.g., displacement or stress) can then be approximated locally over each subdomain.

Several FEA tools are available commercially, such as MSC Nastran by MSC.Software Corporation, COMSOL Multiphysics® by COMSOL AB, SAP 2000® by Computers and Structures, Inc., and ANSYS® by ANSYS, Inc.

SUMMARY

Systems, methods, and apparatus for modeling and analyzing a physical system comprising a plurality of components.

In some embodiments, a method is provided, comprising acts of: accessing, based at least in part on a component type of a component of the plurality of components, a dataset from a plurality of datasets, the dataset comprising a representation of at least one partial differential equation; constructing a model of the component based at least in part on the accessed dataset and at least one parameter relating to a physical characteristic of the component; and using the model of the component to compute at least one output value based on at least one input value.

In some further embodiments, a system is provided, comprising at least one processor programmed to: access, based at least in part on a component type of a component of the plurality of components, a dataset from a plurality of datasets, the dataset comprising a representation of at least one partial differential equation; construct a model of the component based at least in part on the accessed dataset and at least one parameter relating to a physical characteristic of the component; and use the model of the component to compute at least one output value based on at least one input value.

In yet some further embodiments, at least one computer-readable medium is provided, having encoded thereon instructions that, when executed by at least one processor, implement a method for modeling and analyzing a physical system comprising a plurality of components, the method comprising acts of: accessing, based at least in part on a component type of a component of the plurality of components, a dataset from a plurality of datasets, the dataset comprising a representation of at least one partial differential equation; constructing a model of the component based at least in part on the accessed dataset and at least one parameter relating to a physical characteristic of the component; and using the model of the component to compute at least one output value based on at least one input value.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The accompanying drawings are not necessarily drawn to scale. For purposes of clarity, not every component may be labeled in every drawing.

FIGS. 5A-C illustrate an example in which a simulation tool is used to analyze a potential system failure, in accordance with some embodiments.

DETAILED DESCRIPTION OF INVENTION

Figure 1:
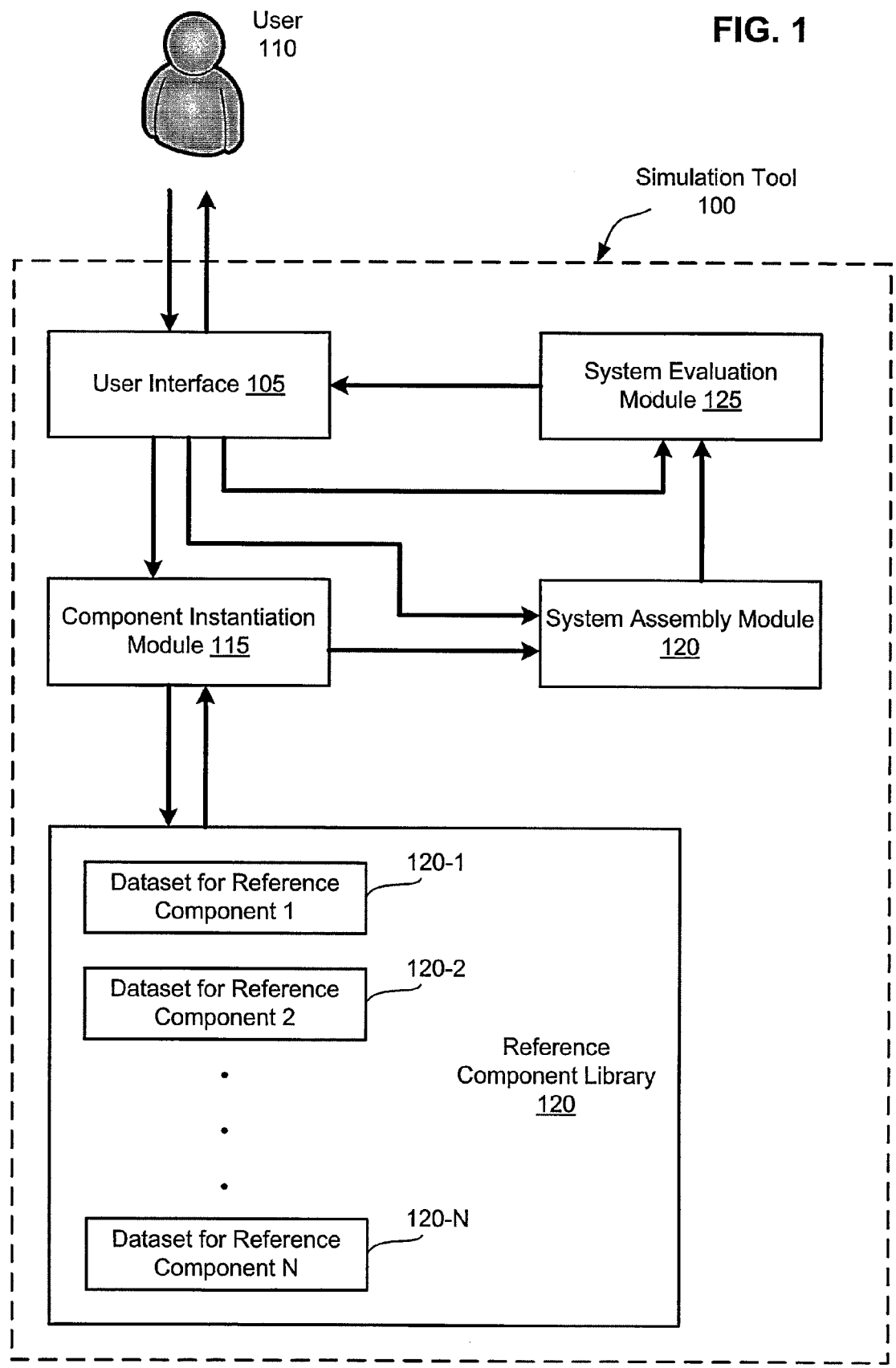
FIG. 1 shows an illustrative simulation tool for constructing and analyzing component-based models of engineering systems, in accordance with some embodiments.

The inventors have recognized and appreciated a number of disadvantages of conventional simulation techniques.

First, conventional FEA tools require users to go through extensive training to learn how to construct and analyze three-dimensional (3D) models. Even with adequate training, the model construction process tends to be complex and time-consuming. As a result, engineers are discouraged from verifying their designs using full-scale 3D simulations. Instead, engineers often rely on more limited modeling techniques, such as those based on one-dimensional (1D) "stick" models. Such techniques may lead to oversimplification of complex physical systems and hence may be less effective in uncovering design flaws. Therefore, a need exists for a simulation tool that allows users to construct and analyze 3D models in a simple and intuitive manner.

Second, while some conventional FEA tools allow users to construct 3D models and perform full-scale simulations, such simulations are computationally intensive and require powerful hardware infrastructure. Typically, to simulate a real-world problem such as a design of a bridge, each simulation run that corresponds to a particular set of loading conditions can take an hour or more to complete. Even with supercomputers, which are costly to acquire and maintain, engineers often need to wait more than a day to obtain simulation results on all loading conditions of interest. Therefore, a need exists for a simulation tool that can deliver results in real time (e.g., in about one minute, thirty seconds, fifteen seconds, five seconds, two seconds, one second, or less) without expensive hardware.

Third, conventional FEA tools do not provide efficient mechanisms for fine tuning system designs. For example, whenever a user modifies any aspect of a design, a conventional FEA tool re-computes a full FEA solution on the entire physical system. As a result, conventional FEA tools are unable to deliver updated simulation results in real time, even for minor modifications. Therefore, a need exists for a simulation tool that provides convenient mechanisms for modifying system designs and efficiently computes updated simulation results.

Fourth, conventional FEA tools offer few opportunities for reusing existing work. A user typically constructs a new FEA model for each new physical system to be analyzed, and a full FEA solution is computed based on the new model, even if the new physical system shares similar components with physical systems previously analyzed. Therefore, a need exists for a simulation tool that provides convenient mechanisms for managing and reusing previously computed data, which may significantly shorten the amount of time needed to build a computational model and perform a simulation.

Accordingly, in some embodiments, systems, methods and apparatus are provided for constructing and analyzing component-based models of engineering systems.

In accordance with some embodiments, an improved simulation tool is provided that allows a user to construct a model for a physical system in a "bottom-up" fashion, by creating models for components in the physical system and specifying how the components are interconnected. For instance, each component in the physical system may have one or more ports for connecting to one or more other components, so that the user may specify a connection between a first component and a second component by simply selecting a first port of the first component and a second port of the second component and indicating that the first and second ports are to be connected.

The inventors have recognized and appreciated that it may be beneficial to provide parametrizable components. For example, in one implementation, a library of reference components is provided, where each reference component may conceptually represent a component type, such as a component with one or more parameters unspecified. In such an embodiment, a user may create a component model simply by selecting a reference component from the library of reference components and then specifying one or more parameters to be used to instantiate the selected reference component.

In accordance with some further embodiments, an improved simulation tool is provided that is capable of delivering FEA simulation results in real time using only commonly available hardware, such as hardware on a desktop computer, a laptop computer, a smartphone, or some other suitable user device. In some implementations, a static condensation procedure may be used to eliminate one or more degrees of freedom internal to at least one component in the physical system, and a reduced basis (RB) approximation technique may be applied to reduce the computational complexity associated with the static condensation procedure. For example, rather than computing an exact solution for a so-called "bubble function" as done in a conventional static condensation procedure, an RB approximation of the bubble function may be computed, which may lead to significant computational savings.

The inventors have further recognized and appreciated that it may be beneficial to decompose an RB computation into two steps, Construction and Evaluation, such that the Construction step may be computationally expensive but may result in readily reusable data, while the Evaluation step may be computationally inexpensive. For example, in an embodiment with parametrizable components, a Construction step may produce data corresponding to a reference component (which may, mathematically, correspond to a family of components that differ only in one or more parameters), and an Evaluation step may use the data produced by the Construction step to construct and analyze a component model corresponding to an instance of the reference component (e.g., with specified parameter values). As a more specific example, the Construction step may involve solving one or more instances of at least one partial differential equation, where each instance may correspond to a different set of one or more parameters for the partial differential equation. The data thus generated may be used during the Evaluation step to solve any new instance of the partial different equation corresponding to any set of parameters drawn from selected parameter ranges. In this manner, the cost incurred during the Construction step for a reference component may be amortized over multiple instantiations of the reference component. Furthermore, in some embodiments, the Construction step may be performed offline (e.g., before actual parameters are determined for a specific problem), so that only the relatively inexpensive Evaluation step is performed online.

In accordance with some further embodiments, an improved simulation tool is provided that allows a user to modify one or more aspects of a physical system and obtain updated simulation results in real time. For instance, user interface functions may be provided for the user to perform various modifications, including, but not limited to, modifying one or more parameters of a component, adding a component (e.g., by cloning an existing component), removing a component, disconnecting previously connected components, moving a component from one part of the physical system to another part of the physical system, and rotating a component. In response to such changes requested by the user, the simulation tool may be able to quickly deliver updated simulation results by leveraging previously computed data. For example, in some implementations, the simulation tool may update certain computations relating to components whose parameters and/or connections are changed, but may reuse previously computed data for components that are not directly affected by the changes.

In accordance with some further embodiments, an improved simulation tool may perform one or more consistency checks to determine whether changes requested by a user are compatible with other aspects of a physical system. The simulation tool may alert the user if any incompatibility is detected. Additionally, or alternatively, the simulation tool may propose further changes to the physical system to remove one or more incompatibilities introduced by the user-requested changes.

In accordance with some further embodiments, an improved simulation tool is provided that automatically computes an error associated with a simulation result. In some implementations, an error may be a rigorously computed error bound, such as a maximum possible difference between the simulation result and a result that would have been obtained had a full FEA solution been computed. For example, in an embodiment in which RB approximations are computed for bubble functions, a "local" error bound may be computed for each bubble function, where the local error bound indicates a difference between a reduced order model computed for the bubble function and a corresponding full FEA solution. Such local error bounds may then be combined to obtain an overall error bound for an entire physical system or a portion thereof. In other implementations, an error may be an error estimate that can be computed in less time compared to a rigorous error bound. In yet some other implementations, a user may choose which type of error (e.g., rigorous error bound or error estimate) is to be computed by the simulation tool. Following below are more detailed descriptions of various concepts related to, and embodiments of, inventive systems, methods, and apparatus for constructing and analyzing component-based models of engineering systems. It should be appreciated that various concepts introduced above and discussed in greater detail below may be implemented in any of numerous ways, as the disclosed concepts are not limited to any particular manner of implementation. For instance, the present disclosure is not limited to the particular arrangements of components shown in the various figures, as other arrangements may also be suitable. Such examples of specific implementations and applications are provided solely for illustrative purposes.

FIG. 1 shows an illustrative simulation tool 100 for constructing and analyzing component-based models of engineering systems, in accordance with some embodiments. The simulation tool 100 may be used to model and analyze a variety of different engineering problems, including, but not limited to, problems relating to solid mechanics, fluid mechanics, heat transfer, and acoustics. For instance, in some embodiments, the simulation tool 100 may be adapted to generate and solve systems of partial differential equations representing different types of physical problems, including, but not limited to, equilibrium problems, eigenproblems, and time-dependent problems. In some further embodiments, the simulation tool 100 may be adapted to generate and solve a system of partial differential equations representing a combination problem, for example, a buckling problem, which may be a combination of an eigenproblem and an equilibrium problem.

In the example shown in FIG. 1, the illustrative simulation tool 100 includes a user interface 105 through which a user 110 may interact with the simulation tool 100. For instance, the user interface 105 may allow the user 110 to construct a model for a physical system by specifying one or more aspects of the physical system, such as geometry, material, and/or any other suitable physical characteristics. Once such a model is constructed, the user 110 may, again via the user interface 105, direct the simulation tool 100 to perform a simulation based on the model to predict how the physical system may behave under one or more selected conditions. Results of the simulation may be delivered to the user 110 via the user interface 105 in any suitable manner, such as by visually rendering one or more output values of the simulation.

In some embodiments, the simulation tool 100 may allow the user 110 to construct a model in a "bottom-up" fashion, by creating models for components in the physical system and specifying how the components are interconnected. For instance, the simulation tool 100 may allow the user 110 to create a model for a component by browsing through a library of reference components. (As discussed above, a reference component may conceptually represent a component with one or more parameters unspecified, or a component type.) The user 110 may select from the library a reference component having one or more desired characteristics, such as geometry, material, and/or any other suitable physical characteristics, and specify one or more parameters to be used by the simulation tool 100 to instantiate the selected reference component. Furthermore, the simulation tool 100 may allow the user 110 to specify how the component is to be "docked" within the physical system, for example, by specifying one or more ports of the component and one or more corresponding ports of the physical system and indicating that the component is to be connected to the physical system at the specified ports.

In the example shown in FIG. 1, the simulation tool 100 includes a component instantiation module 115 adapted to use the component parameters specified by the user 110 to instantiate the reference component selected by the user 110. For instance, the component instantiation module 115 may be adapted to access a reference component library 120 that stores a plurality of datasets (e.g., datasets 120-1, 120-2, . . . 120-N, as shown in FIG. 1) corresponding respectively to a plurality of reference components. The component instantiation module 115 may access a dataset corresponding to the reference component selected by the user 110, and may use the component parameters specified by the user 110 and the accessed dataset to create a component model. For example, in some embodiments, the component instantiation module 115 may use the component parameters specified by the user 110 and the dataset accessed from the library 120 to derive one or more partial differential equations that represent the component. As a more specific example, the component instantiation module 115 may use the component parameters specified by the user 110 and the dataset accessed from the library 120 to compute a so-called "local stiffness matrix" and a so-called "local load vector" that represent the component.

In various embodiments, pre-computed reference component datasets may be made available to users via different channels. For example, an educational institution, an engineering firm, an equipment manufacturer, or some other suitable entity may develop and maintain a library of pre-computed reference component datasets for internal use. As another example, a group of entities may enter into an agreement to jointly develop and maintain a shared library of pre-computed reference component datasets. As yet another example, a component manufacturer may make pre-computed reference component datasets available to component purchasers, either with the purchase of corresponding components, or as an additional service. As yet another example, a library of pre-computed reference component datasets may be maintained by a private or governmental entity, where public access may be allowed either at no charge or under some suitable billing arrangement. For instance, a user may pay a fee to subscribe to the library. Additionally, or alternatively, a user may pay a fee for each dataset accessed from the library. The fee may vary depending on a number of factors, such as a subscription package paid for by the user, whether the accessed dataset belongs to a pool of premium content, and/or whether a contributor of the dataset receives compensation for allowing access to the dataset. Other ways of developing, maintaining, and/or distributing pre-computed reference component datasets may also be possible, as aspects of the present disclosure are not so limited.

Returning to the example shown in FIG. 1, the simulation tool 100 further includes a system assembly module 120 adapted to construct a model for the overall physical system based on component models created by the component instantiation module 115 and information provided by the user 110 regarding how the components are to be connected. For instance, in an embodiment in which the components are connected at ports specified by the user 110, the component models created by the component instantiation module 115 may contain information relating to the ports, and the system assembly module 120 may use the information relating to the ports to combine the component models into a system model. For example, in some embodiments, the system model may include one or more partial differential equations representing the overall physical system, and the system assembly module 120 may derive the partial differential equations representing the overall physical system using partial differential equations representing individual components. As a more specific example, the system assembly module 120 may use local stiffness matrices and local load vectors associated with the components to compute a global stiffness matrix and a global load vector for the overall physical system.

In the example shown in FIG. 1, the simulation tool 100 further includes a system evaluation module 125 adapted to compute one or more output values of interest based on one or more input values provided by the user 110. Such input values may represent loading and/or boundary conditions for the physical system being analyzed. For instance, in an example in which the physical system is a bridge, the user 110 may specify a location at which a load is to be applied to the bridge and a size of the load, which may be used by the system evaluation module 125 as loading conditions. The user 110 may further specify that the bottom of each pillar of the bridge is to have zero displacement, which may be used by the system evaluation module 125 as boundary conditions. The system evaluation module 125 may then apply such loading and/or boundary conditions to the system model constructed by the system assembly module 120 to compute one or more output values of interest, such as displacement and/or stress at various parts of the bridge. Such output values may be delivered to the user 110 via the user interface 105 in any suitable manner, for example, by visually displaying one or more graphs, charts, and/or other suitable representations of the output values. Additionally, or alternatively, the output values may be stored in some suitable storage device for future access.

While various illustrative features of a simulation tool are discussed above, it should be appreciated that aspects of the present disclosure are not limited to any specific feature or combination of features. Nor are aspects of the present disclosure limited to the illustrative arrangement of modules shown in FIG. 1. Rather, a simulation tool may include fewer modules, more modules, or different modules, and each module may perform any suitable functionality or combination of functionalities. Furthermore, the modules may be arranged in any suitable manner. For example, in some embodiments, one or more modules may be located remotely from other modules and the modules may communicate with each other using any suitable networking technologies. Further still, some of the computations performed by a module may be distributed across different computers, for example, to deliver simulation results in less time.

Figure 2A:
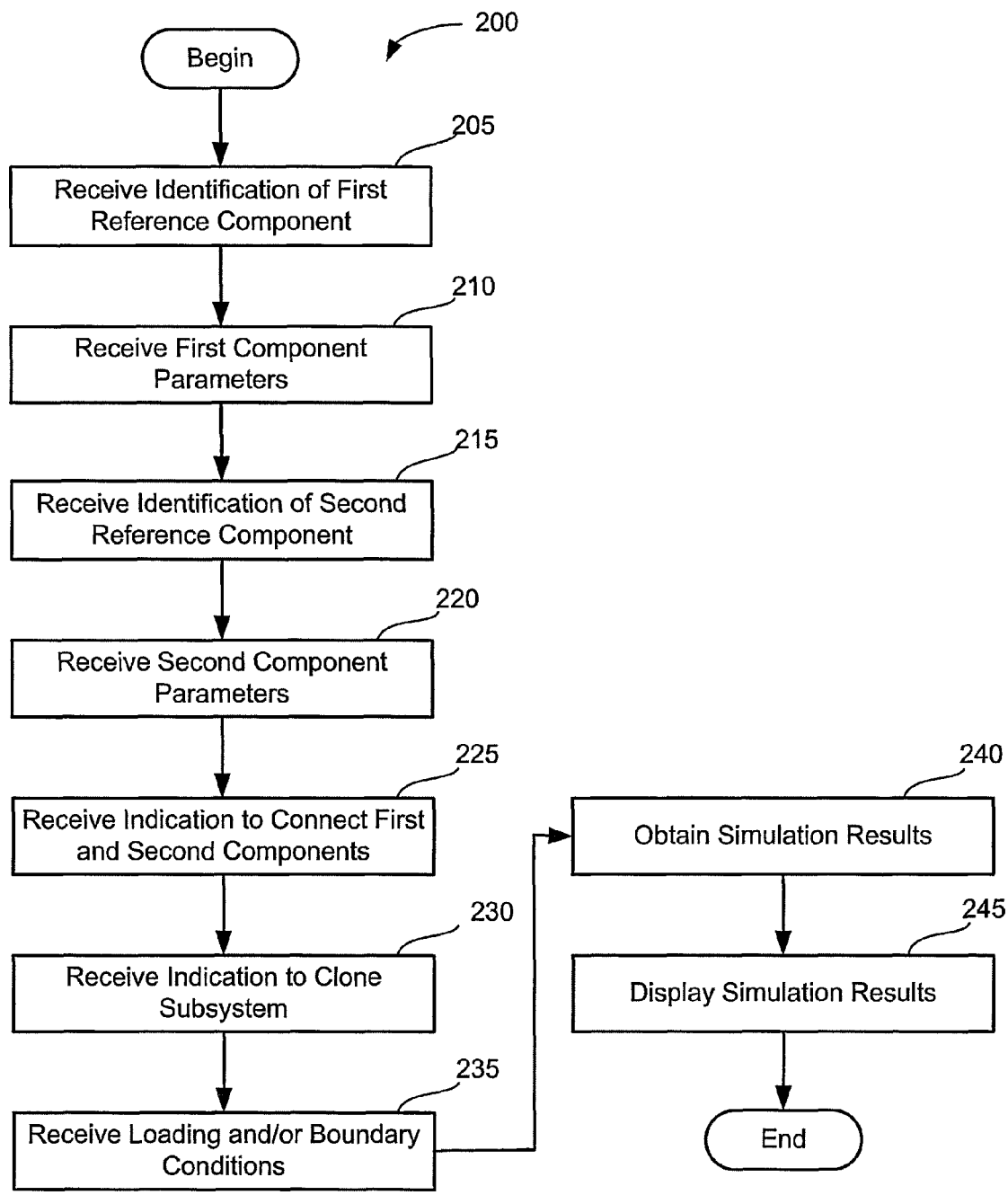
FIG. 2A shows an illustrative process that may be performed by a simulation tool to assist a user in constructing and analyzing a component-based model for a physical system, in accordance with some embodiments.

FIG. 2A shows an illustrative process 200 that may be performed by a simulation tool to assist a user in constructing and analyzing a component-based model for a physical system, in accordance with some embodiments. For example, the process 200 may be performed by the illustrative simulation tool 100 shown in FIG. 1 during a user session to assist the user 110 in constructing a model and performing an FEA simulation. For purposes of illustration, various acts of the process 200 will be explained with reference to FIGS. 3A-J, which show an example of a series of user interactions relating to an analysis of an arch structure. However, it should be appreciated that aspects of the present disclosure are not limited to the particular graphical user interfaces shown in FIGS. 3A-J, nor to the particular problem analyzed (i.e., arch structures). Rather, various inventive concepts disclosed herein may be used, either alone or in combination, to analyze any suitable physical system.

At act 205, the simulation tool may receive an identification of a first reference component to be used to create a model of a first component of the physical system being analyzed. For instance, as discussed above in connection with FIG. 1, the simulation tool may present to the user a plurality of reference components, such as reference components for which pre-computed datasets are available from one or more libraries (e.g., the reference component library 120 in the example of FIG. 1). The user may browse through the reference components and select one or more of them for use in constructing a model of the physical system being analyzed. Alternatively, the user may obtain identification information regarding a desired reference component in some other suitable manner, such as by looking up a directory of reference components for which pre-computed datasets are available.

At act 210, the simulation tool may receive one or more parameters for the reference component identified at act 205. Such parameters may relate to one or more physical characteristic of the component being modeled, such as geometric and material characteristics. However, it should be appreciated that some reference components may not be parameterized, so that no parameters may be received for such reference components.

Figure 3A:
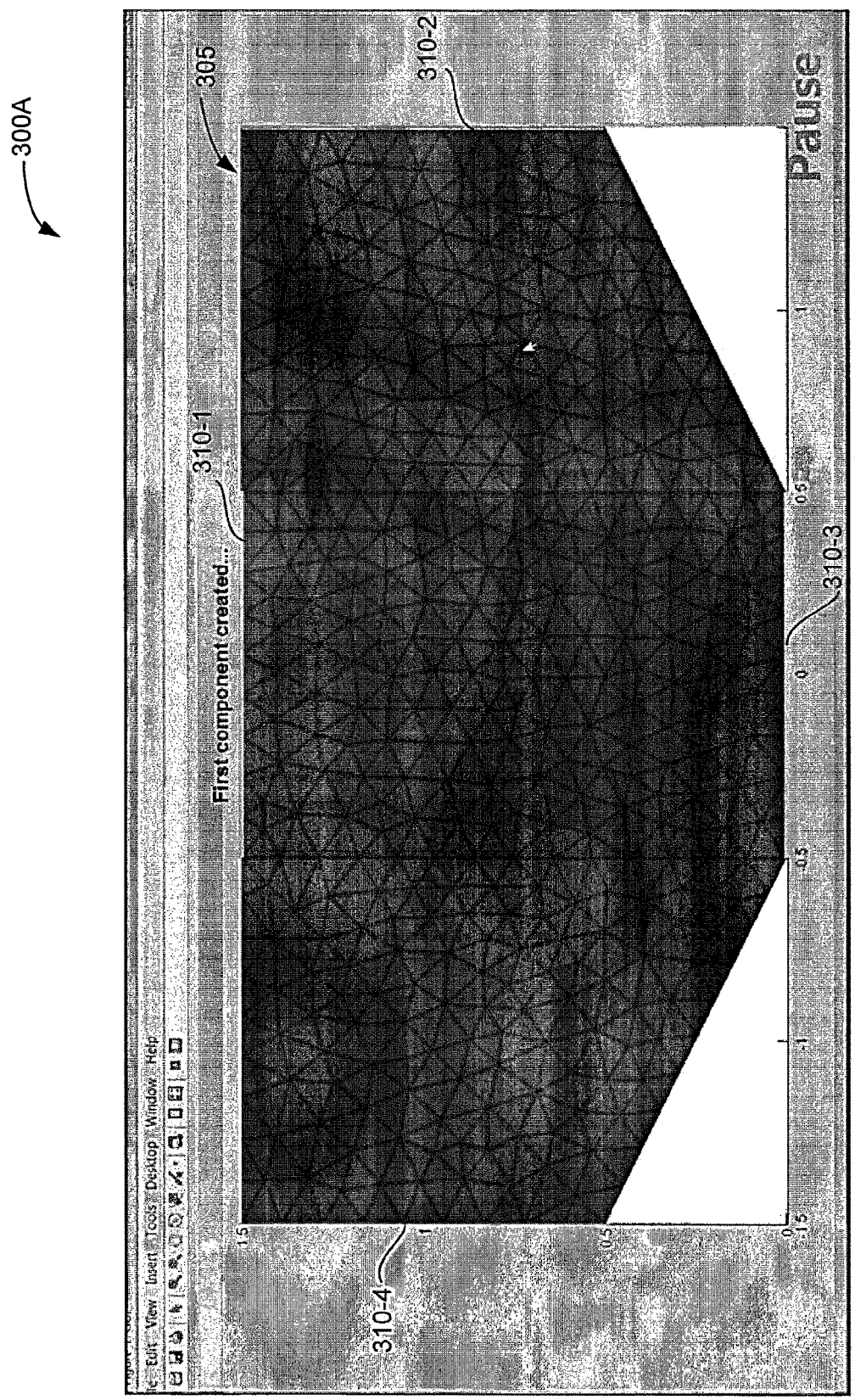
FIGS. 3A-J illustrate various features of a simulation tool, such as features for connecting and cloning components, via an example of a series of user interactions relating to an analysis of an arch structure, in accordance with some embodiments.

Referring to FIG. 3A, an illustrative graphical user interface (GUI) 300A is shown, in which a user selects a reference component corresponding to a keystone to create a component 305, in accordance with some embodiments. In this example, the component 305 has four ports, 320-1, 310-2, 310-3, and 310-4, for connecting to other components. The user may specify the geometry of the keystone, for example, by specifying a width of the keystone, a height of the keystone, and/or a size for each of the four ports 320-1, 310-2, 310-3, and 310-4. Alternatively, one or more suitable geometric relationships may be assumed, so that some measurements may be inferred from other measurements. For example, the port 310-4 may, by definition, have the same dimensions as the port 310-2. As yet another alternative, the user may specify an angle of the arch in combination with other dimensions such as the width and height of the keystone.

Although the illustrative GUI 300A shown in FIG. 3A displays a two-dimensional (2D) representation of the component 305, it should be appreciated that the simulation tool may create and manipulate a 2D or 3D mathematical model of the component 305. For example, the component 305 may be assumed to have a uniform depth, which may be specified by the user. In alternative embodiments, a 3D representation of the component 305 may be displayed, and the user may specify depth information using any suitable input method, for example, by clicking and dragging points of interest using a mouse, or by entering depth information into a dialog box.

Returning to FIG. 2A, the simulation tool may receive an identification of a second reference component at act 215, and may receive, at act 220, one or more parameters for the second reference component identified at act 215. The acts 215 and 220 may be similar to, respectively, the acts 205 and 210 described above.

Figure 3B:
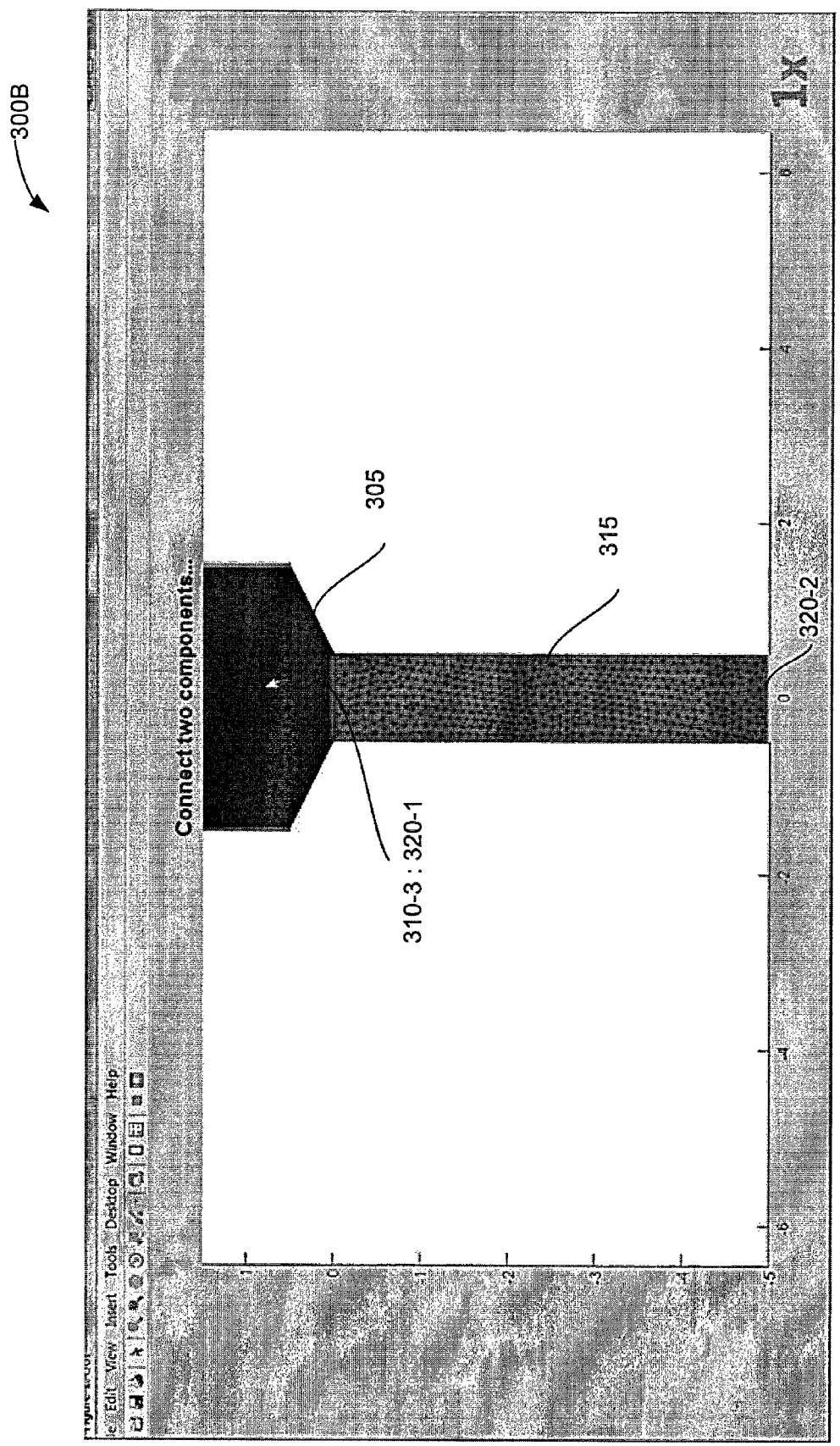

At act 225, the simulation tool may receive an indication that the first and second components specified at acts 205, 210, 215, and 220 are to be connected. For example, with reference to FIG. 3B showing an illustrative GUI 300B, the user may create a component 315 corresponding to a pillar and having ports 320-1 and 320-2, and may indicate that the port 310-3 of the component 305 is to be connected to the port 320-1 of the component 315.

Figure 3C:
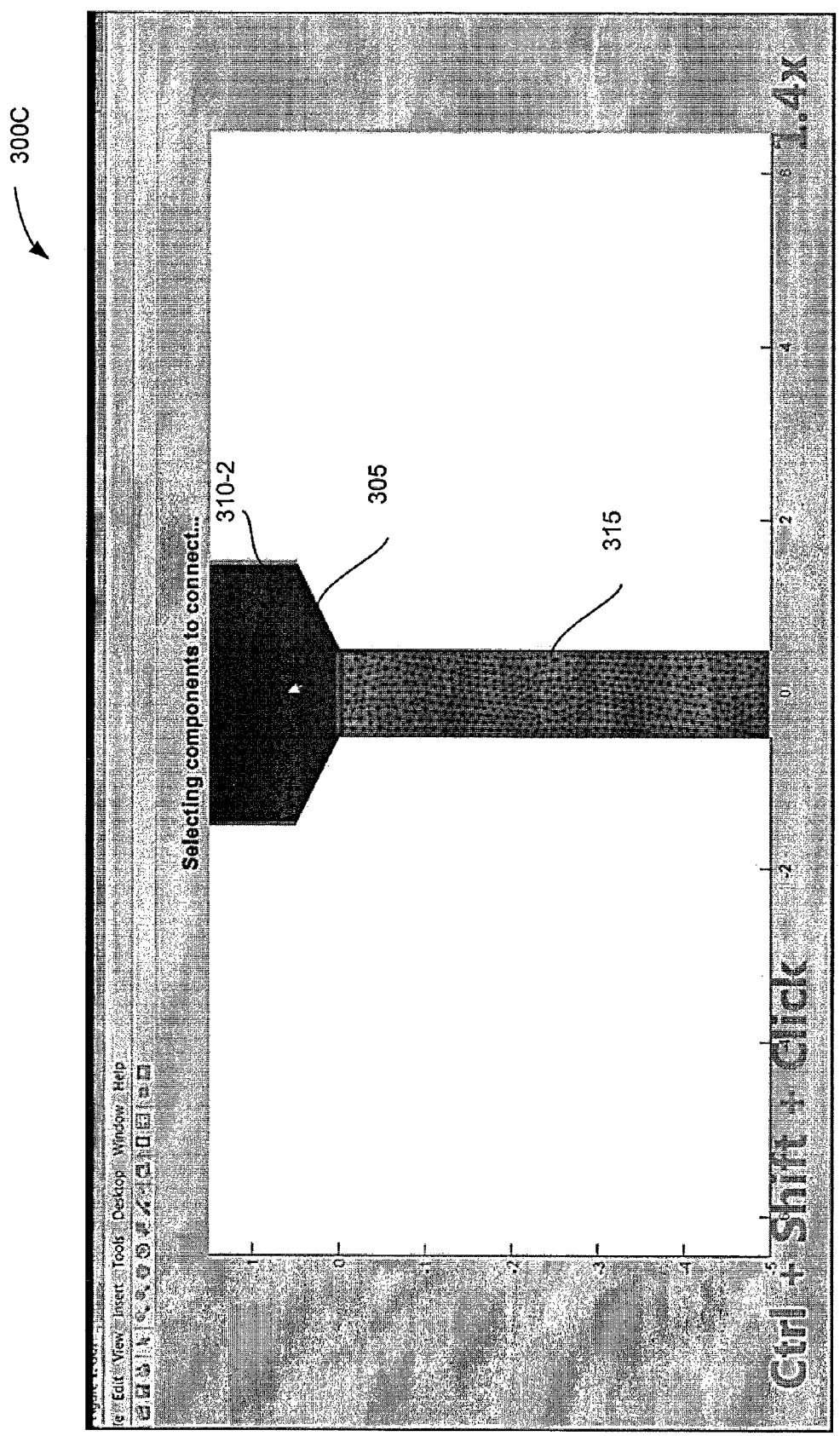

At act 230, the simulation tool may receive an indication that a subsystem including the first and second components specified at acts 205, 210, 215, and 220 are to be cloned. For example, with reference to FIG. 3C showing an illustrative GUI 300C, the user may select the component 305 and the component 315 to form a subsystem for cloning, and may specify that a cloned subsystem is to be connected to the original subsystem at the port 310-2 of the component 305.

Figure 3D:
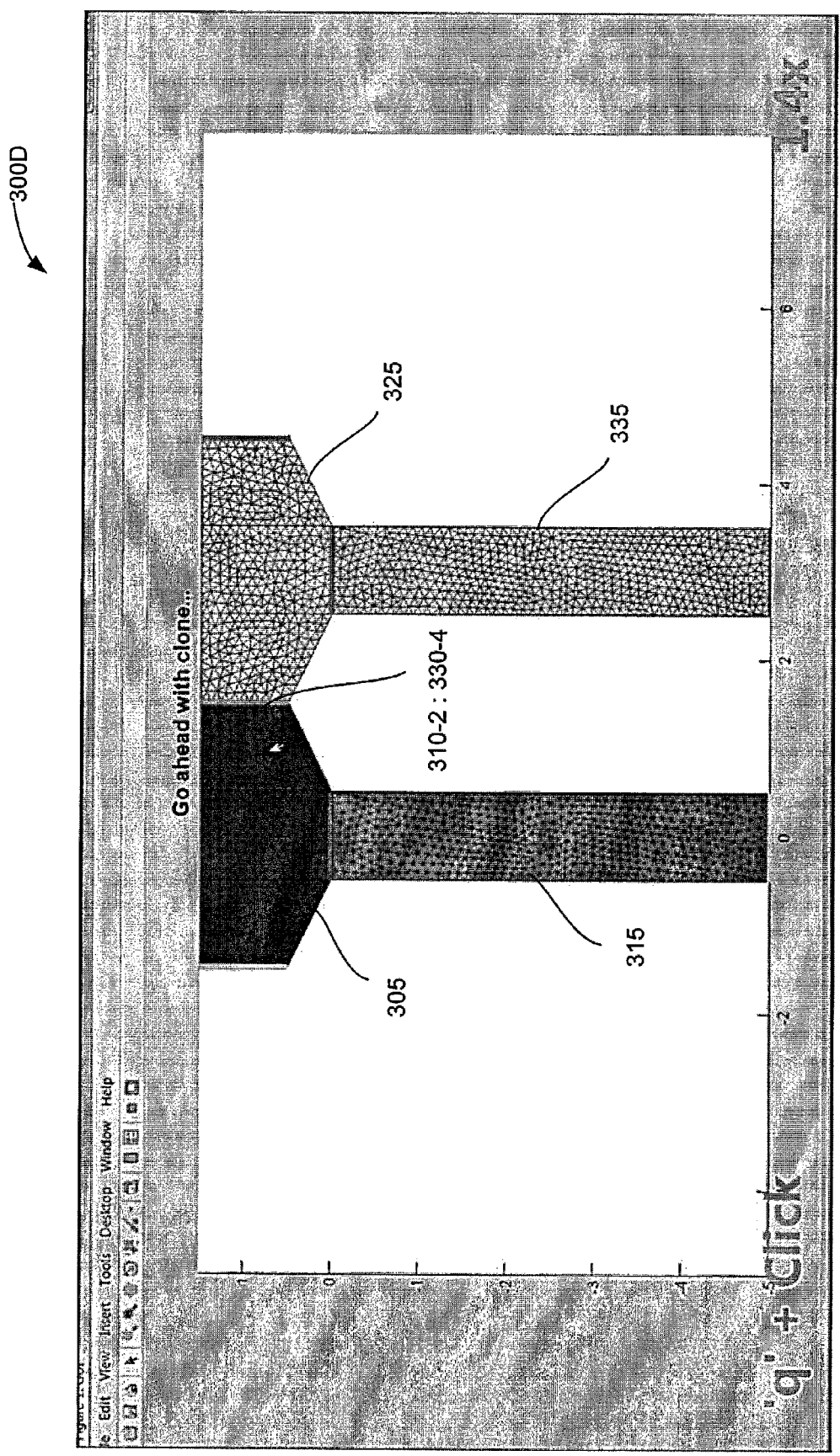

FIG. 3D shows an illustrative GUI 300D displaying an arch structure having the components 305 and 315 and two other components 325 and 335, in accordance with some embodiments. The components 325 and 335 may result from cloning the components 305 and 315, as discussed above in connection with act 230 of FIG. 2A. Because the user specified that the cloned subsystem is to be connected to the original subsystem at the port 310-2 of the component 305, the simulation tool may automatically position the components 325 and 335 relative to the components 305 and 315 in such a manner that the port 310-2 of the component 305 is aligned with the port 330-4 of the component 325. For instance, during the cloning process, the simulation tool may automatically infer that the port 310-2 of the component 305 is to be connected to the port 330-4 of the component 325, and may determine an orientation for the cloned subsystem formed by the components 325 and 335 based on an orientation of the port 310-2 of the component 305.

Figure 3E:
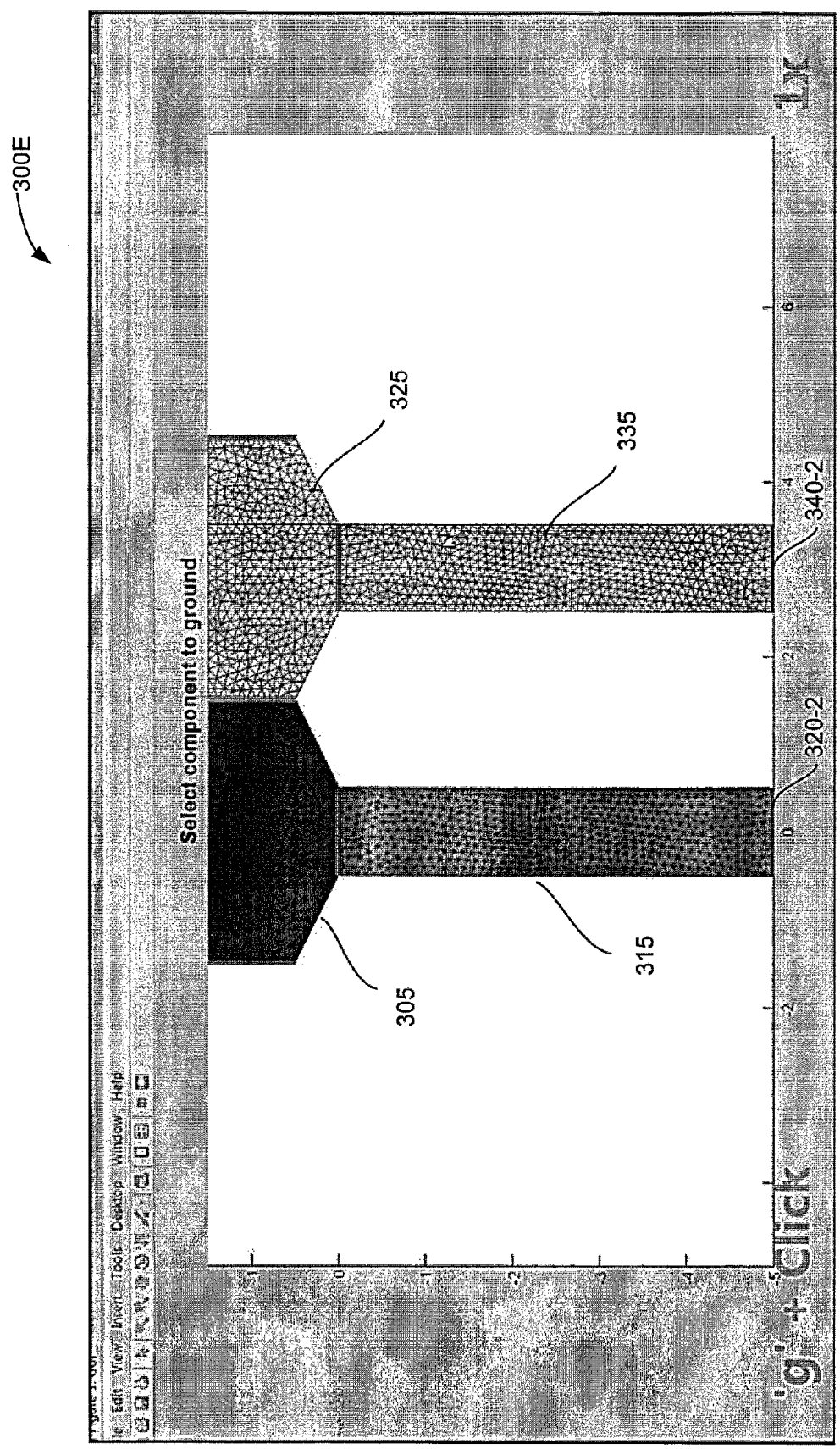

Returning to FIG. 2A, the simulation tool may, at act 235, receive one or more loading and/or boundary conditions. For instance, in the example of the arch structure discussed above, a loading condition may specify a location, a magnitude, and a direction of a force to be applied to the arch structure, whereas a boundary condition may specify how the arch structure is expected to behave at a port that is not connected to any other component in the arch structure. As a more specific example, FIG. 3E shows an illustrative GUI 300E displaying the arch structure having the components 305, 315, 325, and 335, where the user specifies that the port 320-2 of the component 315 and a port 340-2 of the component 335 are to have zero displacement.

Returning to FIG. 2A, the simulation tool may, at act 240, obtain simulation results based on information received from the user and/or other sources. For instance, in some embodiments, the simulation tool may use the identifying information received at acts 205 and 215 to access pre-computed reference component datasets for the first and second reference components. The simulation tool may then use the component parameters received at acts 210 and 220 and the accessed datasets to construct component models for the first and second components. A component model for a cloned component (e.g., the component 325 in the example of FIG. 3D) may be constructed based on the component model for the corresponding original component (e.g., the component 305 in the example of FIG. 3D), for instance, by applying appropriate translational and/or rotational transformations. The simulation tool may then assemble the component models into a system model and compute one or more output values of interest, for example, by solving one or more partial differential equations.

It should be appreciated that any of the processing tasks associated with the act 240 may be performed by one or more computers different from a computer on which the simulation tool is running. For instance, in some alternative embodiments, the simulation tool may request that a simulation be performed by a server located remotely from the simulation tool, and may send relevant information (e.g., identification of reference components, component parameters, and/or information regarding how various components are connected) to the server and receive simulation results from the server. As another alternative, the simulation tool may request component models from a server (e.g., by providing identification of reference components and/or component parameters), but may perform other tasks locally, such as those tasks related to cloning, assembly, and solving partial differential equations. Other ways of distributing the processing tasks may also be suitable, as aspects of the present disclosure are not so limited.

Figure 3F:
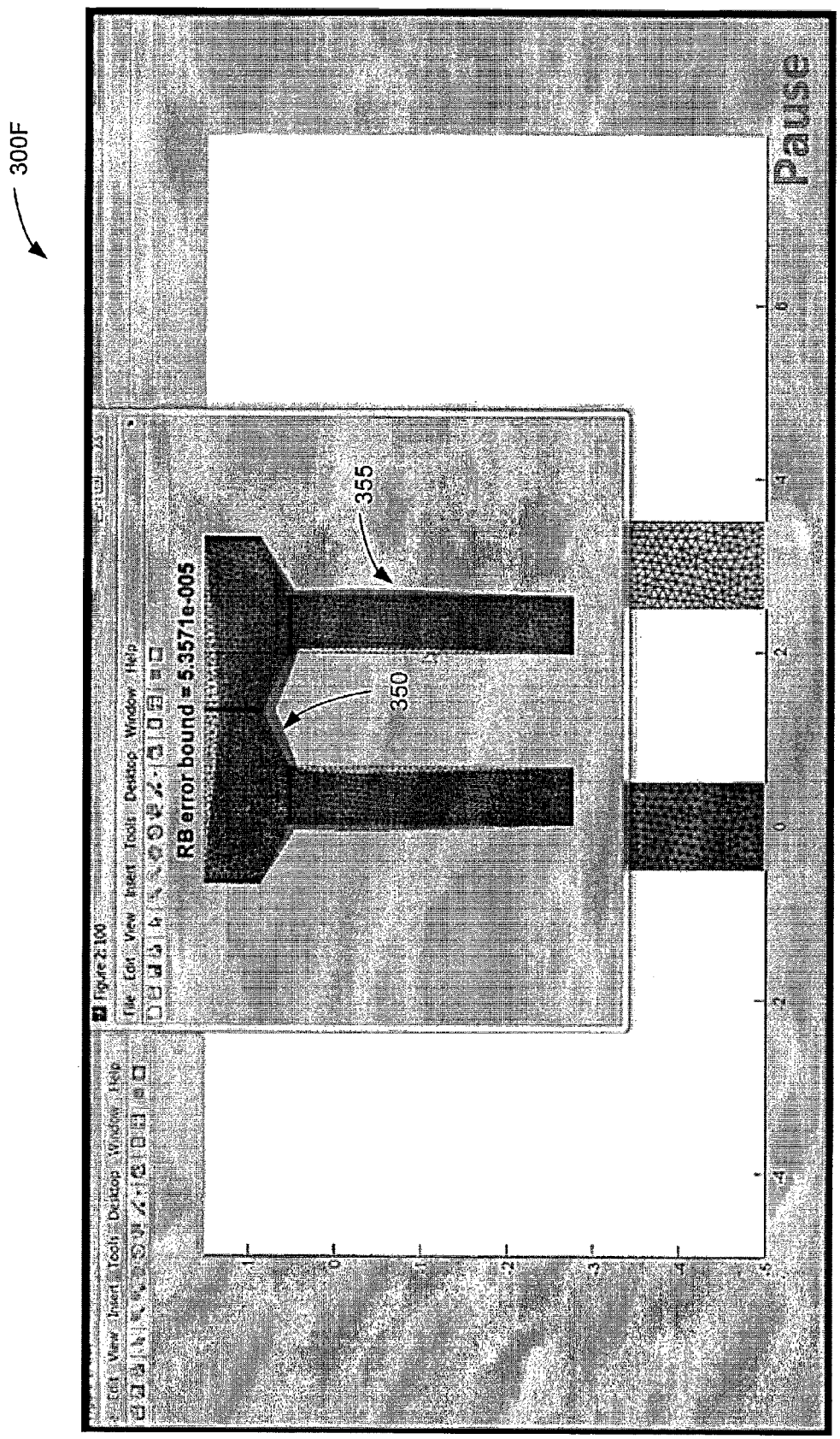
Figure 3G:
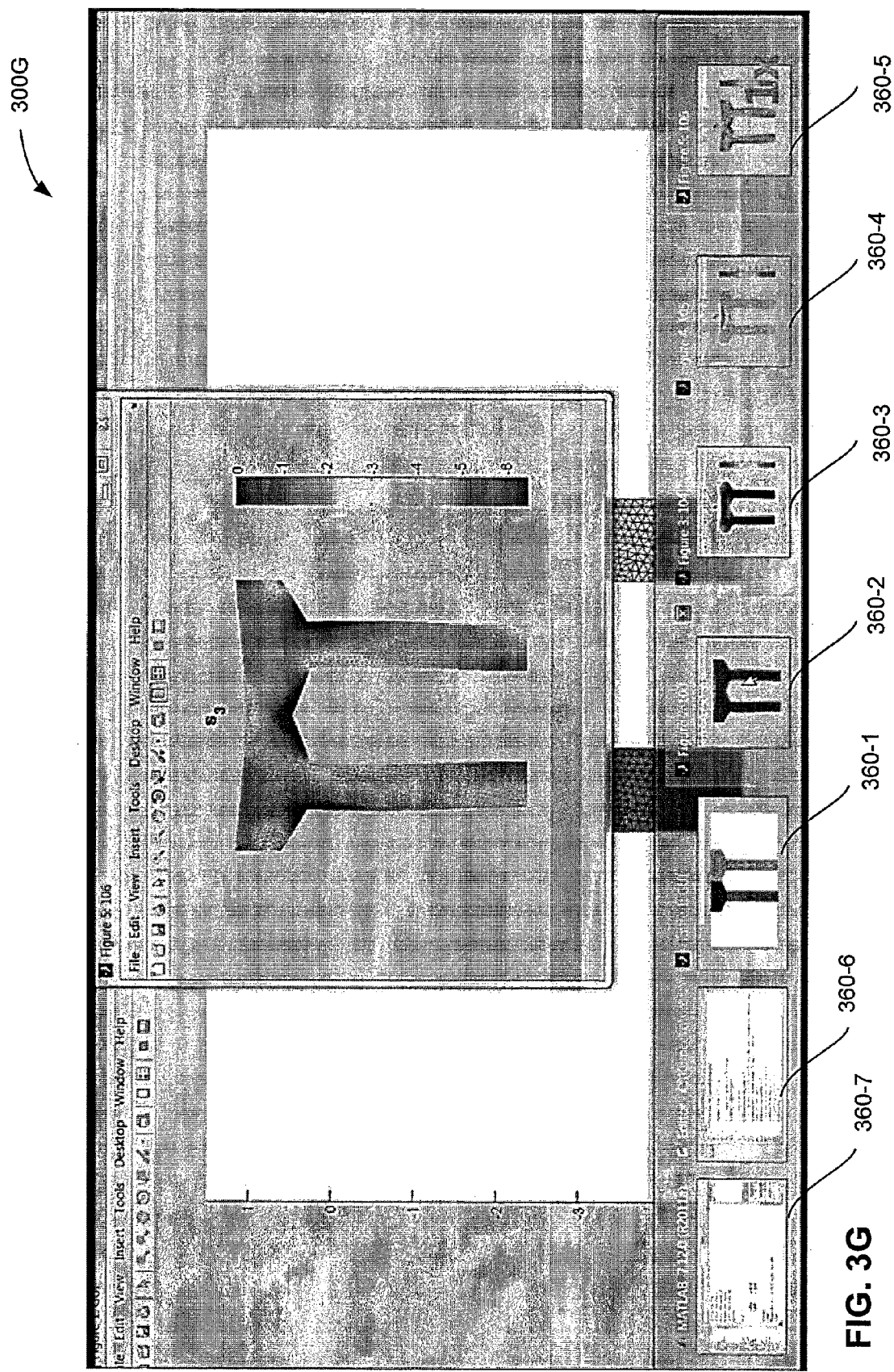
Figure 3H:
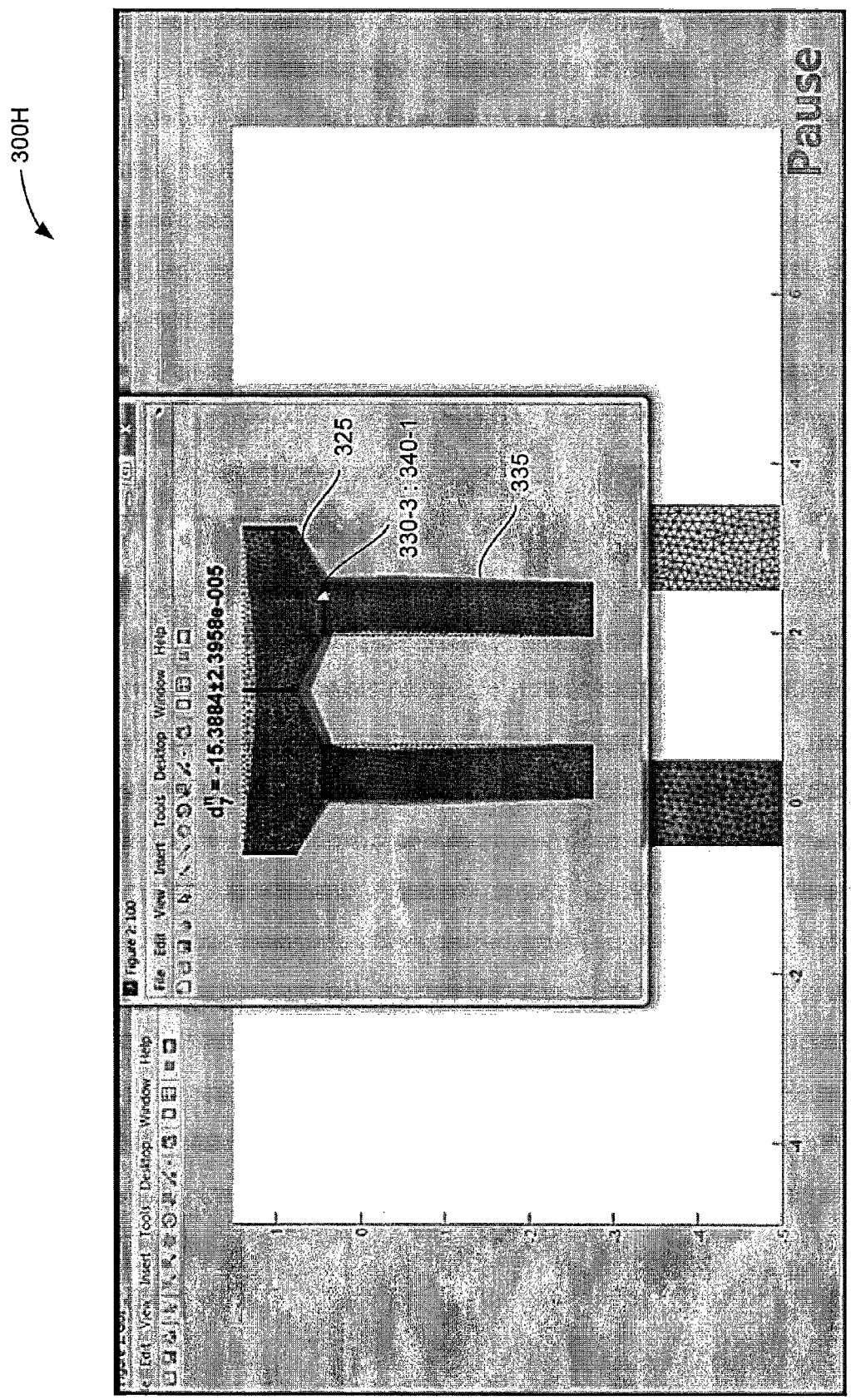
Figure 3I:
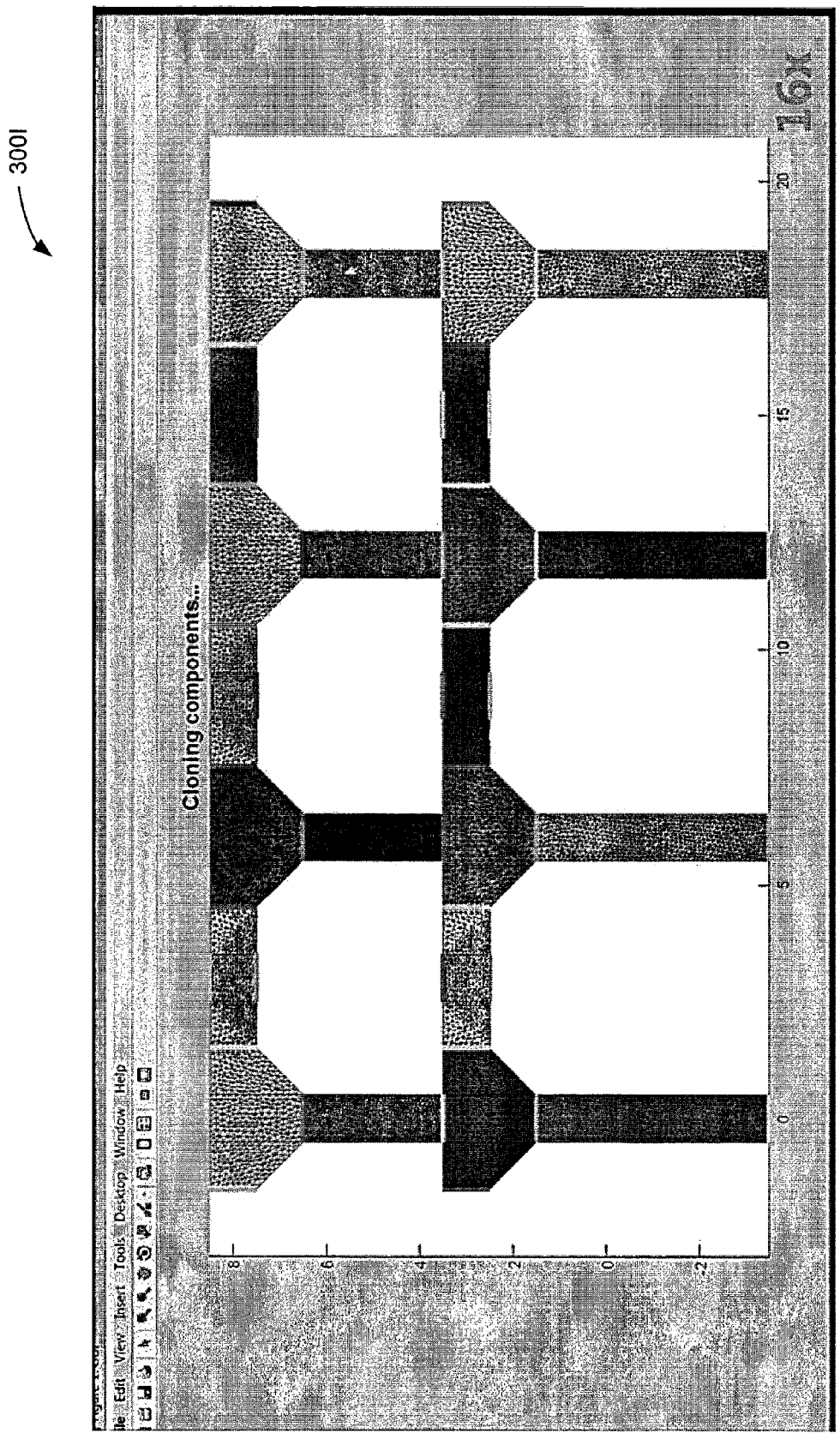
Figure 3J:
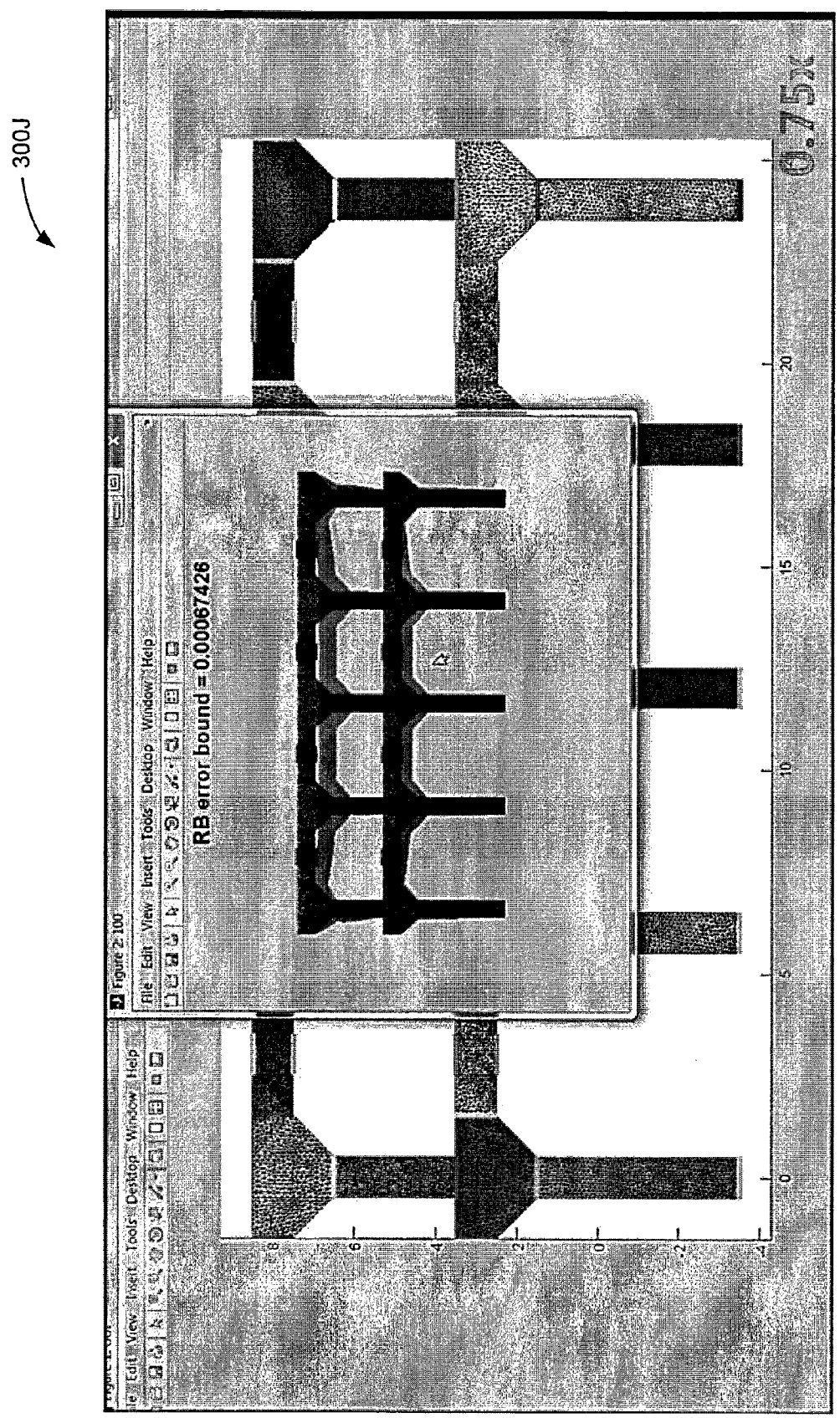

At act 245, the simulation tool may display the simulation results obtained at act 240 to the user. For instance, with reference to the arch structure example discussed above, the simulation results may include predictions regarding how the arch structure would behave under specified loading and/or boundary conditions. One example of such a prediction is the expected deformation (or displacement) of the arch structure, which is displayed in an illustrative GUI 300F shown in FIG. 3F. In this example, deformation is expected at various locations, such as vertical displacement of the keystones (e.g., at location 350 as shown in FIG. 3F) and bending of the pillars (e.g., at location 355 shown in FIG. 3F).

In some embodiments, the simulation tool may provide an error bound associated with a simulation result. For instance, in the example shown in FIG. 3F, the simulation tool indicates that an error associated with the displacement prediction is no more than 0.0053571% at any location within the arch structure. This error may indicate a difference between the output of the simulation tool and an output that would have been obtained had a full FEA solution been computed (e.g., according to some suitable FEA technique). As discussed in greater detail below, such a full FEA solution may be used as a reference model in an offline stage of computation. Such an error bound may be derived in a rigorous and verifiable manner so that engineers may rely on the results of the simulation tool with confidence.

It should be appreciated that the simulation results produced by the simulation tool may include other information in addition to, or instead of, displacement of a structure. Depending on the particular engineering problem at hand, any suitable output of interest may be computed. For example, in an illustrative GUI 300G shown in FIG. 3G, a user may choose from a number of different displays, 360-2, . . . , 360-5, which may show, respectively, the expected displacement and three principal stresses within the arch structure, all of which may be included in the simulation results obtained by the simulation tool. The user may also return to a display 360-1 showing the proposed arch structure, edit simulation parameters via a display 360-6, or interact with another software (e.g., a software for solving partial differential equations) via a display 360-7. Other types of displays providing other functionalities may also be provided, as aspects of the present disclosure are not limited in this manner.

In addition to visually displaying simulation results such as displacement of a structure, the simulation tool may, in some embodiments, allow the user to drill down to more detailed results. For example, in an illustrative GUI 300H shown in FIG. 3H, the simulation tool may allow the user to select the connection between port 330-3 of the component 325 and port 340-1 of the component 335 to see an estimate for the displacement values at that connection. This estimate may be computed in any suitable manner, for example, by taking an average or an upperbound along the connection. A rigorously computed error bound may also be provided for this estimate.

While illustrative examples relating to an arch structure are discussed above in connection with FIG. 2A and FIGS. 3A-H, it should be appreciated that various inventive concepts disclosed herein can also be used to analyze other types of structures and other types of engineering problems (e.g., heat transfer, acoustics, fluid mechanics, etc.). Also, aspects of the present disclosure are not limited to any particular number or arrangement of components. For example, as shown in an illustrative GUI 300I of FIG. 3I, the cloning feature of the simulation tool may allow a user to rapidly construct a model for a complex structure with many components by taking advantage of repetitions in the complex structure. The simulation tool may provide a rigorously computed error bound for the entire structure, for example, as shown in an illustrative GUI 300J of FIG. 3J, to assist an engineer in managing the risk of error accumulation in a repeated structure.

Figure 2B:
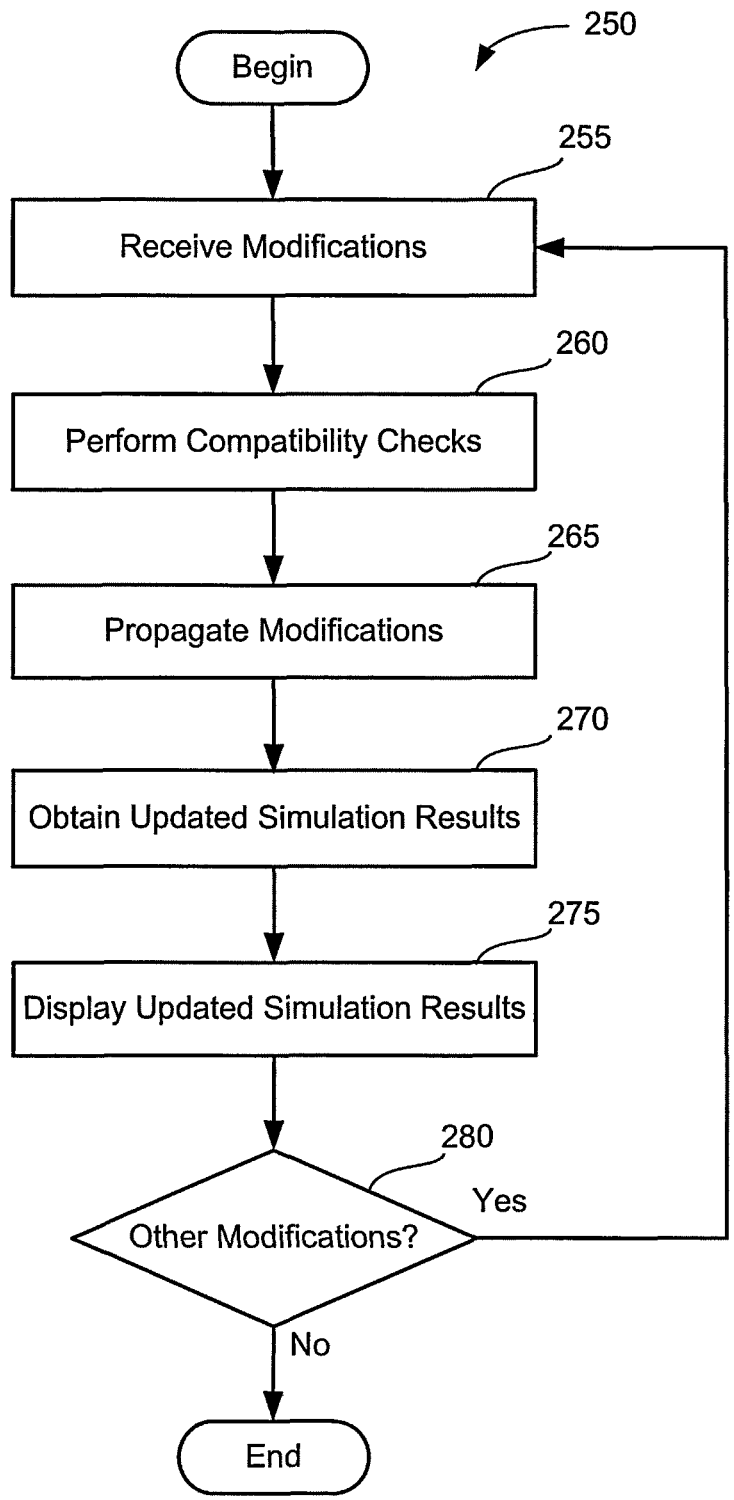
FIG. 2B shows an illustrative process that may be performed by a simulation tool to process one or more modifications to a component-based model of a physical system, in accordance with some embodiments.

In some embodiments, a simulation tool may allow a user to make modifications to a system after a model has been constructed. In response to such modifications, the simulation tool may construct an updated model and obtain updated simulation results using the updated model. FIG. 2B shows an illustrative process 250 that may be performed by a simulation tool to process one or more modifications to a component-based model of a physical system, in accordance with some embodiments. For purposes of illustration, various acts of the process 250 will be explained with reference to FIGS. 4A-C, which show an example of a series of user interactions relating to modifying an arch structure and analyzing the modified arch structure.

At act 255, the simulation tool may receive an input specifying one or more modifications to a model of a physical system (e.g., a component-based model as described above in connection with the illustrative process 200 shown in FIG. 2A). For instance, as shown in an illustrative GUI 400A of FIG. 4A, the simulation tool may allow the user to modify angles of keystone components 405 and 425 in an arch structure. In this example, a dialog box 470 is provided to allow the user to enter the desired angles. However, it should be appreciated that other input methods may also be suitable, for example, by allowing the user to use a pointing device (e.g., a mouse) to select and move one or more lines forming an angle to be changed.

Returning to the example of FIG. 2B, the simulation tool may, at act 260, automatically perform one or more compatibility checks response to a modification requested by the user. For example, if the user attempts to change a geometry parameter of a component, the simulation tool may automatically check whether the modified component is still compatible with the physical system. As a more specific example, if a user attempts to change a width or height of a keystone in an arch structure, the simulation tool may automatically check whether the modified keystone would still fit into the arch structure, which may depend on whether and how the modified keystone is connected to other components in the arch structure, such as other keystones and/or pillars. However, it should be appreciated that other types of incompatibilities may also be checked by the simulation tool, including, but not limited to connecting two components via ports that do not match (e.g., ports that have different sizes and/or shapes), connecting two component in such a way that corresponding interface functions are not oriented consistently, and connecting two components in such a way that the two components occupy a common region in space (which may be impossible in real life).

In the example of FIG. 2B, the simulation tool may, at act 265, attempt to make changes to the physical system other than those requested by the user, for example, to preserve consistency of the physical system. This may be done with or without user approval. For instance, in the example of FIG. 4A, the simulation tool may attempt to move a pillar 415 connected to the keystone 405 if the user requests to increase the width of the keystone 405, so that the pillar 415 remains centered relative to the keystone 405. If the pillar 415 is connected to another component (not shown), the simulation tool may perform another compatibility check to determine whether moving the pillar 415 should trigger yet another change to the physical system. This process may repeat until all compatibility requirements are satisfied, or until some stopping condition is reached, such as the discovery of an incompatibility that the simulation tool does not have sufficient information to resolve. In this manner, changes may be propagating throughout the physical system automatically, which may significantly improve user experience and productivity. However, it should be appreciated that automatic propagation of changes is not required, and the simulation tool may simply alert the user when an incompatibility is detected and allow the user to make further changes.

Figure 4A:
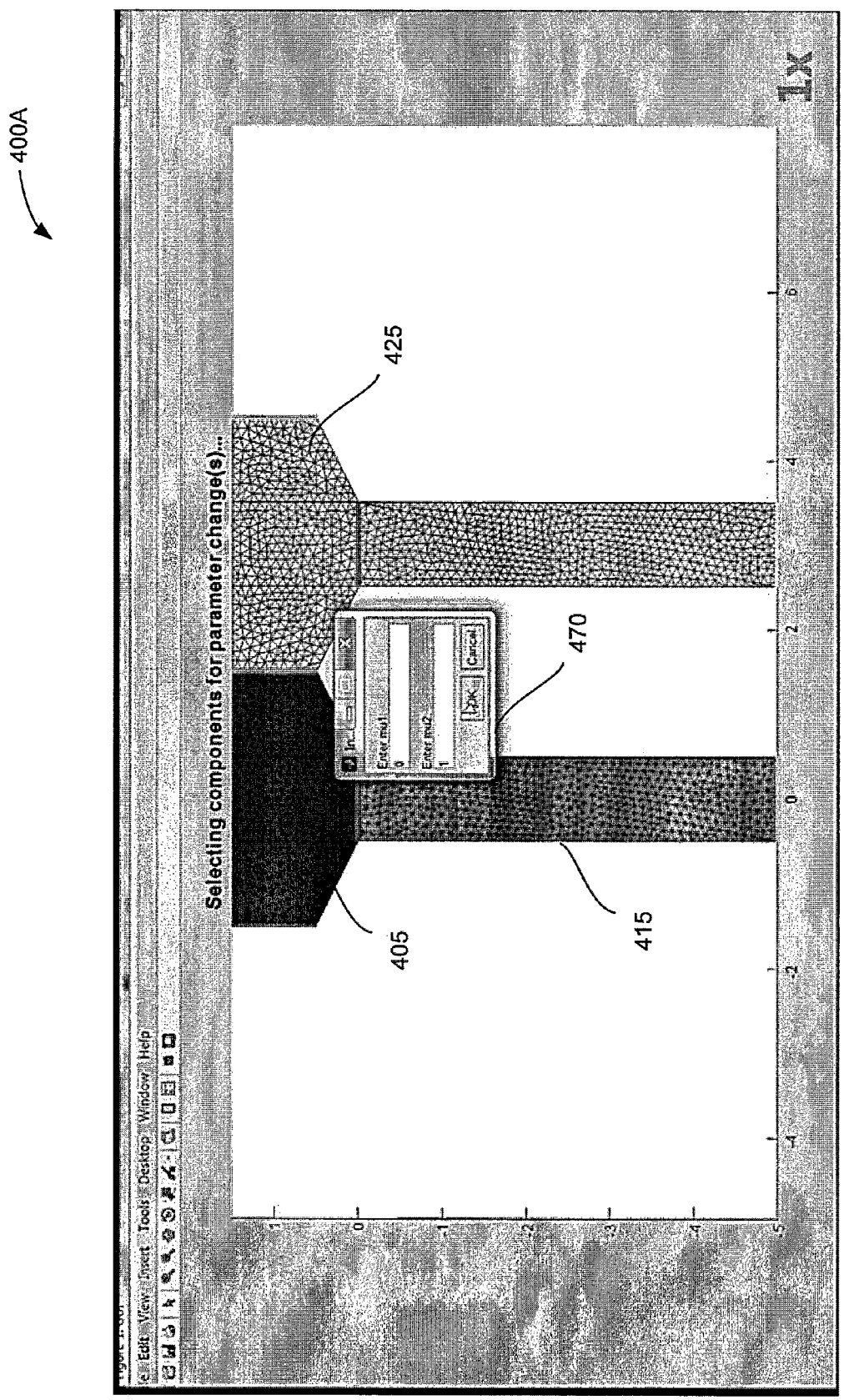
FIGS. 4A-C illustrate various features of a simulation tool for modifying components, in accordance with some embodiments.
Figure 4B:
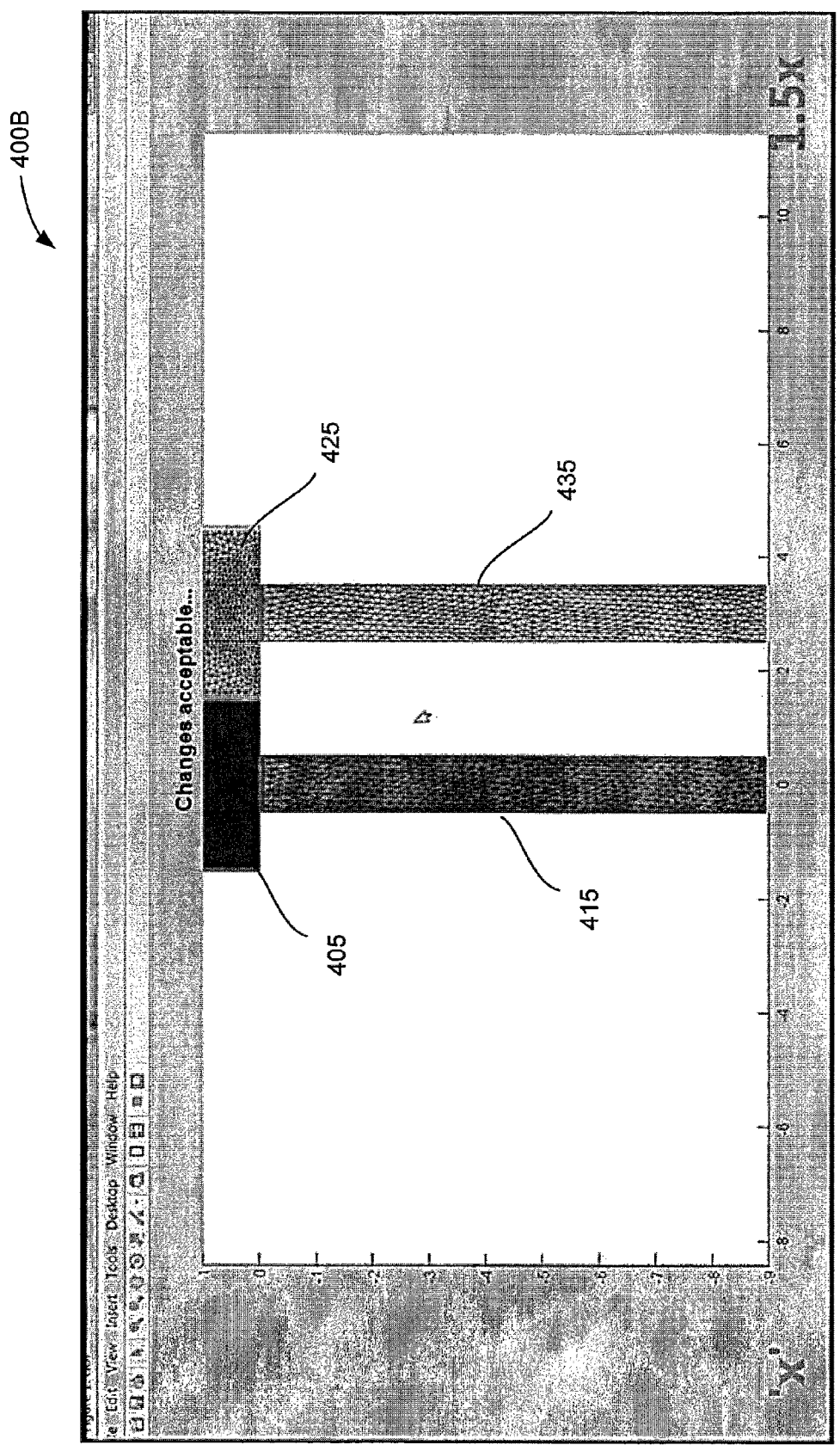

FIG. 4B shows an illustrative GUI 400B displaying a result of changing an arch angle and pillar height in the illustrative arch structure shown in FIG. 4A. In this example, the user changed the arch angle for the keystone 405 to zero and increased the height of the pillar 415. In response to these changes, the simulation tool may perform one or more consistency checks, and may determine that the arch angle for the keystone 425 and the height of the pillar 435 should also be changed to match the changes to the keystone 405 and the pillar 415. Alternatively, or additionally, the simulation tool may replicate all changes to the keystone 405 and the pillar 415 in the keystone 425 and the pillar 435 because the keystone 425 and the pillar 435 may have been cloned from the keystone 405 and the pillar 415.

Once the proposed changes are confirmed by the simulation tool and/or the user, the simulation tool may process the proposed changes to obtain updated simulation results. For instance, returning to the example of FIG. 2B, the simulation tool may obtain updated simulation results at act 270 and display the updated simulation results at act 275. In some embodiments, the processing tasks performed at acts 270 and 275 may be similar to those performed at acts 240 and 245 of FIG. 2A. However, in an embodiment in which a system model is obtained based on multiple component models, some computational savings may be possible. For example, some speedup (e.g., five, ten, or fifteen percent) may be achieved by reusing previously computed data relating to component models that are not directly affected by any modifications, such as component models with no changes to either parameters or connections.

Figure 4C:
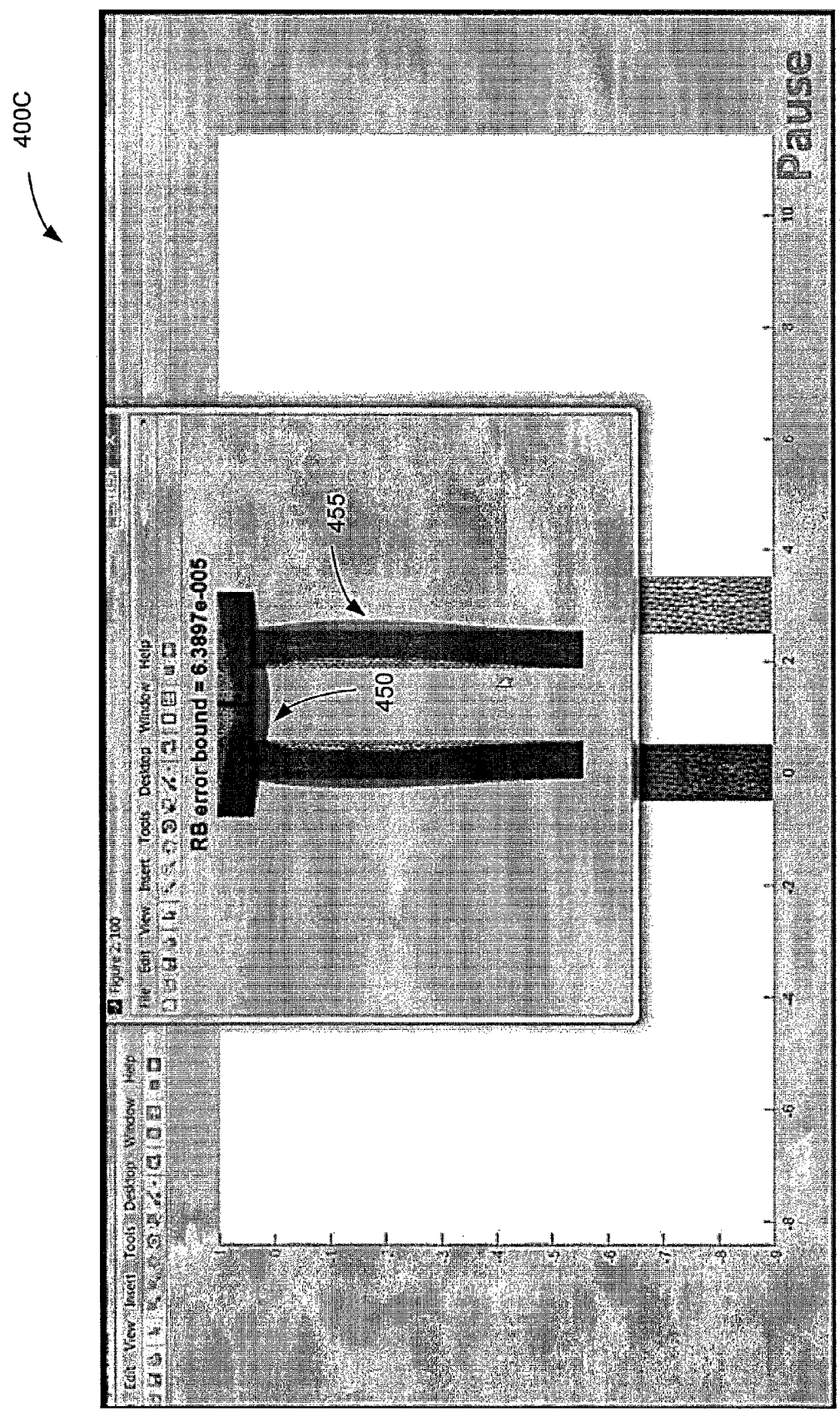

An example of such updated simulation results is displayed in an illustrative GUI 400C shown in FIG. 4C. In this example, significant deformation is expected at various locations, such as vertical displacement of the keystones (e.g., at location 450 as shown in FIG. 4C) and bending of the pillars (e.g., at location 455 as shown in FIG. 4C).

Returning to the example of FIG. 2B, the simulation tool may, at act 280, determine whether further modifications to the physical system may be desired. For example, based on the results obtained at act 270 and displayed at 275, an engineer may decide to add to the arch structure shown in FIGS. 4B-C one or more reinforcing features such as flying buttresses (not shown). As another example, the engineer may decide to make further changes to parameters of one or more components. If such modifications are desired, the simulation tool may return to act 255 to receive instructions from the engineer to further modify the physical system. For example, the simulation tool may readily construct models for additional components using pre-computed reference component datasets that may be available for the additional components. If, on the other hand, no other modifications are desired, the process 250 may end.

Figure 5A:
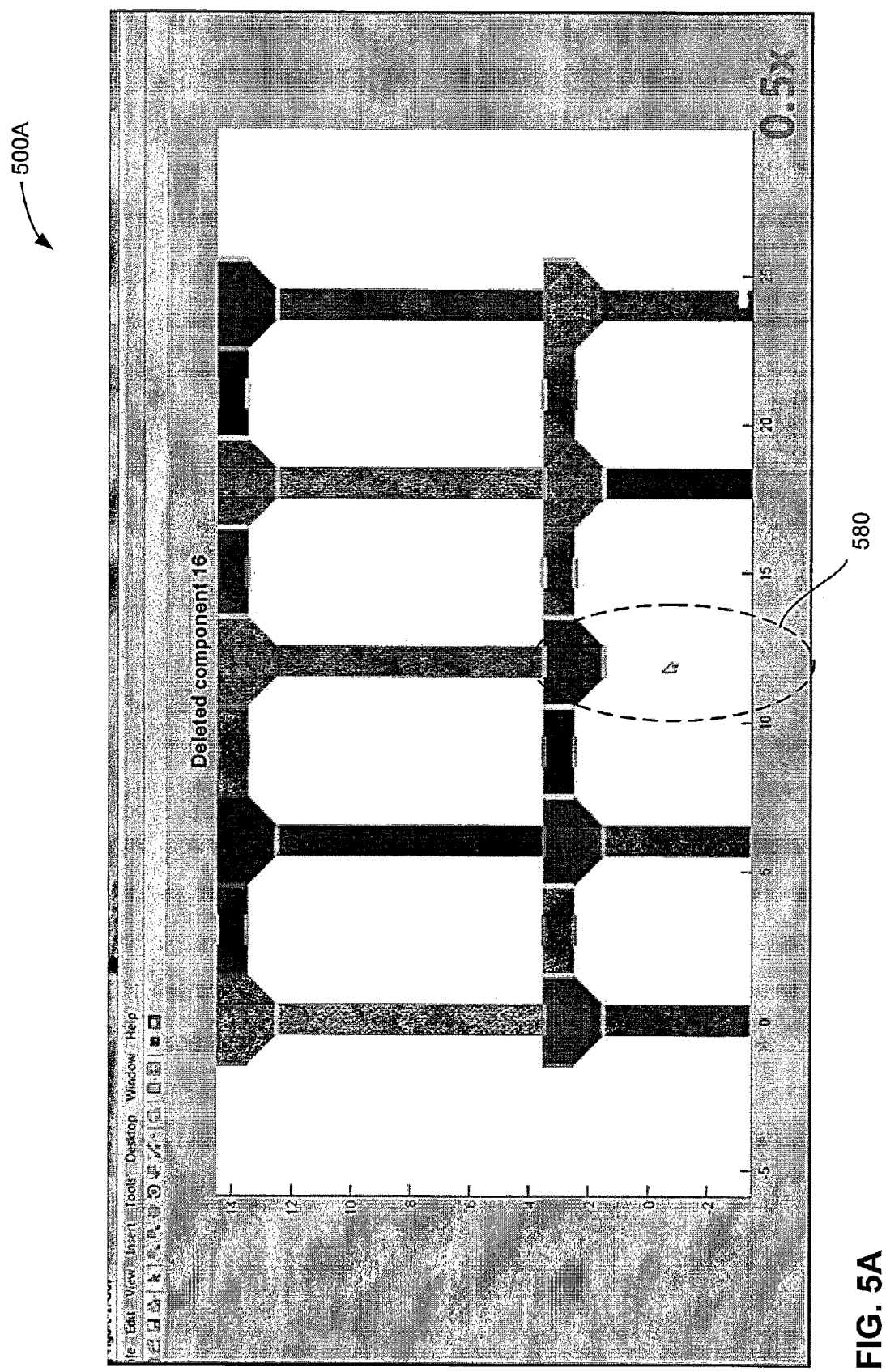
Figure 5B:
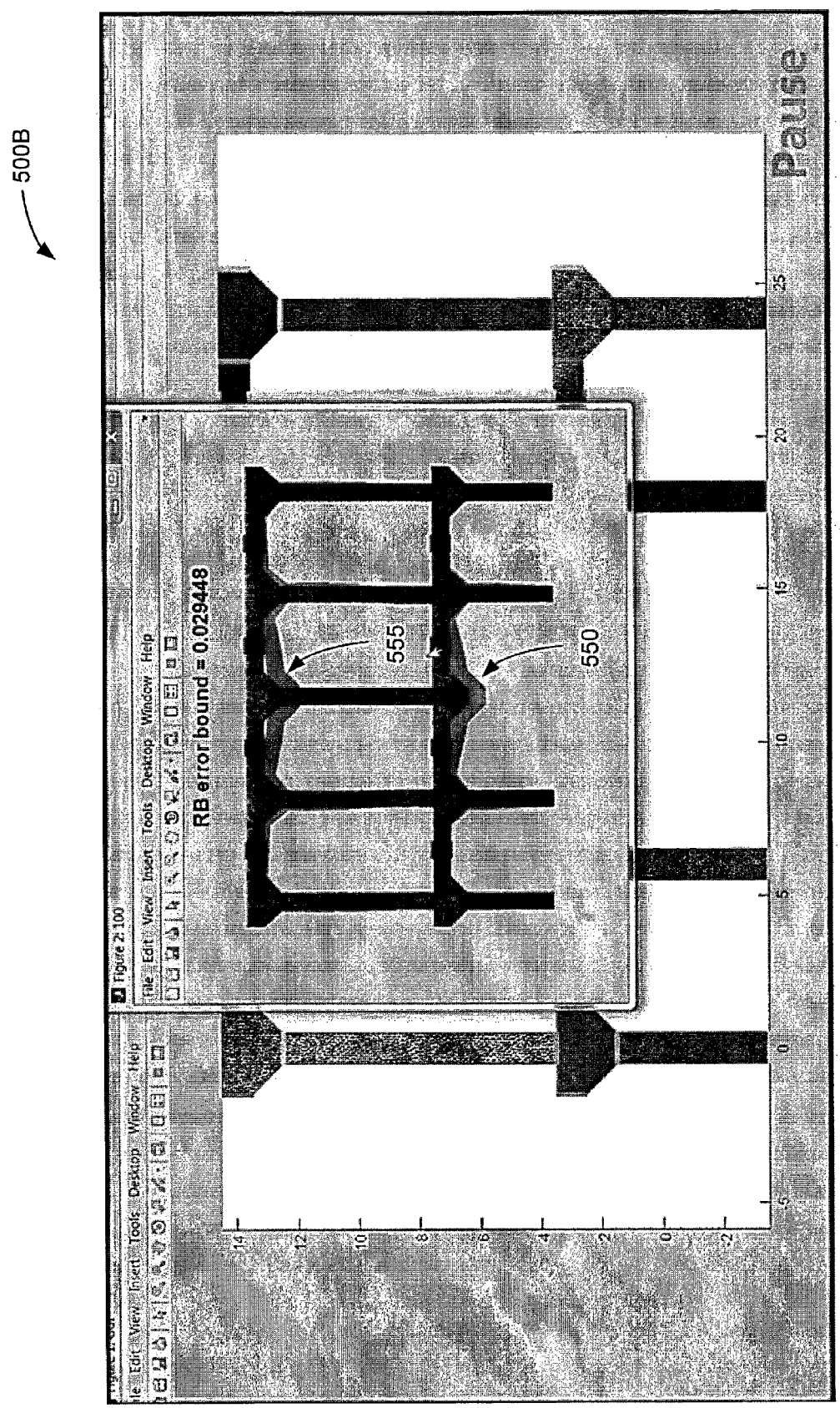

While specific examples of modifications are discussed above in connection with FIGS. 2B and 4A-C, it should be appreciated that aspects of the present disclosure are not limited to any particular types of modifications. For instance, modifications relating loading and/or boundary conditions may be made, in addition to, or instead of, modifications relating to component parameters, In some further embodiments, a simulation tool may be used to analyze various types of failures, such as a brittle failure in a structure. FIG. 5A shows an illustrative GUI 500A displaying an arch structure in which a pillar has been removed at location 580, so as to analyze how the remaining structure may behave. The simulation tool may construct an updated model, for example, by simply omitting a component model corresponding to the missing pillar during an assembly procedure. The updated model may be analyzed as before, and an example of an updated result is shown in an illustrative GUI 500B of FIG. 5B. In this example, significant deformation is expected at various locations above the missing pillar, such as vertical displacement of the keystones at locations 550 and 555 as shown in FIG. 5B.

As discussed above and in greater detail below in connection with FIG. 7, a simulation tool may be able to construct update models and obtain updated simulation results in an efficient manner due to the use of pre-computed reference component datasets. However, it should be appreciated that aspects of the present disclosure is not limited to such use. For example, pre-computed data of some other form, or no pre-computed data at all, may be used by a simulation tool in accordance with alternative embodiments.

Figure 6:
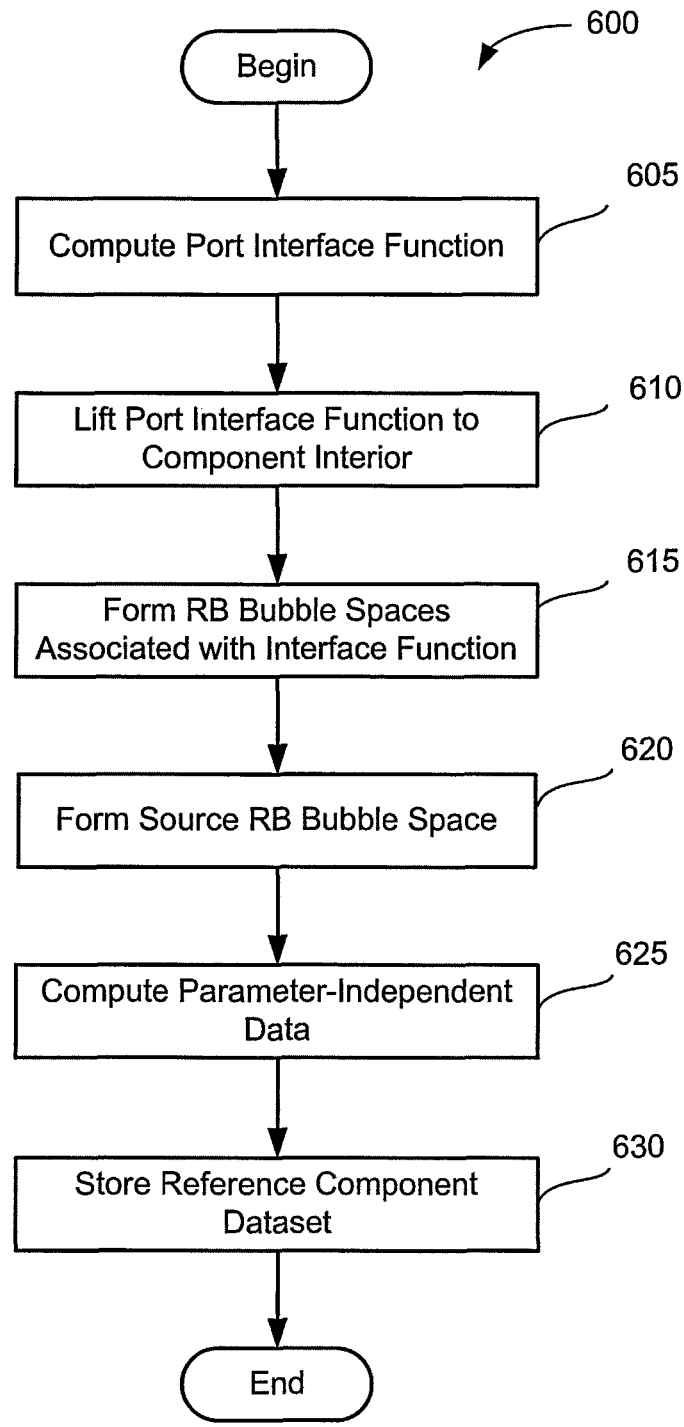
FIG. 6 shows an illustrative process that may be performed to prepare an evaluation dataset for a reference component, in accordance with some embodiments.

FIG. 6 shows an illustrative process 600 that may be performed to prepare an evaluation dataset for a reference component, in accordance with some embodiments. For example, the process 600 may be performed by a simulation tool as part of a process of modeling and analyzing a physical system (e.g., the illustrative process 200 in the example of FIG. 2A). Alternatively, the process 600 may be performed independently of a physical system to be analyzed. For example, the process 600 may be performed during an offline stage, before a physical system to be analyzed is fully specified. The resulting evaluation dataset may be used during an online stage to analyze a physical system, once the physical system is fully specified.

As discussed above, a reference component may conceptually represent a component type, such as a component with one or more parameters unspecified. For purposes of illustration, the process 600 is described below with reference to a pillar with unspecified length and width as an example of a reference component. However, it should be appreciated that the illustrative process 600 may be performed to prepare evaluation datasets for other reference components, as aspects of the present disclosure are not limited in this respect.

At act 605, one or more interface functions may be computed on a port of a reference component. In the example of a pillar, there may be two ports, one at each end of the pillar, for connecting to other components such as keystone components or other pillar components. If the pillar is modeled as a 3D object, a port may be a 2D surface.

At act 610, an interface function computed at act 610 may be lifted into the interior of the reference component in any suitable fashion. For instance, with reference again to the example of a 3D pillar, an interface function computed on a 2D port may be extended to an interface function defined in 3D space so that the 3D interface function may take on the same value (which may be non-zero) as the 2D interface function anywhere on the port, while diminishing into the interior of the pillar in a smooth fashion and becoming zero at any other port. Once an interface function has been lifted into the interior of a component, the interface function can be used to indicate some quantity of interest (e.g., displacement in a structural analysis problem or temperature in a heat transfer problem) in the component. It should be appreciated that components and ports may have other dimensionalities, as aspects of the present disclosure are not limited to models of any particular dimensionality. Furthermore, any suitable number of interface functions may be computed for each port of the reference components. For example, in some embodiment, more interface functions may be computed to reduce error, even though having more interface functions may lead to a higher computational load.

At act 615, a reduced basis technique may be applied to form one or more RB bubble spaces associated with an interface function computed at act 610. In some embodiments, an RB bubble space may have as elements linear combinations of one or more basis functions, so that forming an RB bubble space may include identifying the one or more basis functions. As discussed in greater detail below in connection with FIG. 7, an RB bubble space associated with an interface function may be used to approximate a bubble function associated with the interface function, where both the bubble function and the interface function may be used in computing a local stiffness matrix and a local load vector of a component.

In one implementation, a basis function for forming an RB bubble space may be obtained by randomly selecting a set of one or more parameters for the reference component (e.g., a length and a width for the pillar), solving one or more partial differential equations corresponding to the selected set of parameters, and using the solution to obtain the basis function. In an alternative implementation, basis functions may be obtained using an iterative greedy algorithm. For example, an iterative greedy algorithm may be initialized by selecting a training set of parameters for a reference component (e.g., multiple combinations of lengths and widths for the pillar). At each iteration of the algorithm, an error estimate, based on a current set of basis functions, may be evaluated for some or all of the parameters in the training set, and a set of one or more parameters at which the error estimate is maximized may be selected. A solution corresponding to the selected set of one or more parameters may then be used to obtain a basis function. This new basis function may be added to the set of basis functions, and the algorithm may proceed to the next iteration. The algorithm may terminate when some desired number of basis functions is reached, or when an error tolerance over the training set is satisfied.

While random selection and greedy selection are described above as alternative techniques for identifying a basis function, it should be appreciated that other techniques for identifying a basis function may also be possible, as aspects of the present disclosure are not limited in this respect. Furthermore, as described above in the example of a greedy algorithm, a process for selecting a basis function may be performed any suitable number of times to obtain any suitable number of basis functions, for example, based on a desired tradeoff between accuracy and computational efficiency. As a more specific example, an error tolerance may be used, so that more basis functions may be added until an estimated error is below the selected error tolerance.

At act 620, a source RB bubble space may be formed using any of the techniques described above, or any other suitable technique. As discussed in greater detail below in connection with FIG. 7, a source RB bubble space may be used to approximate a source bubble function, which may in turn be used in computing a local load vector of a component. Such a source bubble function may represent an input to a physical system being analyzed, such as a heat source in a heat transfer application or a force or load in a solid mechanics application.

At act 625, certain parameter-independent data may be computed, which may be used during an online stage to analyze a physical system that includes an instance of the reference component with all parameters specified. In some embodiments, parameter-independent data computed at act 625 may include one or more inner products of functions that are independent of those parameters that are not yet specified during an offline stage. Computing such parameter-independent data ahead of time may speed up the online stage significantly, so that simulation results may be delivered to a user in real time.

Act 630, some or all of the data computed at acts 605, 610, 615, 620, and 625 may be organized into a dataset and stored in such a manner that the dataset may be later retrieved by identifying the associated reference component (e.g., the pillar). As discussed before, computing and storing such a dataset ahead of time may speed up the online stage significantly, and may allow the computational overhead to be amortized over multiple instantiations of a reference component.

Although specific examples are described above for data that may be included in a reference component dataset and for techniques that may be used to prepare such data, it should be appreciated that aspects of the present disclosure are not limited to any particular type of data to be included in a reference component dataset, nor to any particular technique for computing such data. For instance, where multiple interface functions are computed, a single RB bubble space may be used for all of the interface functions. Alternatively, a different RB bubble space or set of RB bubble spaces may be computed for each interface function. A combination of these two approaches may also be possible, for example, by having some, but not all, of the interface functions share an RB bubble space or set of RB bubble spaces. Furthermore, any suitable software may be used to solve partial differential equations, for example, in a process for selecting basis functions at act 615.

Figure 7:
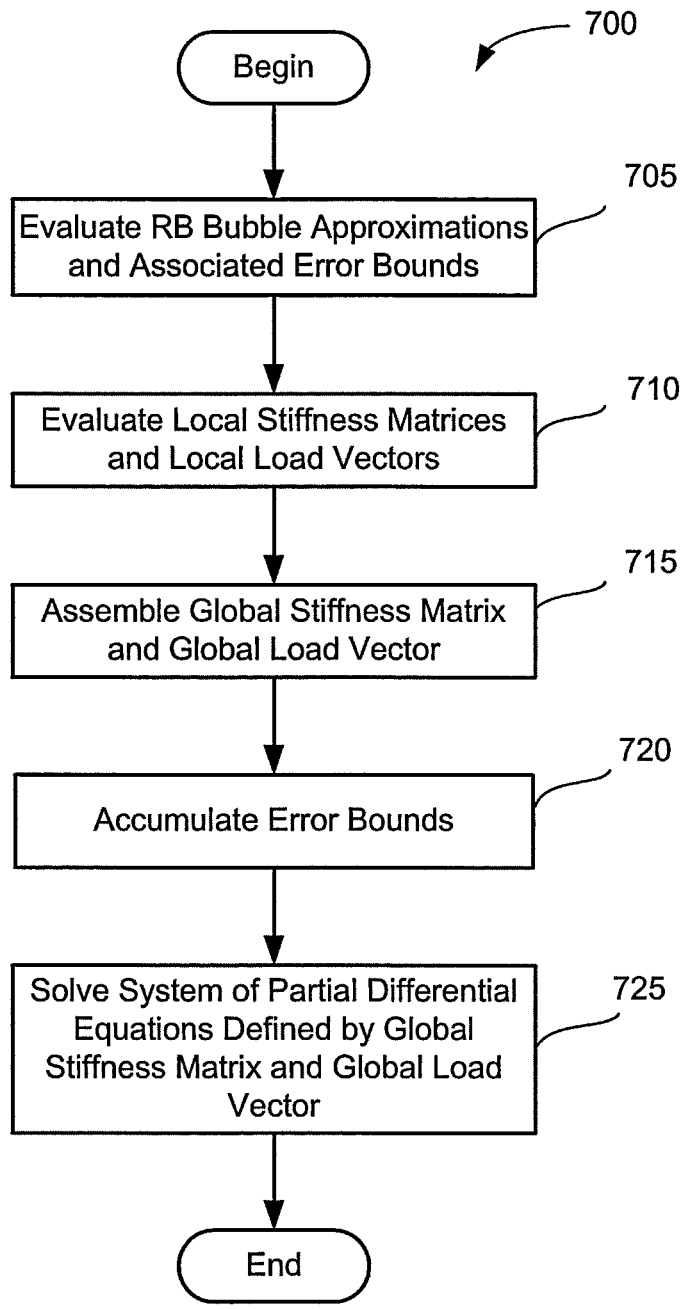
FIG. 7 shows an illustrative process that may be performed to instantiate component models and evaluate a system model, in accordance with some embodiments.

FIG. 7 shows an illustrative process 700 that may be performed to instantiate component models and evaluate a system model, in accordance with some embodiments. For example, the process 700 may be performed by a simulation tool as part of a process of modeling and analyzing a physical system (e.g., the illustrative process 200 in the example of FIG. 2A). As a more specific example, the process 700 may be performed during an online stage, after a physical system to be analyzed is fully specified, and may make use of reference component datasets computed for various reference components used in creating a model of the physical system.

At act 705, an approximation may be computed for each source bubble function and each bubble function associated with each interface function for each component in the physical system using a reference component dataset corresponding to the component. In some embodiments, such an approximation may be computed as a suitable linear combination of basis functions from a corresponding RB bubble space. For instance, a so-called Galerkin method may be used to select coefficients for scaling the basis functions based on the particular set of one or more parameters specified for the reference component. Additionally, an error estimate may be computed that is indicative of a difference between each "true" bubble function and the corresponding approximation.

At act 710, a local stiffness matrix and a local load vector may be computed for each component in the physical system. The local stiffness matrix and the local load vector may define one or more partial differential equations that predict how a component may behave given some particular set of parameters, boundary conditions, and/or loading conditions. In some embodiments, the local stiffness matrix and the local load vector may be computed using both a corresponding reference component dataset and data computed based on the particular set of parameters, boundary conditions, and/or loading conditions that may not have been specified until the online stage of computation.

At act 715, the local stiffness matrices computed for various components at act 710 may be assembled into a global stiffness matrix for the entire physical system, and likewise for a global load vector. In some embodiments, the assembly process may include, at each connection between two components, adding contributions from both components at the corresponding ports.

At act 720, error bounds computed at act 705 may be accumulated to obtain one or more error bounds for the entire physical system or a portion thereof. For instance, in some embodiments, a global error bound may be obtained by adding error bounds corresponding to all bubble function approximations used for all components. A local error bound for an individual component may then be obtained by post-processing the global error bound.

At act 725, a system of one or more equations specified by the global stiffness matrix and the global load vector, which may provide an approximation to a system of one or more partial differential equations associated with the entire physical system, may be solved to predict how the physical system may behave given the particular set of parameters, boundary conditions, and/or loading conditions. For instance, in the example of an arch structure, a system of one or more equations corresponding to a global stiffness matrix and a global load vector may be solved to predict how much deformation or stress may be experienced at various points in the arch structure.

Again, it should be appreciated that the various techniques described above in connection with FIG. 7 are merely illustrative, as aspects of the present disclosure are not limited to any particular techniques for defining and solving partial differential equations for predicting system behavior. For instance, once a system of one or more equations corresponding to a global stiffness matrix and a global load vector is specified, any suitable software may be used to solve such a system. Thus, act 725 of the process 700 may include preparing a representation of the system of one or more partial differential equations that is compatible with a desired software for solving partial differential equations, running the software with that representation as input, and receiving results from the software.

Following below are detailed mathematical formulations and proofs for a static condensation reduced basis element method in accordance with some embodiments of the present disclosure. It should be appreciated that such examples of specific implementations and applications are provided solely for purposes of illustration, and that the various inventive concepts presented herein are not limited to any particular implementation or application, as other implementations and applications may also be suitable.

We first introduce an abstract model problem to illustrate a system level formulation, in accordance with some embodiments. In this example, the model problem relates to a symmetric, coercive partial differential equation. However, it should be appreciated that various inventive techniques described herein may also be applied to other types of partial differential equations, as aspects of the present disclosure are not limited to any particular application.

We suppose that we are given an open domain $\Omega_{SYS} \subset \mathbb{R}^d$, $d=1, 2$ or $3$, with boundary $\partial\Omega_{SYS}$. We then let $X_{SYS}$ denote the Hilbert space $$X_{SYS} \equiv \{v \in H^1(\Omega_{SYS}) : v|_{\partial\Omega_{SYS,D}} = 0\},$$

where a $\partial\Omega_{SYS,D} \subset \partial\Omega_{SYS}$ is the portion of the boundary on which we enforce Dirichlet boundary conditions. (For purposes of illustration we consider only homogeneous Dirichlet conditions, but inhomogeneous conditions are readily treated by appropriate lifting functions.) We suppose that $X_{SYS}$ is endowed with an inner product $(\bullet, \bullet)_{X,SYS}$ and induced norm $\|\bullet\|_{X,SYS}$.

Recall that for any domain $\mathcal{O}$ in $\mathbb{R}^d$, $H^1(\mathcal{O}) \equiv \{v \in L^2(\mathcal{O}) : \nabla v \in (L^2(\mathcal{O}))^d\}$, where $L^2(\mathcal{O}) \equiv \{v \text{ measurable over } \mathcal{O} : \int_{\mathcal{O}} v^2 \text{ finite}\}$.

Given a parameter $\mu \in \mathcal{D}_{SYS} \subset \mathbb{R}^{P_{SYS}}$, where $\mathcal{D}_{SYS}$ is our compact "system parameter domain" of dimension $P_{SYS}$, we look for a field $u_{SYS}(\mu) \in X_{SYS}$ which satisfies the weak form $$a_{SYS}(u_{SYS}(\mu), v; \mu) = f_{SYS}(v; \mu), \forall v \in X_{SYS}. \quad (1)$$

We introduce a scalar system output, $s_{SYS}(\mu) \in \mathbb{R}$, given by $$s_{SYS}(\mu) \equiv l_{SYS}(u_{SYS}(\mu); \mu) \in \mathbb{R}. \quad (2)$$

For any $\mu \in \mathcal{D}_{SYS}$, $a_{SYS}(\bullet, \bullet; \mu): X_{SYS} \times X_{SYS} \to \mathbb{R}$ is a continuous, coercive, symmetric bilinear form associated with a second-order spatial partial differential operator over the system domain, $f_{SYS}(\bullet; \mu): X_{SYS} \to \mathbb{R}$ is a continuous linear functional which represents inhomogeneities, and $l_{SYS}(\bullet; \mu): X_{SYS} \to \mathbb{R}$ is a continuous linear output functional. (We note that $\Omega_{SYS}$ is a "reference" domain and does not depend on $\mu$; all geometry variation is accommodated by transformations to $\Omega_{SYS}$ and hence appears as coefficients in $a_{SYS}(\bullet, \bullet; \mu)$, $f_{SYS}(\bullet; \mu)$, and $l_{SYS}(\bullet, \mu)$.)

Let $\alpha_{SYS}(\mu)$ denote the coercivity constant, $$\alpha_{SYS}(\mu) \equiv \inf_{v \in X_{SYS}} \frac{a_{SYS}(v, v; \mu)}{\|v\|_{X,SYS}^2}. \quad (3)$$

It follows from coercivity of $a_{SYS}(\bullet, \bullet; \mu)$ that there exists $\alpha_{SYS,0} > 0$ such that $\alpha_{SYS}(\mu) > \alpha_{SYS,0}$ for all $\mu \in \mathcal{D}_{SYS}$. Also, let $\gamma_{SYS}(\mu)$ denote the continuity constant, $$\gamma_{SYS}(\mu) \equiv \sup_{v \in X_{SYS}} \sup_{w \in X_{SYS}} \frac{a_{SYS}(v, w; \mu)}{\|v\|_{X,SYS} \|w\|_{X,SYS}}. \quad (4)$$

It follows from continuity of $a_{SYS}(\bullet, \bullet; \mu)$ that $a_{SYS}(\mu)$ is finite for all $\mu \in \mathcal{D}_{SYS}$.

To develop a high-fidelity approximation of $u_{SYS}$, we introduce a "truth" finite element space $X_{SYS}^{\mathcal{N}} \subset X_{SYS}$, where $\dim(X_{SYS}^{\mathcal{N}}) = \mathcal{N} \gg 1$. Then, the "truth" approximation $u_{SYS}^{\mathcal{N}}(\mu) \in X_{SYS}^{\mathcal{N}}$ satisfies $$a_{SYS}(u_{SYS}^{\mathcal{N}}(\mu), v; \mu) = f_{SYS}(v; \mu), \forall v \in X_{SYS}^{\mathcal{N}}. \quad (5)$$

Also, the truth approximation of the output quantity, $s_{SYS}^{\mathcal{N}}(\mu)$, is defined as $$s_{SYS}^{\mathcal{N}}(\mu) = l_{SYS}(u_{SYS}^{\mathcal{N}}(\mu); \mu). \quad (6)$$

Such an RBE approximation may provide a rapid and accurate approximation of this truth for any $\mu \in \mathcal{D}_{SYS}$. We may measure the error in the RBE approximation with respect to the truth.

We now move to the component level. We suppose that the system introduced above is naturally decomposable into a set, $\mathcal{C}_{SYS}$, of interconnected parametrized components. Each component COM is associated with a subdomain $\Omega_{COM}$, where $$\bar{\Omega}_{SYS} = \bigcup_{COM \in \mathcal{C}_{SYS}} \bar{\Omega}_{COM}, \Omega_{COM} \cap \Omega_{COM'}$$

$$= \emptyset, \text{ for } COM \neq COM'.$$

For any given COM $\in \mathcal{C}_{SYS}$, we let $\partial\Omega_{COM}$ denote the boundary of $\Omega_{COM}$, and $a_{COM}(\bullet, \bullet; \mu)$ (respectively, $f_{COM}(\bullet; \mu)$) denote the restriction of $a_{SYS}(\bullet, \bullet; \mu)$ (respectively, $f_{SYS}(\bullet; \mu)$) to $\Omega_{COM}$.[1] Also, we let $(\bullet, \bullet)_{X,COM}$ and $\|\bullet\|_{X,COM}$ denote the restriction of the $X_{SYS}$ inner product and norm to $\Omega_{COM}$. (Analogous to the system level treatment of geometric parametrizations, the $\Omega_{COM}$ are parameter-independent reference domains. Geometric variation may be accommodated by COM-local transformations to $\Omega_{COM}$ and hence may appear as coefficients in the weak forms.)

Each component COM is endowed with parameters $\mu \in \mathcal{D}_{COM} \subset \mathbb{R}^{P_{COM}}$, and hence $$\mathcal{D}_{SYS} \subset \prod_{COM \in \mathcal{C}_{SYS}} \mathcal{D}_{COM}.$$

To minimize cumbersome notation, $\mu$ shall refer to both system and component level parameters; the precise meaning will be evident from the context. The component parameters may be related to the environment (boundary conditions and sources), material and constitutive properties, and geometry; as regards the latter, most geometric parameters may be internal to the component, however some geometric parameters such as translations and rotations serve to "dock" the component compatibly within the system. Note also that topology variation may be addressed at the supra-component system (assembly) level, and not within the individual components.

We now introduce a domain decomposition approach which is based upon the component structure introduced above, in accordance with some embodiments. We begin with some notation. Recall that $\mathcal{C}_{SYS}$ denotes the set of components (drawn from some given library to ensure compatibility) associated with our particular system. Each component COM $\in \mathcal{C}_{SYS}$ may contain local ports—at least one L-P(ort) $\in \mathcal{P}_{COM}$; these local ports may in turn be associated to unique global ports G-P(ort) $\in \mathcal{P}_{SYS}^0$. Let L-P,COM refer to a specific port in $\mathcal{P}_{COM}$, and let $\Gamma_{L-P,COM}$ denote the portion of $\partial \Omega_{COM}$ associated with L-P,COM. Similarly, let $\Gamma_{G-P}$ denote the domain associated with global port G-P. The mapping $\mathcal{G}$ from L-P,COM to G-P determines the particular system configuration. We suppose that $\mathcal{G}$ maps at most two distinct L-P,COM to each $\Gamma_{G-P}$—a component has at most one neighbor on each port. Also, we assume that $\Gamma_{G-P} \cap \partial \Omega_{SYS,D}$ is either empty or $\Gamma_{G-P}$; furthermore, we define $\mathcal{P}_{SYS}$ to be the set of ports $\Gamma_{G-P} \in \mathcal{P}_{SYS}^0$ for which $\Gamma_{G-P} \cap \partial \Omega_{SYS,D} = \emptyset$.

For given COM $\in \mathcal{C}_{SYS}$, let $X_{COM;0}^{\mathcal{N}}$ denote the "component bubble space"—the restriction of $X_{SYS}^{\mathcal{N}}$ to COM with homogeneous Dirichlet boundary conditions on each $\Gamma_{L-P}$, L-P $\in \mathcal{P}_{COM}$: $X_{COM;0}^{\mathcal{N}}(\Omega_{COM}) \equiv \{v|_{\Omega_{COM}}: V \in X_{SYS}^{\mathcal{N}}; v|_{\Gamma_{L-P}} = 0, \forall L-P \in \mathcal{P}_{COM}\}$. Note for purposes of illustration we suppose that triangulation over which $X_{SYS}^{\mathcal{N}}$ is defined honors the domain decomposition induced by the components: $\partial \Omega_{COM}$ contains only entire edges (on d=2) or faces (on d=3) of elements. Also, let $\alpha_{COM}(\mu)$ denote the coercivity constant for $a_{COM}$ on the space $X_{COM;0}^{\mathcal{N}}$, $$\alpha_{COM}(\mu) \equiv \inf_{v \in X_{COM;0}^{\mathcal{N}}} \frac{a_{COM}(v, v; \mu)}{\|v\|_{X,COM}^2}, \quad (7)$$

where $\alpha_{COM}(\mu) \geq \alpha_{COM,0} \geq 0$, $\forall \mu \in \mathcal{D}_{COM}$; this coercivity property follows from the Dirichlet conditions associated with $X_{COM;0}^{\mathcal{N}}$.

We express the degrees of freedom on $\Gamma_{G-P}$ in terms of an eigenfunction expansion (in $\mathbb{R}^{d-1}$) native to the port. Let $X^{\mathcal{N}}(\Gamma_{G-P})$ denote the space of restrictions of functions in $X_{SYS}^{\mathcal{N}}$ to $\Gamma_{G-P}$ and let $n_{G-P} \equiv \dim(X^{\mathcal{N}}(\Gamma_{G-P}))$. We then introduce the complete set of eigenvectors, $\{\chi_k \in X^{\mathcal{N}}(\Gamma_{G-P}): 1 \leq k \leq n_{G-P}\}$, associated with the discrete generalized eigenvalue problem $$\int_{\Gamma_{G-P}} \nabla \chi_k \cdot \nabla v = \lambda_k \int_{\Gamma_{G-P}} \chi_k v, \forall v \in X^{\mathcal{N}}(\Gamma_{G-P}), \quad (8)$$

$$\|\chi_k\|_{L^2(\Gamma_{G-P})} = 1; \quad (9)$$

here the $\lambda_k \in \mathbb{R}$ denote real positive eigenvalues ordered such that $(\lambda_{min} \equiv) \lambda_1 < \lambda_2 < \ldots < \lambda_{n_{G-P}}$. The $\chi_k$ satisfy the orthonormality property $$(\chi_i, \chi_j)_{L^2(\Gamma_{G-P})} = \delta_{ij}, \quad (10)$$

where $\delta_{ij}$ denotes the Kronecker delta function.

The port eigenmodes are then elliptically lifted to the interior of neighboring components. We shall denote these lifted G-P functions $\Psi_{k,G-P}$, and we let $\omega_{G-P}$ denote the "patch" of components over which $\Psi_{k,G-P}$ has support. Also, the restriction of $\Psi_{k,G-P}$ to a constituent component COM $\in \omega_{G-P}$ shall be denoted $\psi_{k,L-P,COM}$. We construct $\psi_{L-P,COM}$ such that it satisfies the Laplace equation on the component interior, coincides with $\chi_k$ on $\Gamma_{L-P,COM}$, and vanishes on the remaining ports, $$\int_{\Omega_{COM}} \nabla \psi_{k,L-P,COM} \cdot \nabla v = 0, \forall v \in X_{COM;0}^{\mathcal{N}}, \quad (11)$$

$$\psi_{k,L-P,COM} = \chi_k, \text{ on } \Gamma_{L-P,COM}, \quad (12)$$

$$\psi_{k,L-P,COM} = 0, \text{ on } \Gamma_{L-P',COM}, L-P' \in \mathcal{P}_{COM} \setminus L-P. \quad (13)$$

In (13), L-P' $\in \mathcal{P}_{COM} \setminus$L-P refers to the set of all ports of COM except L-P. We have employed the Laplacian in (11), but of course other inner products are also possible.

Figure 8:
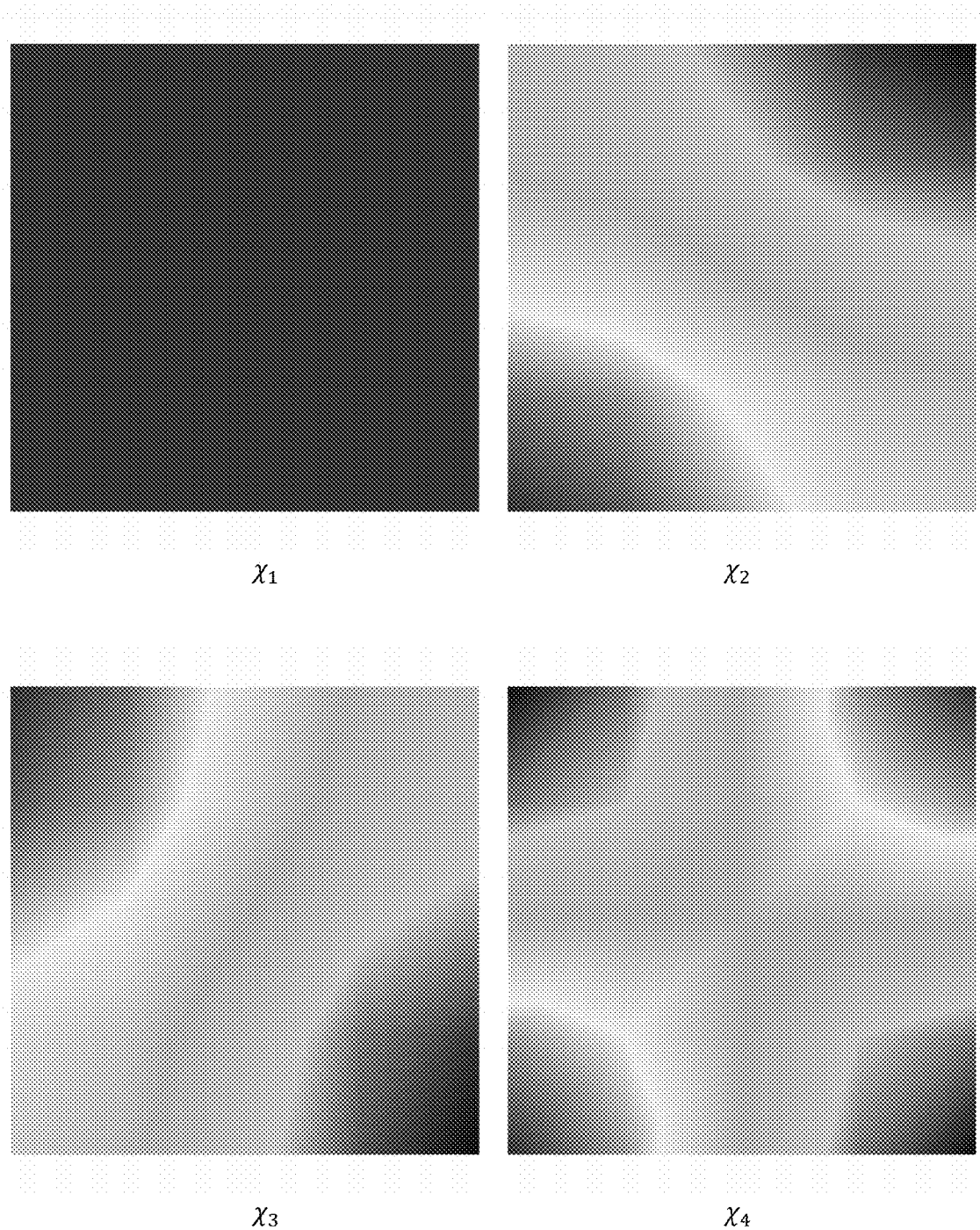
FIG. 8 shows an example of four eigenmodes for a port of a component, in accordance with some embodiments.
Figure 9:
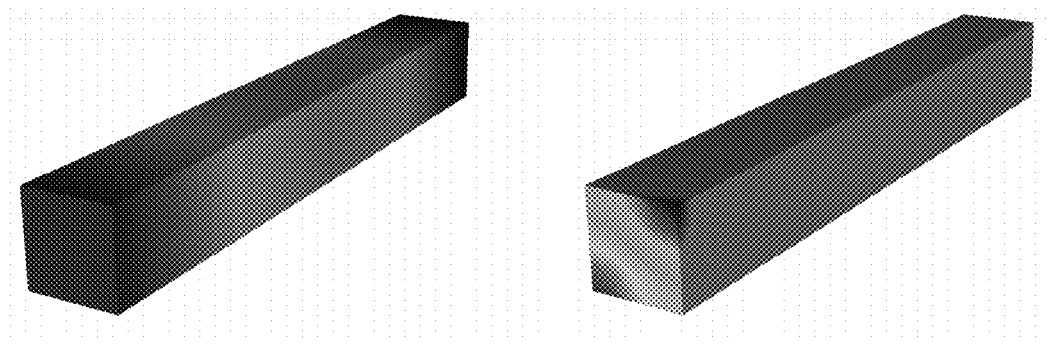
FIG. 9 shows the result of lifting the four port eigenmodes shown in FIG. 8 to the interior of the component, in accordance with some embodiments.
Figure 9:
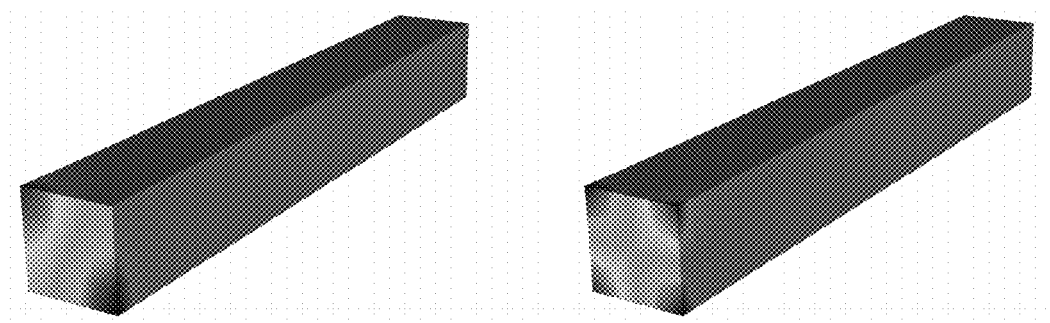

For purposes of illustration we consider a component $\Omega_{com} \equiv (0,0.4) \times (0,0.4) \times (0,3)$ meshed with $4 \times 4 \times 30 Q_1(d=3)$ elements; the component has two square ports, $\Gamma_{1,com} \equiv (0, 0.4) \times (0,0.4) \times \{0\}$ and $\Gamma_{2,com} \equiv (0,0.4) \times (0,0.4) \times \{3\}$, perforce each meshed with uniform $4 \times 4 Q1(d=2)$ elements. FIG. 8 shows an example of the first four eigenmodes for $\Gamma_{1,com}$; FIG. 9 shows the result of lifting these four port eigenmodes to the interior of the parallelepiped component, in accordance with some embodiments. FIG. 8 illustrates the first four modes of the eigenproblem (8), (9) for a square port $(0,0.4)^2$ with a uniform $4 \times 4 Q1(d=2)$mesh. FIG. 9 illustrates the elliptically lifted interface functions (11)-(13) corresponding to the modes in FIG. 8 on a "stem" component $(0,0.4)^2 \times (0,3)$ with two square ports.

We now discuss a static condensation procedure that we employ to eliminate the degrees of freedom internal to each component, in accordance with some embodiments. First, it is clear that we can express $u_{SYS}^{\mathcal{N}}(\mu)$ in terms of bubble and interface contributions as $$u_{SYS}^{\mathcal{N}}(\mu) = \Sigma_{COM \in \mathcal{C}_{SYS}} b_{COM}^{\mathcal{N}}(\mu) + \Sigma_{G-P \in \mathcal{P}_{SYS}} \Sigma_{k=1}^{n_{G-P}} U_{k,G-P}(\mu) \Psi_{k,G-P} \quad (14)$$

where $b_{COM}^{\mathcal{N}}(\mu) \in X_{COM;0}^{\mathcal{N}}$ for each COM $\in \mathcal{C}_{SYS}$, and the $U_{k,G-P}(\mu)$, $1 \leq k \leq n_{G-P}$, G-P $\in \mathcal{P}_{SYS}$, are interface function coefficients. Here we implicitly assume that functions in $X_{COM;0}^{\mathcal{N}}$ are extended by zero over $\Omega_{SYS} \setminus \Omega_{COM}$, and we assume an analogous extension for the $\Psi_{k,G-P}$ outside the patch $\omega_{G-P}$.

Now, since functions in $X_{COM;0}^{\mathcal{N}}$ and $X_{COM;0}^{\mathcal{N}}$ do not share support, we can eliminate bubble functions from (5) in favor of global port degrees of freedom. To with, we substitute (14) into (5) and test on the COM bubble space to obtain, $$a_{COM}(b_{COM}^{\mathcal{N}}(\mu) + \Sigma_{L-P \in \mathcal{P}_{COM}} \Sigma_{k=1}^{n_{(L-P,COM)}} U_{k,g_{(L-P,COM)}}(\mu) \psi_{k,L-P,COM}, v; \mu) = f_{COM}(v; \mu), \forall v \in X_{COM;0}^{\mathcal{N}}. \quad (15)$$

It follows that $b_{COM}^{\mathcal{N}}(\mu) \in X_{COM;0}^{\mathcal{N}}$ satisfies, $$a_{COM}(b_{COM}^{\mathcal{N}}(\mu), v; \mu) = f_{COM}(v; \mu) - \Sigma_{L-P \in \mathcal{P}_{COM}} \Sigma_{k=1}^{n_{g_{(L-P,COM)}}} U_{k,g_{(L-P,COM)}}(\mu) a_{COM}(\psi_{k,L-P,COM}, v; \mu),$$

$$\forall v \in X_{COM;0}^{\mathcal{N}}, \quad (16)$$

for each COM in $\mathcal{C}_{SYS}$. The existence and uniqueness of $b_{COM}^{\mathcal{N}}(\mu)$ from (16) is guaranteed due to coercivity (and continuity) of $a_{COM}(\bullet, \bullet; \mu)$ on $X_{COM;0}^{\mathcal{N}}$.

From (16) and linearity, we can reconstruct $b_{COM}^{\mathcal{N}}(\mu)$ as $$b_{COM}^{\mathcal{N}}(\mu) = b_{f,COM}^{\mathcal{N}}(\mu) + \Sigma_{L-P \in \mathcal{P}_{COM}} \Sigma_{k=1}^{n_{\mathcal{G}(L-P,COM)}}$$
$$U_{k,\mathcal{G}(L-P,COM)}(\mu) b_{k,L-P,COM}^{\mathcal{N}}(\mu), \quad (17)$$

where $b_{f,COM}^{\mathcal{N}}(\mu) \in X_{COM;0}^{\mathcal{N}}$ satisfies $$a_{COM}(b_{f,COM}^{\mathcal{N}}(\mu), v; \mu) = f_{COM}(v; \mu), \forall v \in X_{COM;0}^{\mathcal{N}}, \quad (18)$$

and the $b_{k,L-P,COM}^{\mathcal{N}}(\mu) \in X_{COM;0}^{\mathcal{N}}$ are defined by the set of $n_{COM} = \Sigma_{L-P \in \mathcal{P}_{COM}} n_{\mathcal{G}(L-P,COM)}$ subproblems $$a_{COM}(b_{k,L-P,COM}^{\mathcal{N}}(\mu), v; \mu) = -a_{COM}(\psi_{k,L-P,COM}, v; \mu),$$
$$\forall v \in X_{COM;0}^{\mathcal{N}}. \quad (19)$$

Both (18) and (19) are well-posed again thanks to coercivity and continuity of $a_{COM}$ over $X_{COM;0}^{\mathcal{N}}$.

For $1 \leq k \leq n_{G-P}$ and each G-P $\in \mathcal{P}_{SYS}$, let $$\Phi_{k,G-P}(\mu) = \Psi_{k,G-P} + \Sigma_{COM \in \omega_{G-P}} b_{k,\mathcal{G}_{COM}^{-1}(G-P)}^{\mathcal{N}}(\mu). \quad (20)$$

Here $\mathcal{G}_{COM}^{-1}$ denotes the inverse map from G-P to L-P, COM on COM; recall that $\omega_{G-P}$ denotes the "patch" of components on which $\Psi_{k,G-P}$ has support. Also, we define the space $$X_{\mathcal{P}_{SYS}}^{\mathcal{N}}(\mu) = \mathrm{span}\{\Phi_{k,G-P}(\mu): 1 \leq k \leq n_{G-P}, \forall G-P \in \mathcal{P}_{SYS}\}, \quad (21)$$

and we endow $X_{\mathcal{P}_{SYS}}^{\mathcal{N}}(\mu)$ with the inner product and norm, $$(v, w)_{\mathcal{P}_{SYS}} \equiv \Sigma_{G-P \in \mathcal{P}_{SYS}} (v, w)_{L^2(\Gamma_{G-P})} \text{ and}$$
$$\| v \|_{\mathcal{P}_{SYS}} \equiv \sqrt{(v, v)_{\mathcal{P}_{SYS}}}, \quad (22)$$

for any v, w $\in X_{\mathcal{P}_{SYS}}^{\mathcal{N}}(\mu)$.

It follows from (14) that on a component COM $\in \mathcal{C}_{SYS}$, $u_{SYS}^{\mathcal{N}}(\mu)$ is given by $$u_{SYS}^{\mathcal{N}}(\mu)|_{\Omega_{COM}} = b_{COM}^{\mathcal{N}}(\mu) + \Sigma_{L-P \in \mathcal{P}_{COM}} \Sigma_{k=1}^{n_{\mathcal{G}(L-P)}},$$
$$COM) U_{k,\mathcal{G}(L-P,COM)}(\mu) \psi_{k,L-P,COM}. \quad (23)$$

Hence, from (17) and (23), we have $$u_{SYS}^{\mathcal{N}}(\mu)|_{\Omega_{COM}} = b_{f,COM}^{\mathcal{N}}(\mu) +$$
$$\Sigma_{L-P \in \mathcal{P}_{COM}} \Sigma_{k=1}^{n_{\mathcal{G}(L-P,COM)}} U_{k,\mathcal{G}(L-P,COM)}(\mu) ($$
$$b_{k,L-P,COM}^{\mathcal{N}}(\mu) + \psi_{k,L-P,COM}). \quad (24)$$

It then follows from (24) and (20) that the global solution can be expressed as $$u_{SYS}^{\mathcal{N}}(\mu) = \Sigma_{COM \in \mathcal{C}_{SYS}} b_{f,COM}^{\mathcal{N}}(\mu) +$$
$$\Sigma_{G-P \in \mathcal{P}_{SYS}} \Sigma_{k=1}^{n_{G-P}} U_{k,G-P}(\mu) \Phi_{k,G-P}(\mu). \quad (25)$$

We now insert (25) into (5) and restrict the test space to $X_{\mathcal{P}_{SYS}}^{\mathcal{N}}(\mu)$ to arrive at $$\sum_{G-P \in \mathcal{P}_{SYS}}^{n_{G-P}} \sum_{k=1} U_{k,G-P}(\mu) a_{SYS}(\Phi_{k,G-P}(\mu), v; \mu) = \quad (26)$$

$$f_{SYS}(v, \mu) - \Sigma_{COM \in \mathcal{C}_{SYS}} a_{SYS}(b_{f,COM}^{\mathcal{N}}(\mu), v; \mu),$$

$$\forall v \in X_{\mathcal{P}_{SYS}}^{\mathcal{N}}(\mu).$$

We now proceed to identify the linear algebraic statement associated with (26).

In particular, we test in (26) on $\Phi_{k',G-P'}(\mu)$ for $1 \leq k' \leq n_{G-P'}$, $\forall G-P' \in \mathcal{P}_{SYS}$, to obtain the static condensation system of dimension $n_{sc} = \Sigma_{G-P \in \mathcal{P}_{SYS}} n_{G-P}$, $$\mathbb{A}(\mu) \mathbb{U}(\mu) = \mathbb{F}(\mu) \quad (27)$$

for the vector $\mathbb{U}(\mu) \in \mathbb{R}^{n_{sc}}$ of coefficients $U_{k,G-P}(\mu)$. We may also express our system output (6) as $$s_{SYS}^{\mathcal{N}}(\mu) \equiv (\mathbb{L}^1(\mu) + \mathbb{L}^2(\mu))^T \mathbb{U}(\mu) + \sum_{COM \in \mathcal{C}_{SYS}} \ell_{SYS}(b_{f,COM}^{\mathcal{N}}(\mu); \mu).$$

We now define these static condensation quantities more explicitly.

The matrix $\mathbb{A}(\mu) \in \mathbb{R}^{n_{sc} \times n_{sc}}$ and vector $\mathbb{F}(\mu) \in \mathbb{R}^{n_{sc}}$ are defined as $$\mathbb{A}_{(k',G-P'),(k,G-P)}(\mu) \equiv a_{SYS}(\Phi_{k,G-P}(\mu), \Phi_{k',G-P'}(\mu); \mu), \quad (28)$$

and $$\mathbb{F}_{k',G-P'}(\mu) \equiv f_{SYS}(\Phi_{k',G-P'}(\mu); \mu) -$$
$$\sum_{COM \in \mathcal{C}_{SYS}} a_{SYS}(b_{f,COM}^{\mathcal{N}}(\mu), \Phi_{k',G-P'}(\mu); \mu), \quad (29)$$

respectively, for $1 \leq k \leq n_{G-P}$, $\forall G-P \in \mathcal{P}_{SYS}$, and $1 \leq k' \leq n_{G-P'}$, $\forall G-P' \in \mathcal{P}_{SYS}$; from (28) it is clear that $\mathbb{A}(\mu)$ is symmetric. The output vectors $\mathbb{L}^1(\mu) \in \mathbb{R}^{n_{sc}}$ and $\mathbb{L}^2(\mu) \in \mathbb{R}^{n_{sc}}$ are given by $$\mathbb{L}_{k,G-P}^1(\mu) \equiv \ell_{SYS}(\Psi_{k,G-P}(\mu); \mu), \quad (30)$$

$$\mathbb{L}_{k,G-P}^2(\mu) \equiv \sum_{COM \in \omega_{G-P}} \ell_{SYS}\left(b_{k,\mathcal{G}_{COM}^{-1}(G-P)}^{\mathcal{N}}(\mu)\right),$$

for $1 \leq k \leq n_{G-P}$, $\forall G-P \in \mathcal{P}_{SYS}$. To better understand the matrices and vectors $\mathbb{A}(\mu)$ and $\mathbb{F}(\mu)$ (a similar procedure applies to $\mathbb{L}^1$, $\mathbb{L}^2$) we consider the assembly of the static condensation system. Let $\mathbb{A}^{COM}(\mu) \in \mathbb{R}^{m_{COM} \times m_{COM}}$ and $\mathbb{F}^{COM}(\mu) \in \mathbb{R}^{m_{COM}}$ denote the "local stiffness matrix" and "local load vector" on component COM, respectively, which from (20) has entries $$\mathbb{A}_{(k',L-P'),(k,L-P)}(\mu) \equiv a_{COM}(\psi_{L-P,COM} + b_{k',L-P,COM}^{\mathcal{N}}(\mu),$$
$$\psi_{k',L-P',COM} + b_{k',L-P',COM}^{\mathcal{N}}(\mu); \mu), \quad (31)$$

$$\mathbb{F}_{k',L-P'}^{COM}(\mu) \equiv f_{COM}(\psi_{k',L-P',COM} + b_{k',L-P',COM}^{\mathcal{N}}(\mu);$$
$$\mu) - a_{COM}(b_{f,COM}^{\mathcal{N}}(\mu), \psi_{k',L-P',COM} + b_{k',L-P',COM}^{\mathcal{N}}$$
$$(\mu); \mu), \quad (32)$$

for $1 \leq k \leq n_{\mathcal{G}(L-P,COM)}$, $\forall L-P \in \mathcal{P}_{COM}$, and $1 \leq k' \leq n_{\mathcal{G}(L-P',COM)}$, $\forall L-P' \in \mathcal{P}_{COM}$; note $m_{COM} = \Sigma_{L-P \in \mathcal{P}_{COM}} n_{\mathcal{G}(L-P,COM)}$ is the number of port degrees of freedom in COM. Algorithm 1 then defines the assembly procedure by which we construct (28),(29) from (31),(32); we employ the notation "A+=B" to represent an increment "A←A+B."

---

Algorithm 1: Assembly of Truth Schur Complement System

1. $\mathbb{F}(\mu) = 0$, $\mathbb{A}(\mu) = 0$
2. for COM $\in \mathcal{C}_{SYS}(\mu)$ do
3.   for L-P' $\in \mathcal{P}_{COM}$, k' $\in \{1, \ldots, n_{\mathcal{G}(L-P',COM)}\}$ do
4.     $\mathbb{F}_{k',\mathcal{G}(L-P',COM)} += \mathbb{F}_{k',L-P'}^{COM}(\mu)$
5.     for L-P $\in \mathcal{P}_{COM}$, k $\in \{1, \ldots, n_{\mathcal{G}(L-P,COM)}\}$ do
6.       $\mathbb{A}_{(k',\mathcal{G}(L-P',COM)),(k,\mathcal{G}(L-P,COM))} += \mathbb{A}_{(k',L-P'),(k,L-P)}^{COM}(\mu)$
7.     endfor
8.   endfor
9. endfor

---

Note that in the case in which we a Dirichlet condition is satisfied on a port, Algorithm 1 may be slightly modified: once the assembly is complete, we eliminate the Dirichlet port degrees of freedom from the system—since Dirichlet G-P's are not included in $\mathcal{P}_{SYS}$.

We obtain a result which confirms well-posedness of the (square) system (27) and which will later serve to demonstrate well-posedness of our RB approximation.

Lemma 1: There exists a constant $C(\Omega_{SYS}) > 0$ such that the minimum eigenvalue of $\mathbb{A}(\mu)$, $\lambda_{min}(\mu)$, satisfies $\lambda_{min}(\mu) \geq C(\Omega_{SYS})$, $\forall \mu \in \mathcal{D}_{SYS}$.

Proof. From Lemma 3.1 in S. C. Brenner, "The Condition Number of the Schur Complement in Domain Decomposition," *Numerische Mathematik*, 83:187-203, 1999, we obtain, $$a_{SYS}(v,v;\mu) \geq C(\Omega_{SYS};\mu)(v,v)_{\mathcal{P}_{SYS}}, \forall v \in X^{\mathcal{N}}_{\mathcal{P}_{SYS}}(\mu) \quad (33)$$

for $C(\Omega_{SYS}; \mu) \geq 0$; since $\mathcal{D}_{SYS}$ is compact, we can further conclude $$a_{SYS}(v,v;\mu) \geq C(\Omega_{SYS})(v,v)_{\mathcal{P}_{SYS}}, \forall v \in X^{\mathcal{N}}_{\mathcal{P}_{SYS}}(\mu),$$
$$\forall \mu \in \mathcal{D}_{SYS}, \quad (34)$$

for a constant $C(\Omega_{SYS}) > 0$. Next, for any $v, w \in X^{\mathcal{N}}_{\mathcal{P}_{SYS}}(\mu)$ expressed in terms of the basis $\{\Phi_{k,G-P} : 1 \leq k \leq n_{G-P}, \forall G-P \in \mathcal{P}_{SYS}\}$ with coefficient vectors $\mathbb{V}, \mathbb{W} \in \mathbb{R}^{n_{sc}}$, we obtain from (10)

$$(v,w)_{\mathcal{P}_{SYS}} = \mathbb{W}^T \mathbb{V}, \quad (35)$$

and from (28)

$$a(v,w;\mu) = \mathbb{W}^T \mathbb{A}(\mu) \mathbb{V}. \quad (36)$$

Hence, from (34), (35), and (36) we obtain the Rayleigh quotient lower bound, $$\lambda_{min}(\mu) \equiv \min_{\mathbb{V} \in \mathbb{R}^{n_{sc}}} \frac{\mathbb{V}^T \mathbb{A}(\mu) \mathbb{V}}{\mathbb{V}^T \mathbb{V}} \quad (37)$$
$$= \min_{v \in X^{\mathcal{N}}_{\mathcal{P}_{SYS}}} \frac{a_{SYS}(v,v;\mu)}{(v,v)_{\mathcal{P}_{SYS}}} \geq C(\mathcal{C}_{SYS}),$$

from which the result follows.

The static condensation procedure described above may be computationally expensive due to the many "bubble solves" required on each component. However, we now introduce a reduced basis (RB) approximation: in particular, we follow exactly the same procedure as above, except now we introduce RB approximations for the bubble functions $b^{\mathcal{N}}_{f,COM}(\mu)$, $b^{\mathcal{N}}_{k,L-P,COM}(\mu)$. As we will demonstrate, the resulting numerical approach may offer considerable computational savings.

To begin, from (18), for each COM $\in \mathcal{C}_{SYS}$, we define the RB approximation $\tilde{b}_{f,COM}(\mu) \in \tilde{X}_{f,COM;0}$, $$a_{COM}(\tilde{b}_{f,COM}(\mu),v;\mu) = f_{COM}(v;\mu), \forall v \in \tilde{X}_{f,COM;0}, \quad (38)$$

where the RB space $\tilde{X}_{f,COM;0}$ is constructed for each component COM from a greedy algorithm. Note that there is one RB bubble approximation $\tilde{b}_{f,COM}(\mu)$ for each component COM. Next, from (19), for each COM $\in \mathcal{C}_{SYS}$, we define the RB approximations $\tilde{b}_{k,L-P,COM}(\mu) \in \tilde{X}_{k,L-P,COM;0}$, $$a_{COM}(\tilde{b}_{k,L-P,COM}(\mu),v;\mu) = -a_{COM}(\Psi_{k,L-P,COM},v;\mu),$$
$$\forall v \in \tilde{X}_{k,L-P,COM;0}, \quad (39)$$

where $\tilde{X}_{k,L-P,COM;0}$ is an RB approximation space (a different RB approximation space for each $\{k, L-P, COM\}$) obtained by a greedy procedure. The problems (38),(39) are well-posed due to our coercivity assumption. Note that thanks to our eigenfunction port representation the higher-mode (larger $k$) bubble functions may vanish rapidly into the interior of COM—as seen in FIG. 9 for example—and thus in many cases these higher modes will depend relatively weakly on the parameter. Therefore we expect that for most of the bubble degrees of freedom a small RB space will suffice.

Next, in analogy to (20), for $1 \leq k \leq n_{G-P}$, and each G-P $\in \mathcal{P}_{SYS}$, we define $$\tilde{\Phi}_{k,L-P}(\mu) = \Psi_{k,G-P} + \Sigma_{COM \in \omega_{G-P}} \tilde{b}_{k,\mathcal{C}OM(G-P)}^{-1}(\mu) \quad (40)$$

and then $$\tilde{X}_{\mathcal{P}_{SYS}}(\mu) = \text{span}\{\tilde{\Phi}_{k,L-P}(\mu) : 1 \leq k \leq n_{G-P}, \forall G-P \in \mathcal{P}_{SYS}\}. \quad (41)$$

We endow $\tilde{X}_{\mathcal{P}_{SYS}}(\mu)$ with the same inner product and norm as $X^{\mathcal{N}}_{\mathcal{P}_{SYS}}(\mu)$. From (25), (26) it is then natural to define $\tilde{u}_{SYS}(\mu) \in \tilde{X}^{\mathcal{N}}_{\mathcal{P}_{SYS}}(\mu)$ as $$\tilde{u}_{SYS}(\mu) = \Sigma_{COM \in \mathcal{C}_{SYS}} \tilde{b}_{f,COM}(\mu) + \Sigma_{G-P \in \mathcal{P}_{SYS}} \Sigma_{k=1}^{n_{(G-P)}}$$
$$\tilde{U}_{k,G-P}(\mu) \tilde{\Phi}_{k,G-P}(\mu), \quad (42)$$

where the coefficients $\tilde{U}_{k,G-P}(\mu)$ satisfy $$\sum_{k=1}^{n_{G-P}} \tilde{U}_{k,G-P}(\mu) a_{SYS}(\tilde{\Phi}_{k,G-P}(\mu), v; \mu) = \quad (43)$$
$$f_{SYS}(v; \mu) - \Sigma_{COM \in \mathcal{C}_{SYS}} a_{SYS}(\tilde{b}_{f,COM}(\mu)v; \mu), \forall v \in X^{\mathcal{N}}_{\mathcal{P}_{SYS}}(\mu).$$

We now identify the linear algebraic structure associated with (43). In particular, we test in (43) on $\tilde{\Phi}_{k',G-P'}(\mu)$ for $1 \leq k' \leq n_{G-P'}$, $\forall G-P' \in \mathcal{P}_{SYS}$, to obtain our "RB static condensation" system of dimension $n_{sc}$, $$\tilde{\mathbb{A}}(\mu) \tilde{\mathbb{U}}\mu = \tilde{\mathbb{F}}(\mu), \quad (44)$$

for the vector $\tilde{\mathbb{U}}(\mu) \in \mathbb{R}^{sc}$ of coefficients $\tilde{U}_{k,G-P}(\mu)$. Note that the RB system (44) is the same size as the truth system (27): a priori, there is no reduction of the truth port degrees of freedom. Furthermore, our RBE system output can be expressed as $$\tilde{s}_{SYS}(\mu) \equiv (\mathbb{L}^1(\mu) + \tilde{\mathbb{L}}(\mu))^T \tilde{\mathbb{U}}(\mu) +$$
$$\Sigma_{COM \in \mathcal{C}_{SYS}} l_{SYS}(\tilde{b}_{f,COM}(\mu); \mu). \quad (45)$$

We now define these RBE static condensation quantities more explicitly. The matrix $\tilde{\mathbb{A}}(\mu) \in \mathbb{R}^{n_{sc} \times n_{sc}}$ and vector $\tilde{\mathbb{F}}(\mu) \in \mathbb{R}^{n_{sc}}$ are defined as $$\tilde{\mathbb{A}}_{(k',G-P'),(k,G-P)}(\mu) = a_{SYS}(\tilde{\Phi}_{k,G-P}(\mu), \tilde{\Phi}_{k',G-P'}(\mu); \mu), \quad (46)$$

$$\tilde{\mathbb{F}}_{k',G-P'}(\mu) = f_{SYS}(\tilde{\Phi}_{k',G-P'}(\mu); \mu) -$$
$$\Sigma_{COM \in \mathcal{C}_{SYS}} a_{SYS}(\tilde{b}_{f,COM}(\mu),$$
$$\tilde{\Phi}_{k',G-P'}(\mu); \mu), \quad (47)$$

respectively, for $1 \leq k \leq n_{G-P}$, $\forall G-P \in \mathcal{P}_{SYS}$, and $1 \leq k' \leq n_{G-P'}$, $\forall G-P' \in \mathcal{P}_{SYS}$; from (46) it is clear that $\tilde{\mathbb{A}}(\mu)$ is symmetric. The output vector $\mathbb{L}^1$ is defined in (30) and the output vector $\tilde{\mathbb{L}}^2(\mu) \in \mathbb{R}^{n_{sc}}$ is given by $$\tilde{\mathbb{L}}_{k,G-P}^2(\mu) = \Sigma_{COM \in \omega_{G-P}} l_{SYS}(\tilde{b}_{k,\mathcal{C}OM(G-P)}^{-1}(\mu)), \quad (48)$$

for $1 \leq k \leq n_{G-P}$, $\forall G-P \in \mathcal{P}_{SYS}$.

We now introduce the reduced basis versions of the "local stiffness matrix" and "local load vector": for each COM $\in \mathcal{C}_{SYS}$, from (40)

$$\tilde{\mathbb{A}}_{(k',L-P'),(k,L-P)}(\mu) = a_{COM}(\Psi_{k,L-P,COM} + \tilde{b}_{k,L-P,COM}(\mu),$$
$$\Psi_{k',L-P',COM} + \tilde{b}_{k',L-P',COM}(\mu); \mu), \quad (49)$$

$$\tilde{\mathbb{F}}_{k',L-P'}{}^{COM}(\mu) \equiv f_{COM}(\psi_{k',L-P',COM} + \tilde{b}_{k',L-P',COM}(\mu);\mu) -$$
$$a_{COM}(\;b^{\mathcal{N}}_{f,COM}(\mu), \psi_{k',L-P',COM} + \tilde{b}_{k',L-P',COM}(\mu);$$
$$\mu), \tag{50}$$

for $1 \le k \le n_{\mathcal{G}(L-P,COM)}$, $\forall L-P \in \mathcal{P}_{COM}$, and $1 \le k' \le n_{\mathcal{G}(L-P',COM)}$, $\forall L-P' \in \mathcal{P}_{COM}$. Algorithm 2 then defines the assembly procedure by which we construct (46),(47) from (49),(50). As in the truth case, minor post-processing may be added in the case of Dirichlet boundary conditions.

---

Algorithm 2: Assembly of RB Schur Complement System

1. $\tilde{\mathbb{F}}(\mu) = 0$, $\tilde{\mathbb{A}}(\mu) = 0$
2. for COM $\in \mathcal{C}_{SYS}(\mu)$ do
3.   for L-P' $\in \mathcal{P}_{COM}$, k' $\in \{1,...,n_{\mathcal{G}(L-P',COM)}\}$ do
4.     $\tilde{\mathbb{F}}_{k',\mathcal{G}(L-P',COM)} += \tilde{\mathbb{F}}_{k',L-P'}{}^{COM}(\mu)$
5.     for L-P $\in \mathcal{P}_{COM}$, k $\in \{1,...,n_{\mathcal{G}(L-P,COM)}\}$ do
6.       $\tilde{\mathbb{A}}_{(k',\mathcal{G}(L-P',COM)),(k,\mathcal{G}(L-P,COM))} += \tilde{\mathbb{A}}_{(k',L-P'),(k,L-P)}{}^{COM}(\mu)$
7.     endfor
8.   endfor
9. endfor

---

We can prove well-posedness of the discrete problem.

Proposition 2: If $\|\mathbb{A}(\mu) - \tilde{\mathbb{A}}(\mu)\|_2 < \lambda_{min}(\mu)$, then $\tilde{\lambda}_{min}(\mu) > 0$, where $\tilde{\lambda}_{min}(\mu)$ is the minimum eigenvalue of $\tilde{\mathbb{A}}(\mu)$. Also, we have $$\|\tilde{\mathbb{U}}(\mu)\|_2 \le \frac{\sqrt{\gamma_{SYS}(\mu)}}{\alpha_{SYS}(\mu)\sqrt{C(\Omega_{SYS})}} \|\tilde{f}(\cdot;\mu)\|_{(X^{\mathcal{N}}_{SYS})'} \text{ where} \tag{51}$$

$\tilde{f}(v;\mu) \equiv f_{SYS}(v;\mu) - \Sigma_{COM \in \mathcal{C}_{SYS}} a_{SYS}(b^{\mathcal{N}}_{f,COM}(\mu), v;\mu)$, and $\|\tilde{f}(\cdot;\mu)\|_{(X^{\mathcal{N}}_{SYS})'} \equiv \sup_{v \in X^{\mathcal{N}}_{SYS}} \frac{\tilde{f}(v;\mu)}{\|v\|_{X,SYS}}$.

Here for $v \in \mathbb{R}^n$ (respectively, $A \in \mathbb{R}^{n \times n}$), $\|\cdot\|_2$ refers to the Euclidean norm $\|v\|_2 \equiv (v^T v)^{1/2}$ (respectively, induced norm $\|A\|_2 \equiv \sup_{v \in \mathbb{R}^n} \|Av\|_2 / \|v\|_2$).

Proof. First we consider the bound for $\tilde{\lambda}_{min}(\mu)$. We have $$\tilde{\lambda}_{min}(\mu) = \min_{\mathbb{V} \in \mathbb{R}^{n_{sc}}} \frac{\mathbb{V}^T \tilde{\mathbb{A}}(\mu) \mathbb{V}}{\mathbb{V}^T \mathbb{V}}$$
$$= \min_{\mathbb{V} \in \mathbb{R}^{n_{sc}}} \frac{\mathbb{V}^T(\mathbb{A}(\mu) + (\tilde{\mathbb{A}}(\mu) - \mathbb{A}(\mu)))\mathbb{V}}{\mathbb{V}^T \mathbb{V}} \le$$
$$\min_{\mathbb{V} \in \mathbb{R}^{n_{sc}}} \frac{\mathbb{V}^T \mathbb{A}(\mu) \mathbb{V}}{\mathbb{V}^T \mathbb{V}} + \max_{\mathbb{V} \in \mathbb{R}^{n_{sc}}} \left| \frac{\mathbb{V}^T(\tilde{\mathbb{A}}(\mu) - \mathbb{A}(\mu))\mathbb{V}}{\mathbb{V}^T \mathbb{V}} \right|$$

and thus $$|\lambda_{min}(\mu) - \tilde{\lambda}_{min}(\mu)| \le \max_{\mathbb{V} \in \mathbb{R}^{n_{sc}}} \left| \frac{\mathbb{V}^T(\tilde{\mathbb{A}}(\mu) - \mathbb{A}(\mu))\mathbb{V}}{\mathbb{V}^T \mathbb{V}} \right|.$$

But $$\max_{\mathbb{V} \in \mathbb{R}^{n_{sc}}} \left| \frac{\mathbb{V}^T(\mathbb{A}(\mu) - \tilde{\mathbb{A}}(\mu))\mathbb{V}}{\mathbb{V}^T \mathbb{V}} \right| \le \max_{\mathbb{V} \in \mathbb{R}^{n_{sc}}} \frac{\|\mathbb{V}\|_2 \|(\mathbb{A}(\mu) - \tilde{\mathbb{A}}(\mu))\mathbb{V}\|_2}{\|\mathbb{V}\|_2^2} =$$
$$\max_{\mathbb{V} \in \mathbb{R}^{n_{sc}}} \frac{\|(\mathbb{A}(\mu) - \tilde{\mathbb{A}}(\mu))\mathbb{V}\|_2}{\|\mathbb{V}\|_2} = \|\mathbb{A}(\mu) - \tilde{\mathbb{A}}(\mu)\|_2.$$

Positivity of $\tilde{\lambda}_{min}(\mu)$ then follows from the lower bound for $\lambda_{min}(\mu)$ in Lemma 1.

Next, we consider the bound for $\|\tilde{\mathbb{U}}(\mu)\|_2$. Let $$\tilde{u}_{\mathcal{P}_{SYS}}(\mu) \equiv \sum_{k=1}^{n_{G-P}} \tilde{U}_{k,G-P}(\mu) \tilde{\Phi}_{k,G-P}(\mu) \in \tilde{X}_{\mathcal{P}_{SYS}}(\mu).$$

Then from (43) we have $$a_{SYS}(\tilde{u}_{\mathcal{P}_{SYS}}(\mu), v;\mu) = \hat{f}(v;\mu), \forall v \in \tilde{X}_{\mathcal{P}_{SYS}}(\mu). \tag{52}$$

Since $\tilde{X}_{\mathcal{P}_{SYS}}(\mu) \subset X^{\mathcal{N}}_{SYS}$, it follows from coercivity that $$\alpha_{SYS}(\mu) \|\tilde{u}_{\mathcal{P}_{SYS}}(\mu)\|_{X,SYS}^2 \le a(\tilde{u}_{\mathcal{P}_{SYS}}(\mu), \tilde{u}_{\mathcal{P}_{SYS}}(\mu);\mu) =$$
$$\hat{f}(\tilde{u}_{\mathcal{P}_{SYS}}(\mu);\mu) \le \|\hat{f}(\cdot;\mu)\|_{(X_{SYS})'} \|\tilde{u}_{\mathcal{P}_{SYS}}(\mu)\|_{X,SYS}. \tag{53}$$

Hence, from (53) and continuity of $a_{SYS}(\cdot,\cdot;\mu)$, we have $$(a_{SYS}(\tilde{u}_{\mathcal{P}_{SYS}}(\mu), \tilde{u}_{\mathcal{P}_{SYS}}(\mu); \mu))^{1/2} \le \tag{54}$$
$$\sqrt{\gamma_{SYS}(\mu)} \|\tilde{u}_{\mathcal{P}_{SYS}}(\mu)\|_{X,SYS} \le \frac{\sqrt{\gamma_{SYS}(\mu)}}{\alpha_{SYS}(\mu)} \|\hat{f}(\cdot;\mu)\|_{(X^{\mathcal{N}}_{SYS})'}.$$

Finally, (51) follows from (34) and (54). Note that $\|\tilde{f}(\cdot;\mu)\|_{(X^{\mathcal{N}}_{SYS})'}$ is finite thanks to boundedness of $f_{SYS}$, continuity of $a_{SYS}$, and well-posedness of (38).

Proposition 2 implies that the static condensation RBE approximation is well-posed in the limit that the errors in the RB bubble approximations tend to zero; the proposition furthermore establishes stability of the approximation.

We now develop a bound for the error in the system level approximation. Our approach exploits RB a posteriori error estimators at the component level to develop a bound for $\|\mathbb{A}(\mu) - \tilde{\mathbb{A}}(\mu)\|_2$; we then apply matrix perturbation analysis at the system level to arrive at an a posteriori bound for $\|\mathbb{U}(\mu) - \tilde{\mathbb{U}}(\mu)\|_2$ and $|S_{SYS}(\mu) - \tilde{s}_{SYS}(\mu)|$.

For $1 \le k \le n_{\mathcal{G}(L-P,COM)}$, all L-P $\in \mathcal{P}_{COM}$, and each COM $\in \mathcal{C}_{SYS}$, the residual $r_{f,COM}(\cdot;\mu): X^{\mathcal{N}}_{COM;0} \to \mathbb{R}$ for (38) is given by $$r_{f,COM}(\cdot;\mu) \equiv f_{COM}(v;\mu) - a_{COM}(\tilde{b}_{f,COM}(\mu), v;\mu)), \forall v \in X^{\mathcal{N}}_{COM;0}; \tag{55}$$

similarly, the residual $r_{k,L-P,COM}(\cdot; \mu): X^{\mathcal{N}}_{COM;0} \to \mathbb{R}$ for (39) is given by $$r_{k,L-P,COM}(v;\mu) \equiv -a_{COM}(\psi_{k,L-P,COM} + \tilde{b}_{k,L-P,COM}(\mu), v;\mu), \forall v \in X^{\mathcal{N}}_{COM;0}. \tag{56}$$

Let $\mathcal{R}_{f,COM}(\mu)$ (respectively, $\mathcal{R}_{k,L-P,COM}(\mu)$) denote the dual norm of the residual (55) (respectively, (56)), $$\mathcal{R}_{f,COM}(\mu) \equiv \sup_{v \in X^{\mathcal{N}}_{COM;0}} \frac{r_{f,COM}(v;\mu)}{\|v\|_{X,COM}}, \tag{57}$$

$$\mathcal{R}_{k,L-P,COM}(\mu) \equiv \sup_{v \in X^{\mathcal{N}}_{COM;0}} \frac{r_{k,L-P,COM}(v;\mu)}{\|v\|_{X,COM}}. \tag{58}$$

Note the dual norms are defined with respect to the truth bubble spaces, as our RBE error is defined relative to the truth FE.

The a posteriori error bounds for the bubble approximations may then be expressed in terms of these residuals, as demonstrated in the following lemma.

Lemma 3: Given $\mu \in \mathcal{D}_{COM}$, for $1 \leq k \leq n_{\mathcal{G}(L-P,COM)}$, all L-P $\in \mathcal{P}_{COM}$, and any COM $\in \mathcal{C}_{SYS}$, we have $$\|b^{\mathcal{N}}_{f,COM}(\mu) - \tilde{b}_{f,COM}(\mu)\|_{X,COM} \leq \frac{\mathcal{R}_{f,COM}(\mu)}{\alpha^{LB}_{COM}(\mu)}, \quad (59)$$

$$\|b^{\mathcal{N}}_{k,L-P,COM}(\mu) - \tilde{b}_{k,L-P,COM}(\mu)\|_{X,COM} \leq \frac{\mathcal{R}_{k,L-P,COM}(\mu)}{\alpha^{LB}_{COM}(\mu)}, \quad (60)$$

where $\alpha_{COM}^{LB}(\mu)$ satisfies $$0 < \alpha_{COM}^{LB}(\mu) \leq \alpha_{COM}(\mu), \forall \mu \in \mathcal{D}_{COM}, \quad (61)$$

and $$\alpha_{COM}(\mu) \equiv \inf_{v \in X_{COM;0}} \frac{a_{COM}(v,v;\mu)}{\|v\|_{X,COM}}$$

is the COM coercivity constant.

A proof of Lemma 3 may be found in G. Rozza, et al., "Reduced Basis Approximation and a posteriori Error Estimation for Affinely Parametrized Elliptic Coercive Partial Differential Equations," *Archives Computational Methods in Engineering*, 15(3):229-275, September 2008. Note that $\alpha_{COM}^{LB}(\mu)$ may be evaluated via the "min-$\Theta$" approach or by the Successive Constraint Method, both of which are described in G. Rozza, et al.

We first derive bounds for the perturbation error in the statically condensed system matrix and load vector in the following lemma.

Lemma 4: For any $\mu \in \mathcal{D}_{SYS}$, $\|\mathbb{F}(\mu) - \tilde{\mathbb{F}}(\mu)\|_2 \leq \sigma_1(\mu)$ and $\|\mathbb{A}(\mu) - \tilde{\mathbb{A}}(\mu)\|_F \leq \sigma_2(\mu)$. Here $\|\cdot\|_F$ denotes the matrix Frobenius norm and $$\sigma_1(\mu) \equiv \{2 \sum_{COM \in \mathcal{C}_{SYS}} (\Delta_{f,COM}(\mu))^2$$

$$(\sum_{L-P \in \mathcal{P}_{COM}} \sum_{k=1}^{n_{\mathcal{G}(L-P,COM)}} (\Delta_{k,L-P,COM}(\mu))^2)\}^{1/2}, \quad (62)$$

$$\sigma_2(\mu) \equiv \{2 \sum_{COM \in \mathcal{C}_{SYS}}$$

$$(\sum_{L-P \in \mathcal{P}_{COM}} \sum_{k=1}^{n_{\mathcal{G}(L-P,COM)}} (\Delta_{k,L-P,COM}(\mu))^2)$$
$$_2\}^{1/2}, \quad (63)$$

where $$\Delta_{f,COM}(\mu) \equiv \mathcal{R}_{f,COM}(\mu) / \sqrt{\alpha_{COM}^{LB}(\mu)}, \quad (64)$$

$$\Delta_{k,L-P,COM}(\mu) \equiv \mathcal{R}_{k,L-P,COM}(\mu) / \sqrt{\alpha_{COM}^{LB}(\mu)}, \quad (65)$$

for $\alpha_{COM}^{LB}$ satisfying (61).

Proof. The proofs for (62) and (63) are similar and we thus restrict attention to the more involved case, (63). To derive a bound for $\|\mathbb{A}(\mu) - \tilde{\mathbb{A}}(\mu)\|_F$, we start with a component-level bound for $\|\mathbb{A}^{COM}(\mu) - \tilde{\mathbb{A}}^{COM}(\mu)\|_F$. For the error in a single entry on a component COM $\in \mathcal{C}_{SYS}$, we have $$|\mathbb{A}^{COM}_{(k',L-P'),(k,L-P)}(\mu) - \tilde{\mathbb{A}}^{COM}_{(k',L-P'),(k,L-P)}(\mu)| = \quad (66)$$

$$|a_{com}(\psi_{k,L-P,COM}(\mu) + b^{\mathcal{N}}_{k,L-P,COM}(\mu), \psi_{k',L-P',COM}(\mu); \mu) +$$

$$b^{\mathcal{N}}_{k',L-P',COM}(\mu); \mu) -$$

$$a_{com}(\psi_{k,L-P,COM}(\mu) + \tilde{b}_{k,L-P,COM}(\mu),$$

$$\psi_{k',L-P',COM}(\mu); \mu) + \tilde{b}_{k',L-P',COM}(\mu); \mu)| =$$

-continued $$|a_{com}b^{\mathcal{N}}_{k,L-P,COM}(\mu), \psi_{k',L-P',COM}(\mu); \mu) +$$

$$a_{com}(\psi_{k,L-P,COM}(\mu) + b^{\mathcal{N}}_{k,L-P,COM}(\mu), b^{\mathcal{N}}_{k',L-P',COM}(\mu); \mu) -$$

$$a_{COM}\tilde{b}_{k,L-P,COM}(\mu),$$

$$\psi_{k',L-P',COM}(\mu); \mu) -$$

$$a_{com}(\psi_{k,L-P,COM}(\mu)\tilde{b}_{k,L-P,COM}(\mu)\tilde{b}_{k',L-P',COM}(\mu); \mu)|.$$

Since $b^{\mathcal{N}}_{k',L-P',COM}(\mu) \in X^{\mathcal{N}}_{COM;0}$, it follows from (19) that $$a_{COM}(\psi_{L-P,COM}(\mu) +$$
$$b^{\mathcal{N}}_{k,L-P,COM}(\mu), b^{\mathcal{N}}_{k',L-P',COM}(\mu); \mu) = 0. \quad (67)$$

Also, from (19) and symmetry of $a_{COM}$, we have $$a_{COM}(b^{\mathcal{N}}_{k,L-P,COM}(\mu), \psi_{k',L-P',COM}(\mu); \mu) = -a_{COM}(b^{\mathcal{N}}_{k,L-P,COM}(\mu), \quad (68)$$
$$b^{\mathcal{N}}_{k',L-P',COM}(\mu); \mu) = a_{COM}(\psi_{k,L-P,COM}(\mu), b^{\mathcal{N}}_{k',L-P',COM}(\mu); \mu),$$

and $$a_{COM}(\tilde{b}_{k,L-P,COM}(\mu), \psi_{k',L-P',COM}(\mu); \mu) = \quad (69)$$
$$-a_{COM}(\tilde{b}_{k,L-P,COM}(\mu), b^{\mathcal{N}}_{k',L-P',COM}(\mu); \mu).$$

Hence, (66) with (56), (67), (68), (69) implies $$|\mathbb{A}^{COM}_{(k',L-P'),(k,L-P)}(\mu) - \tilde{\mathbb{A}}^{COM}_{(k',L-P'),(k,L-P)}(\mu)| =$$

$$|a_{com}(\psi_{k,L-P,COM}(\mu) + \tilde{b}_{k,L-P,COM}(\mu), b^{\mathcal{N}}_{k',L-P',COM}(\mu); \mu) -$$

$$a_{com}(\psi_{k,L-P,COM}(\mu) + \tilde{b}_{k,L-P,COM}(\mu), \tilde{b}_{k',L-P',COM}(\mu); \mu)| =$$

$$|a_{com}(\psi_{k,L-P,COM}(\mu) + \tilde{b}_{k,L-P,COM}(\mu), b^{\mathcal{N}}_{k',L-P',COM}(\mu) - \tilde{b}_{k',L-P',COM}(\mu);$$

$$\mu)| = |r_{k,L-P,COM}(b^{\mathcal{N}}_{k',L-P',COM}(\mu) - \tilde{b}_{k',L-P',COM}(\mu); \mu)|.$$

It thus follows from (58) and Lemma 3 that $$|\mathbb{A}^{COM}_{(k',L-P'),(k,L-P)}(\mu) - \tilde{\mathbb{A}}^{COM}_{(k',L-P'),(k,L-P)}(\mu)| = \quad (70)$$

$$\frac{|r_{k,L-P,COM}(b^{\mathcal{N}}_{k',L-P',COM}(\mu) - \tilde{b}_{k',L-P',COM}(\mu); \mu)|}{\|b^{\mathcal{N}}_{k',L-P',COM}(\mu) - \tilde{b}_{k',L-P',COM}(\mu)\|_{X,COM}}$$

$$\|b^{\mathcal{N}}_{k',L-P',COM}(\mu) - \tilde{b}_{k',L-P',COM}(\mu)\|_{X,COM} \leq$$

$$\mathcal{R}_{k,L-P,COM}(\mu)\|b^{\mathcal{N}}_{k',L-P',COM}(\mu) - \tilde{b}_{k',L-P',COM}(\mu)\|_{X,COM} \leq$$

$$\mathcal{R}_{k,L-P,COM}(\mu)\mathcal{R}_{k',L-P',COM}(\mu)/\alpha^{LB}_{COM}(\mu) =$$

$$\Delta_{k,L-P,COM}(\mu)\Delta_{k',L-P',COM}(\mu).$$

Then, a Frobenius norm bound for the error in the "local stiffness matrix" for COM is given by $$\|\mathbb{A}^{COM}(\mu) - \tilde{\mathbb{A}}^{COM}(\mu)\|_F^2 \leq \quad (71)$$

$$\sum_{k=1}^{n_{g(L-P,COM)}} \sum_{k'=1}^{n_{g(L-P',COM)}} (\Delta_{k,L-P,COM}(\mu)\Delta_{k',L-P',COM}(\mu))^2 =$$

$$\left(\sum_{k=1}^{n_{g(L-P,COM)}} \Delta_{k,L-P,COM}(\mu)^2\right)$$

-continued $$\left(\sum_{COM \in C_{SYS}} \sum_{k'=1}^{n_{\mathcal{G}(L-P',COM)}} \Delta_{k',L-P',COM}(\mu)^2\right) = \left(\sum_{COM \in C_{SYS}} \sum_{k=1}^{n_{\mathcal{G}(L-P,COM)}} \Delta_{k,L-P,COM}(\mu)^2\right).$$

Finally, we recall that we suppose that each entry of $\mathbb{A}(\mu)$ and $\tilde{\mathbb{A}}(\mu)$ is assembled from a sum of terms from at most two different local stiffness matrices; thus (63) follows from (71) and the inequality $(a+b)^2 \leq 2(a^2+b^2)$. □

We note that the proof of Lemma 4 uses the symmetry of the $a_{COM}(\bullet,\bullet;\mu)$; the proof can be generalized to the non-symmetric case with a primal-dual RB formulation described in G. Rozza, et al. We now bound the solution error in the following proposition.

Proposition 5: If $\tilde{\lambda}_{min}(\mu) > \sigma_1(\mu)$, then $$\|\mathbb{U}(\mu) - \tilde{\mathbb{U}}(\mu)\|_2 \leq \Delta \mathbb{U}(\mu), \qquad (72)$$

where $$\Delta \mathbb{U}(\mu) \equiv \frac{\sigma_1(\mu) + \sigma_2(\mu) \|\tilde{\mathbb{U}}(\mu)\|_2 + \|\tilde{\mathbb{F}}(\mu) - \tilde{\mathbb{A}}(\mu)\tilde{\mathbb{U}}(\mu)\|_2}{\tilde{\lambda}_{min}(\mu) - \sigma_2(\mu)}. \qquad (73)$$

Recall that $\|\bullet\|_2$ refers to the Euclidean norm.

Proof. Let $\delta \mathbb{A}(\mu) \equiv \mathbb{A}(\mu) - \tilde{\mathbb{A}}(\mu)$, $\delta \mathbb{F}(\mu) \equiv \mathbb{F}(\mu) - \tilde{\mathbb{F}}(\mu)$, and $\delta \mathbb{U}(\mu) \equiv \mathbb{U}(\mu) - \tilde{\mathbb{U}}(\mu)$.

Then, from (27), we have the identity $$[\tilde{\mathbb{A}}(\mu) + \delta \mathbb{A}(\mu)] \delta \mathbb{U}(\mu) = \delta \mathbb{F}(\mu) - \delta \mathbb{A}(\mu) \tilde{\mathbb{U}}(\mu) + (\tilde{\mathbb{F}}(\mu) - \tilde{\mathbb{A}}(\mu) \tilde{\mathbb{U}}(\mu)). \qquad (74)$$

(Note if (44) is solved exactly then the last term on the right-hand side of (74) vanishes; however, we retain the term to accommodate (for example) iterative solution error.) We pre-multiply (74) by $\delta \mathbb{U}(\mu)^T$ and divide by $\delta \mathbb{U}(\mu)^T \delta \mathbb{U}(\mu)$ to obtain $$\tilde{\lambda}_{min}(\mu) \leq \frac{\delta \mathbb{U}(\mu)^T \tilde{\mathbb{A}}(\mu) \delta \mathbb{U}(\mu)}{\delta \mathbb{U}(\mu)^T \delta \mathbb{U}(\mu)} \qquad (75)$$

$$\leq \left|\frac{\delta \mathbb{U}(\mu)^T \delta \mathbb{F}(\mu)}{\delta \mathbb{U}(\mu)^T \delta \mathbb{U}(\mu)}\right| + \left|\frac{\delta \mathbb{U}(\mu)^T \delta \mathbb{A}(\mu) \tilde{\mathbb{U}}(\mu)}{\delta \mathbb{U}(\mu)^T \delta \mathbb{U}(\mu)}\right| +$$

$$\left|\frac{\delta \mathbb{U}(\mu)^T \delta \mathbb{A}(\mu) \mathbb{U}(\mu)}{\delta \mathbb{U}(\mu)^T \delta \mathbb{U}(\mu)}\right| + \left|\frac{\delta \mathbb{U}(\mu)^T (\tilde{\mathbb{F}}(\mu) - \tilde{\mathbb{A}}(\mu)\tilde{\mathbb{U}}(\mu))}{\delta \mathbb{U}(\mu)^T \delta \mathbb{U}(\mu)}\right|$$

$$\leq \frac{\|\delta \mathbb{F}(\mu)\|_2 + \|\delta \mathbb{A}(\mu) \mathbb{U}(\mu)\|_2 + \|\tilde{\mathbb{F}}(\mu) - \tilde{\mathbb{A}}(\mu)\tilde{\mathbb{U}}(\mu)\|_2}{\|\delta \mathbb{U}\|_2} + \|\delta \mathbb{A}(\mu)\|_2$$

$$\leq \frac{\|\delta \mathbb{F}(\mu)\|_2 + \|\delta \mathbb{A}(\mu)\|_2 \|\tilde{\mathbb{U}}(\mu)\|_2 + \|\tilde{\mathbb{F}}(\mu) - \tilde{\mathbb{A}}(\mu)\tilde{\mathbb{U}}(\mu)\|_2}{\|\delta \mathbb{U}(\mu)\|_2} + \|\delta \mathbb{A}(\mu)\|_2$$

$$\leq \frac{\sigma_1(\mu) + \sigma_2(\mu) \|\tilde{\mathbb{U}}(\mu)\|_2 + \|\tilde{\mathbb{F}}(\mu) - \tilde{\mathbb{A}}(\mu)\tilde{\mathbb{U}}(\mu)\|_2}{\|\delta \mathbb{U}(\mu)\|_2} + \sigma_2(\mu), \qquad (76)$$

where we have employed the bound $\|\delta \mathbb{A}(\mu)\|_2 \leq \|\delta \mathbb{A}(\mu)\|_F \leq \sigma_2(\mu)$ (recall that $\|\bullet\|_2 \leq \|\bullet\|_F$ is a consequence of the Cauchy-Schwarz inequality). The desired result (72),(73) then follows straightforwardly from (76). □

It follows from Proposition 5 that as our RB bubble approximations converge then the system level RBE approximation also converges:

Corollary 6: If $\sigma_1(\mu) \to 0$, $\sigma_2(\mu) \to 0$, then $\Delta \mathbb{U}(\mu) \to 0$.

Proof. The result directly follows from Proposition 2 and Lemma 3. □

Note we do not yet have bounds for the effectivity of our system level error estimator $\Delta \mathbb{U}(\mu)$.

We may invoke the error bound of Proposition 5 since the different contributions to the error bound (73) are readily identified. However, it is possible to develop a sharper bound as demonstrated in the following corollary.

Corollary 7: If $\tilde{\lambda}_{min}(\mu) > \sigma_1(\mu)$, $$\|\mathbb{U}(\mu) - \tilde{\mathbb{U}}(\mu)\|_2 \leq \overline{\Delta \mathbb{U}}(\mu), \qquad (77)$$

where $$\overline{\Delta \mathbb{U}}(\mu) \equiv \frac{\sigma_1(\mu) + \sigma_3(\mu) + \|\tilde{\mathbb{F}}(\mu) - \tilde{\mathbb{A}}(\mu)\tilde{\mathbb{U}}(\mu)\|_2}{\tilde{\lambda}_{min}(\mu) - \sigma_2(\mu)}, \text{ and} \qquad (78)$$

$$\sigma_3(\mu) \equiv \left\{ 2 \sum_{COM \in C_{SYS}} \left( \sum_{L-P \in \mathcal{P}_{COM}} \sum_{k=1}^{n_{\mathcal{G}(L-P,COM)}} (\Delta_{k,L-P,COM}(\mu))^2 \right) \cdot \left( \sum_{L-P \in \mathcal{P}_{COM}} \sum_{k=1}^{n_{\mathcal{G}(L-P,COM)}} \Delta_{k,L-P,COM}(\mu) |\tilde{U}_{k,L-P}^{COM}(\mu)| \right)^2 \right\}^{1/2}. \qquad (79)$$

Note for a given $COM \in \mathcal{C}_{SYS}$, $\tilde{\mathbb{U}}^{COM} \in \mathbb{R}^{m_{COM}}$ is the sub-vector of $\tilde{\mathbb{U}} \in \mathbb{R}^{n_{sc}}$ with entries $\tilde{U}_{k,L-P}^{COM} = \tilde{U}_{k,\mathcal{G}(L-P,COM)}$, $1 \leq k \leq n_{\mathcal{G}(L-P,COM)}$, $\forall L-P \in \mathcal{P}_{COM}$.

Proof.

We first develop a (sharper) bound for $$\left|\frac{\delta \mathbb{U}(\mu)^T \delta \mathbb{A}(\mu) \tilde{\mathbb{U}}(\mu)}{\delta \mathbb{U}(\mu)^T \delta \mathbb{U}(\mu)}\right|. \qquad (80)$$

To begin we invoke (70) to develop a bound for a single entry of the COM contribution, $(\mathbb{A}^{COM} - \tilde{\mathbb{A}}^{COM})\tilde{\mathbb{U}}^{COM}$, to the vector $\delta \mathbb{A}(\mu) \tilde{\mathbb{U}}(\mu)$ $$\left| \sum_{L-P \in \mathcal{P}_{COM}} \sum_{k=1}^{n_{\mathcal{G}(L-P,COM)}} \left(\mathbb{A}_{(k',L-P'),(k,L-P)}^{COM}(\mu) - \tilde{\mathbb{A}}_{(k',L-P'),(k,L-P)}^{COM}(\mu)\right) \tilde{U}_{(k,L-P)}^{COM}(\mu) \right| \leq \qquad (81)$$

$$\Delta_{k',L-P',COM}(\mu) \sum_{L-P \in \mathcal{P}_{COM}} \sum_{k=1}^{n_{\mathcal{G}(L-P,COM)}} \Delta_{k,L-P,COM}(\mu) |\tilde{U}_{k,L-P,COM}(\mu)|.$$

It thus follows from (81) and the Cauchy-Schwarz inequality that $$\|(\mathbb{A}^{COM}(\mu) - \tilde{\mathbb{A}}^{COM}(\mu))\tilde{\mathbb{U}}^{COM}(\mu)\|_2^2 = \qquad (82)$$

-continued $$\left( \begin{array}{c} \sum_{L-P'\in \mathcal{P}_{COM}} \sum_{k'=1}^{n_{\mathcal{G}(L-P',COM)}} (\Delta_{(k',L-P',COM)}(\mu)) \\ \sum_{L-P\in \mathcal{P}_{COM}} \sum_{k=1}^{n_{\mathcal{G}(L-P,COM)}} \Delta_{k,L-P,COM}(\mu)|\tilde{U}^{COM}_{k,L-P}(\mu)| \end{array} \right)^2 \leq$$

$$\left( \sum_{L-P\in \mathcal{P}_{COM}} \sum_{k=1}^{n_{\mathcal{G}(L-P,COM)}} \Delta_{k,L-P,COM}(\mu)^2 \right)$$

$$\left( \sum_{L-P\in \mathcal{P}_{COM}} \sum_{k=1}^{n_{\mathcal{G}(L-P,COM)}} \Delta_{k,L-P,COM}(\mu)|\tilde{U}^{COM}_{k,L-P}(\mu)| \right)^2.$$

We now recall the assumption that a component has at most one neighbor per port; hence, with the inequality $(a+b)^2 \leq 2(a^2+b^2)$, we can accumulate (82) over all COM $\in \mathcal{C}_{SYS}$ to obtain $$\|\delta \mathbb{A}(\mu)\tilde{\mathbb{U}}(\mu)\|_2 \leq \sigma_3(\mu). \quad (83)$$

The result then follows from (75) and (83). □

We anticipate that $\tilde{U}_{k,G-P}$ will decrease (potentially quite rapidly) with k, and thus we can expect $\overline{\Delta \mathbb{U}}(\mu) \ll \Delta \mathbb{U}$: $\overline{\Delta \mathbb{U}}$ will be much sharper than $\Delta \mathbb{U}$. As $\Delta \overline{\Delta \mathbb{U}}(\mu)$ and $\Delta \mathbb{U}(\mu)$ can be calculated at roughly the same cost, so that $\overline{\Delta \mathbb{U}}$ maybe desirable in some circumstances.

An a posteriori error bound for the system output $S_{SYS}(\mu)$ is given in the following proposition.

Proposition 8: Suppose $1_{SYS}: X^{\mathcal{N}}_{SYS} \times \mathcal{D}_{SYS} \to \mathbb{R}$ satisfies $$l_{SYS}(v;\mu)=0, \forall v\in \bigoplus_{COM\in \mathcal{C}_{SYS}} X^{\mathcal{N}}_{COM;0}. \quad (84)$$

Then $$|S^{\mathcal{N}}_{SYS}(\mu)-\tilde{s}_{SYS}(\mu)| \leq \Delta \mathbb{U}^s(\mu), \quad (85)$$

for $$\Delta \mathbb{U}^s(\mu) \equiv \Delta \mathbb{U}(\mu)\|\mathbb{L}^1(\mu)\|_2 \quad (86)$$

(and similarly, $|S^{\mathcal{N}}_{SYS}(\mu)-\tilde{S}_{SYS}(\mu)| \leq \overline{\Delta \mathbb{U}}(\mu)\|\mathbb{L}^1(\mu)\|_2$).

Proof. From (14), (40), (42), (84), and the Cauchy-Schwarz inequality, we have $$|s^{\mathcal{N}}_{SYS}(\mu)-\tilde{s}_{SYS}(\mu)| = |l_{SYS}(u^{\mathcal{N}}_{SYS}(\mu)-\tilde{u}_{SYS}(\mu);u)| =$$

$$\left| \sum_{G-P\in \mathcal{P}_{SYS}} \sum_{k=1}^{n_{G-P}} (U_{k,G-P}(\mu)-\tilde{U}_{k,G-P}(\mu))l_{SYS}(\Psi_{k,G-P};\mu) \right| \leq$$

$$\left( \sum_{G-P\in \mathcal{P}_{SYS}} \sum_{k=1}^{n_{G-P}} (U_{k,\mathcal{G}(L-P,COM)}(\mu)-\tilde{U}_{k,\mathcal{G}(L-P,COM)}(\mu))^2 \right)^{1/2}$$

$$\left( \sum_{G-P\in \mathcal{P}_{SYS}} \sum_{k=1}^{n_{G-P}} l_{SYS}(\Psi_{k,G-P};\mu)^2 \right)^{1/2} \leq$$

$$\Delta \mathbb{U}(\mu) \left( \sum_{G-P\in \mathcal{P}_{SYS}} \sum_{k=1}^{n_{G-P}} l_{SYS}(\Psi_{k,G-P};\mu)^2 \right)^{1/2}.$$

The result then follows from the definition of $\mathbb{L}^1(\mu)$ in (30). □

We note that outputs that satisfy (84) are common in applications and in particular many outputs are further defined only over ports on $\partial \Omega_{SYS}$. Common outputs of interest are defined by average quantities over ports, in which case all but a few terms in the sum $\Sigma_{G-P\in \mathcal{P}_{SYS}} \Sigma_{k=1}^{n_{G-P}} l_{SYS}(\Psi_{k,G-P};\mu)^2$ in (85) will vanish.

We now discuss computational issues that may be relevant to efficient implementation of the static condensation RBE method. Computational efficiency of the static condensation RBE method may come from the Construction-Evaluation (C-E) decomposition of a "standard" RB method, for example, as described in G. Rozza, et al. We shall develop the C-E decomposition for reference components $\widehat{COM}$ in a Library. Ultimately, each component COM of an assembly $\mathcal{C}_{SYS}$ may be an instance of a reference component, $\widehat{COM}$, from our Library.

A reference component $\widehat{COM}$ is defined by a spatial domain $\Omega_{\widehat{COM}}$, a parameter domain $\mathcal{D}_{\widehat{COM}}$, parametrized bilinear and linear forms $\mu\in \mathcal{D}_{\widehat{COM}} \to a_{\widehat{COM}}(\bullet,\bullet;\mu)$, $f_{\widehat{COM}}(\bullet;\mu)$, and a collection of ports $\mathcal{P}_{\widehat{COM}}$ and port domains $\Gamma_{\widehat{L-P}}$, $\forall \widehat{L-P}\in \mathcal{P}_{\widehat{COM}}$. We presume that $a_{\widehat{COM}}$ is symmetric, continuous over $H^1(\Omega_{\widehat{COM}})$, and coercive over $\{v\in H^1(\Omega_{\widehat{COM}}): v|_{\Gamma_{\widehat{L-P}}}=0, \forall \widehat{L-P}\in \mathcal{P}_{\widehat{COM}}\}$; we further assume that f is continuous over $H^1(\Omega_{\widehat{COM}})$. The truth discretization of the reference component $\widehat{COM}$ can be decomposed into port and bubble degrees of freedom. We denote by $n_{\widehat{L-P},\widehat{COM}}$ the number of interface functions $\psi_{k,\widehat{L-P},\widehat{COM}}$ on $\widehat{L-P},\widehat{COM}$; we further define $m_{\widehat{COM}} \equiv \Sigma_{\widehat{L-P}\in \mathcal{P}_{\widehat{COM}}} n_{\widehat{L-P},\widehat{COM}}$, and thus $m_{\widehat{COM}}$ represents the total number of port degrees of freedom in $\widehat{COM}$. Also, we let $m_{max} \equiv \max_{\widehat{COM}\in \text{Library}} m_{\widehat{COM}}$.

For any given $\widehat{COM}$ in the Library, $\tilde{b}_{f,\widehat{COM}}\in \tilde{X}_{f,\widehat{COM};0}$ and $\tilde{b}_{k,\widehat{L-P},\widehat{COM}}\in \tilde{X}_{k,\widehat{L-P},\widehat{COM};0}$, $1\leq k\leq n_{\widehat{L-P},\widehat{COM}}$, $\forall \widehat{L-P}\in \mathcal{P}_{\widehat{COM}}$, satisfy hatted (38) and hatted (39), respectively. (Here the adjective "hatted" shall refer to a $\widehat{COM}$ version of an equation earlier defined for a particular instance COM; we thus avoid much repetition.) The contribution of these RB bubble functions to the approximate Schur complement and load vector, $\mu\in \mathcal{D}_{\widehat{COM}} \to \mathbb{A}^{\widehat{COM}}(\mu)$, $\mathbb{F}^{\widehat{COM}}(\mu)$ are then given by hatted (49) and hatted (50), respectively. The corresponding a posteriori error bound for $|\mathbb{A}^{\widehat{COM}}_{(k',\widehat{L-P'}),(k,\widehat{L-P})}(\mu)-\tilde{\mathbb{A}}^{\widehat{COM}}_{(k',\widehat{L-P'}),(k,\widehat{L-P})}(\mu)|$ is given from (70) by $\Delta_{k,\widehat{L-P},\widehat{COM}}(\mu)$ $\Delta_{k',\widehat{L-P'},\widehat{COM}}(\mu)$ for $\Delta_{k,\widehat{L-P},\widehat{COM}}(\mu)$ defined in hatted (65). Similarly, the a posteriori error bound for $|\mathbb{F}^{\widehat{COM}}_{k',\widehat{L-P'}}(\mu)-\tilde{\mathbb{F}}^{\widehat{COM}}_{k',\widehat{L-P}}(\mu)|$ is given by $\Delta_{f,\widehat{COM}}(\mu)$ $\Delta_{k',\widehat{L-P'},\widehat{COM}}(\mu)$.

The C-E decomposition effects the computation of $\tilde{\mathbb{A}}^{\widehat{COM}}(\mu)$, $\tilde{\mathbb{F}}^{\widehat{COM}}(\mu)$, and $\Delta_{f,\widehat{COM}}(\mu)$, $\Delta_{k,\widehat{L-P},\widehat{COM}}(\mu)$, $1\leq k\leq n_{\widehat{L-P},\widehat{COM}}$; $\forall \widehat{L-P}\in \mathcal{P}_{\widehat{COM}}$, in two steps: The first, Construction, step is performed only once; this step is expensive and in particular the cost may depend on dim($X^{\mathcal{N}}_{\widehat{COM};0}$), the $\widehat{COM}$ truth bubble space. The second, Evaluation, step is performed many times for each new parameter of interest in $\mathcal{D}_{\widehat{COM}}$; this step is inexpensive and in particular the cost shall be independent of dim($X^{\mathcal{N}}_{\widehat{COM};0}$). We now describe the C-E steps in more detail: we focus on $\tilde{\mathbb{A}}^{\widehat{COM}}$ and the associated error bounds $\Delta_{k,\widehat{L-P},\widehat{COM}}(\mu)$, $1\leq k\leq n_{\widehat{L-P},\widehat{COM}}$, $\forall \widehat{L-P}\in \mathcal{P}_{\widehat{COM}}$.

We first introduce an additional critical enabling hypothesis on the bilinear and linear forms. In particular, we suppose that for each $\widehat{COM} \in$ Library, $a_{\widehat{COM}}$ and $f_{\widehat{COM}}$ are "affine in functions of the parameter": for any $\mu \in \mathcal{D}_{\widehat{COM}}$, $$a_{\widehat{COM}}(v,w;\mu) \equiv \sum_{q=1}^{Q_{a,\widehat{COM}}} \Theta_{a,\widehat{COM}}^q(\mu) \, a_{\widehat{COM}}^q(v,w), \tag{87}$$

$$f_{\widehat{COM}}(v;\mu) \equiv \sum_{q=1}^{Q_{f,\widehat{COM}}} \Theta_{f,\widehat{COM}}^q(\mu) \, f_{\widehat{COM}}^q(v), \tag{88}$$

where $\Theta_{a,\widehat{COM}}^q$, $\Theta_{f,\widehat{COM}}^q$, $\mathcal{D}_{\widehat{COM}} \to \mathbb{R}$ are parameter dependent functions and $a_{\widehat{COM}}^q : X_{SYS}^N \times X_{SYS}^N \to \mathbb{R}$, $f_{\widehat{COM}}^q : X_{SYS}^N \to \mathbb{R}$ are parameter independent forms. This hypothesis can be relaxed via the Empirical Interpolation Method (EIM) described in M. Barrault, et al, "An 'Empirical Interpolation' Method: Application to Efficient Reduced-Basis Discretization of Partial Differential Equations," *Comptes Rendus Mathematique*, 339(9):667-672, 2004, which enables us to recover an approximate affine decomposition. However, very often (87),(88) is exactly satisfied.

We first discuss the Construction step. We consider a given $\widehat{COM} \in$ Library, a given $\widehat{L-P} \in \mathcal{P}_{\widehat{COM}}$, and for that port, a given mode $k \in \{1, \ldots, n_{\widehat{L-P},\widehat{COM}}\}$. We then apply a greedy procedure to form $\widetilde{X}_{k,\widehat{L-P},\widehat{COM}}^N$, $1 \leq N \leq N_{\max,[k,\widehat{L-P},\widehat{COM}]}$; we note that $\widetilde{X}_{k,\widehat{L-P},\widehat{COM}}^1 \subset \widetilde{X}_{k,\widehat{L-P},\widehat{COM}}^2 \subset \ldots \subset \widetilde{X}_{k,\widehat{L-P},\widehat{COM}}^{N_{\max,[k,\widehat{L-P},\widehat{COM}]}}$ constitutes a set of hierarchical RB approximation spaces. We may then choose, for each [k, $\widehat{L-P}$, $\widehat{COM}$], $$\widetilde{X}_{k,\widehat{L-P},\widehat{COM};0} = \widetilde{X}_{k,\widehat{L-P},\widehat{COM}}^{N_{[k,\widehat{L-P},\widehat{COM}]}}, \quad \text{for} \quad N_{[k,\widehat{L-P},\widehat{COM}]} \in \{1, \ldots, N_{\max,[k,\widehat{L-P},\widehat{COM}]}\}$$

selected according to various error or cost criteria. We may compute and store (for the Evaluation stage) various inner products over $X_{\widehat{COM};0}^N$, the collection of which we shall denote the Evaluation Dataset. We now present operation counts for the Evaluation stage, which shall be the emphasis of our discussion. We present our operation counts in terms of $N \equiv \max_{\widehat{COM}\in \text{Library}, \widehat{L-P}\in \mathcal{P}_{\widehat{COM}}, k \in \{1,\ldots,n_{\widehat{L-P},\widehat{COM}}\}} \widehat{L-P},\widehat{COM}}$ and $Q \equiv \max_{\widehat{COM}\in \text{Library}} [Q_{a,\widehat{COM}}, Q_{f,\widehat{COM}}]$.

In actual practice $N_{[k,\widehat{L-P},\widehat{COM}]}$ may be selected (in the Evaluation step) considerably less than N for many [k, $\widehat{L-P}$, $\widehat{COM}$], and hence our estimates are perforce pessimistic. Also, some $\widehat{COM} \in$ Library may not be invoked in any particular system.

We first consider the computation of the RB bubbles. We consider a particular [k, $\widehat{L-P}$, $\widehat{COM}$]: Given any $\mu \in \mathcal{D}_{\widehat{COM}}$, we use $O(QN^2) + O(N^3)$ FLOPs to obtain $\widetilde{b}_{k,\widehat{L-P},\widehat{COM}}(\mu)$ (or, more precisely, to obtain the coefficients of the reduced basis expansion for $\widetilde{b}_{k,\widehat{L-P},\widehat{COM}}$; we will then additionally use $O(Q^2N^2)$ FLOPs to obtain $\Delta_{k,\widehat{L-P},\widehat{COM}}(\mu)$, our a posteriori bound for the error in $\widetilde{b}_{k,\widehat{L-P},\widehat{COM}}(\mu)$ relative to $b_{k,\widehat{L-P},\widehat{COM}}^N(\mu)$. The Evaluation storage is $O(Q^2N^2)$. If we now sum over all port degrees of freedom in $\widehat{COM}$ we use $O(m_{\widehat{COM}}(Q^2N^2 + N^3))$ FLOPs; in addition, we contribute $O(m_{\widehat{COM}} Q^2N^2)$ storage to the Evaluation Dataset.

We next consider the operation count to evaluate the RB contributions to $\overline{\mathbb{A}}$ in terms of the now known RB bubble functions (basis coefficients). We first consider a particular k, $\widehat{L-P}$, $\widehat{COM}$ and k', $\widehat{L-P'}$, $\widehat{COM}$: Given any $\mu \in \mathcal{D}_{\widehat{COM}}$, $\widetilde{\mathbb{A}}_{(k,\widehat{L-P}),(k',\widehat{L-P'})}^{\widehat{COM}}(\mu)$ of (49) may be evaluated in $O(QN^2)$ operations. Note we may think of $\widetilde{\mathbb{A}}_{(k,\widehat{L-P}),(k',\widehat{L-P'})}^{\widehat{COM}}(\mu)$ as a joint "Schur entry" output associated with $\widetilde{b}_{k,\widehat{L-P},\widehat{COM}}$ and $\widetilde{b}_{k',\widehat{L-P'},\widehat{COM}}$. If we now sum over all port degrees of freedom in $\widehat{COM}$ we use $O(m_{\widehat{COM}}^2 QN^2)$ FLOPs; we also contribute $O(m_{\widehat{COM}}^2 QN^2)$ storage to the Evaluation Dataset.

The static condensation RBE method may proceed in two stages. In the Offline stage, for each $\widehat{COM} \in$ Library, we perform the Construction step to obtain the Evaluation Dataset. In the Online stage, we assemble a system of components COM $\in \mathcal{C}_{SYS}$ as instances of $\widehat{COM} \in$ Library, and we then invoke Evaluation to compute $\mu \in \mathcal{D}_{SYS} \to \widetilde{s}_{SYS}(\mu)$, $\Delta \mathbb{U}^s(\mu)$. Note that the Offline stage involves both Construction and (in the Greeedy procedure) Evaluation, however the Online stage involves only Evaluation.

For each $\widehat{COM} \in$ Library, we may perform the following steps:

1. For each $\widehat{L-P} \in \mathcal{P}_{\widehat{COM}}$—each distinct port in $\widehat{COM}$—we compute the port eigenmodes from hatted (8).

2. For each $k \in \{1, \ldots, n_{\widehat{L-P},\widehat{COM}}\}$, $\forall \widehat{L-P} \in \mathcal{P}_{\widehat{COM}}$, we compute the elliptically lifted interface functions from hatted (11), (12), and (13).

3. For each $k \in \{1, \ldots, n_{\widehat{L-P},\widehat{COM}}\}$, $\forall \widehat{L-P} \in \mathcal{P}_{\widehat{COM}}$, we perform a greedy algorithm to form the RB spaces $\widetilde{X}_{k,\widehat{L-P},\widehat{COM}}^{\bullet}$.

4. If $f_{\widehat{COM}} \neq 0$: We perform the greedy algorithm to form the "source" RB bubble space $\widetilde{X}_{f,\widehat{COM}}$.

5. We form and store the necessary inner products in the Evaluation Dataset.

The computational burden of this construction procedure can be significant. We note that the $m_{\widehat{COM}}$ (or $m_{\widehat{COM}} + 1$ if $f_{\widehat{COM}} \neq 0$) invocations of the greedy algorithm may be independent and may therefore be straightforwardly parallelized.

The Online stage comprises two substages: the assembly of the system; the parametric analysis of the system. To assemble the system we first define a collection of components $\mathcal{C}_{SYS}$ in which each COM $\in \mathcal{C}_{SYS}$ is an instantiation of a $\widehat{COM} \in$ Library; we shall denote by $|\mathcal{C}_{SYS}|$ the number of components in the system. Note that many COM may be instantiated from a single reference component $\widehat{COM}$. We next define the local-port to global-port mapping $\mathcal{G}$ which provides component connectivity information and indeed $\mathcal{P}_{SYS}^0$ is the image of $\mathcal{G}$; we may then impose Dirichlet boundary conditions on selected ports to identify $\mathcal{P}_{SYS}$ (which we assume yields a well-posed problem over $\Omega_{SYS}$). Finally, we provide the system parameter domain $\mathcal{D}_{SYS} \subset \Pi_{COM \in \mathcal{C}_{SYS}} \mathcal{D}_{COM}$. Note that $\Omega_{COM}$ remain reference elements from a geometric perspective and a final affine map may be used to realize the physical domain.

We recall that $\widehat{COM}$ and hence COM is defined over a domain $\Omega_{COM}$ which is independent of $\mu$; $\mu$-dependent geometric variations are implicit through transformations reflected in the coefficients of $a_{COM}$, $f_{COM}$. The actual physical domain associated with a component COM is given by $\Omega_{COM}^{phys}(\mu) \equiv \mathcal{A}_{COM}(\Omega_{COM}; \mu)$, for $\mu \in \mathcal{D}_{COM}$, where $\mathcal{A}_{COM}(\bullet; \mu)$ is a piecewise-affine mapping; the system physical domain is thus given by $$\overline{\Omega}_{SYS}^{phys}(\mu) \equiv \bigcup_{COM \in \mathcal{C}_{SYS}} \overline{\mathcal{A}}_{COM}(\Omega_{COM}; \mu).$$

In the simplest case $\mathcal{A}_{COM}(\bullet; \mu)$ may be dictated solely by translation and rotation "docking" parameters; for isotropic, homogeneous operators, our forms $a_{COM}$ and $f_{COM}$ may be independent of these docking parameters. On the other hand, $a_{COM}$, $f_{COM}$ will of course depend on geometric parameters $\mu$ that represent dilations and other more general affine transformations.

In some embodiments, we may not have complete freedom in imposing component connections. For example, two connectivity constraints must be honored. We consider two components COM, COM' which are connected in the sense that $\exists L\text{-}P \in \mathcal{P}_{COM}$ and $L\text{-}P' \in \mathcal{P}_{COM'}$ such that $\mathcal{G}(L\text{-}P, COM) = \mathcal{G}(L\text{-}P', COM')$. First, for such connected components, the associated truth "trace" spaces over the shared port must be identical: $X^N(\Gamma_{L\text{-}P,COM}) = X^N(\Gamma_{L\text{-}P',COM'})$. This constraint imposes a condition on the set of possible connections and hence possible mappings $\mathcal{G}$. Second, for connected components, $\mathcal{A}_{COM}(\Gamma_{L\text{-}P,COM}; \mu \in \mathcal{D}_{COM})$ must coincide with $\mathcal{A}_{COM'}(\Gamma_{L\text{-}P',COM'}; \mu \in \mathcal{D}_{COM'})$. This constraint imposes a condition on $\mathcal{D}_{SYS}$, in particular on the allowable domains for those parameters related to geometry (and hence on which $\mathcal{A}_{COM}$ will depend).

We now consider the steps and associated operation counts and storage required to evaluate $\mu \in \mathcal{D}_{SYS} \to \tilde{s}_{SYS}(\mu), \Delta \tilde{\mathbb{U}}^s(\mu)$. Typically we expect that a system defined by $\mathcal{C}_{SYS}, \mathcal{P}_{SYS}$ will be analyzed for many $\mu \in \mathcal{D}_{SYS}$, though of course only a single evaluation is also permitted: the advantage of the RBE approach—amortization of the Offline stage by many appeals to the Online stage—can be realized either over many parameters for a particular system or over many systems (or both).

Given $\mu \in \mathcal{D}_{SYS} (\Rightarrow \mu \in \mathcal{D}_{COM}, COM \in \mathcal{C}_{SYS})$, we perform the following steps:

1. We Evaluate the set of $m_{COM}$ (or $m_{COM}+1$, if $f_{COM} \neq 0$) RB bubble approximations (coefficients) and associated error bounds for each COM $\in \mathcal{C}_{SYS}$: the total cost over all components is $O(|\mathcal{C}_{SYS}|m_{max}(N^3+Q^2N^2+QN^2))$ FLOPs and the total storage is $O(|\mathcal{C}_{SYS}|m_{max}(Q^2N^2QN^2))$. The complexity scales with $|\mathcal{C}_{SYS}|$ even if $|\text{Library}|=|\mathcal{C}_{SYS}|$ since $\mu \in \mathcal{D}_{COM}$ is potentially different for different instances COM of any particular reference component $\widehat{COM}$.

2. We Evaluate the "local stiffness matrices" and "local load vectors" for each COM $\in \mathcal{C}_{SYS}$ and then assemble $\tilde{\mathbb{A}}$ of (44) according to Algorithm 2 at total cost $O(|\mathcal{C}_{SYS}|m_{max}^2QN^2)$. The complexity again scales with $|\mathcal{C}_{SYS}|$ because different instances of a reference component $\widehat{COM}$ may potentially correspond to different parameter values; the complexity scales with $m_{max}^2$ since $\tilde{\mathbb{A}}^{COM}$ has entries for each pair (L-P, COM),(L-P', COM').

3. We accumulate the error bound terms for $\sigma_1(\mu)$ and $\sigma_2(\mu)$ of Proposition 5 (and $\sigma_3(\mu)$ of Corollary 7) at total cost $O(|\mathcal{C}_{SYS}|m_{max})$.

4. We solve the linear system (44) for $\tilde{\mathbb{U}}(\mu)$ and then compute $\tilde{s}_{SYS}(\mu)$ from (45) at total cost $O(n_{sc}, m_{max}^2)$ 5. We compute $\tilde{\lambda}_{min}(\mu)$ and evaluate the system field and output a posteriori error bounds $\Delta \mathbb{U}$ of (72) and $\Delta \mathbb{U}^s$ of (85) at total cost $O(n_{sc}m_{max}^2)$.

We may solve for $\tilde{\mathbb{U}}(\mu)$ by LU factorization (though for larger statically condensed systems it may be desirable to employ iterative methods, for example, given moderate condition number of $\tilde{\mathbb{A}}$), and evaluate $\tilde{\lambda}_{min}(\mu)$ by inverse iteration (or, for large systems, a Lanczos algorithm). The computational costs in Online 4 and Online 5 assume that $\tilde{\mathbb{A}}(\mu)$ is a block sparse matrix with bandwidth $m_{max}$; we further assume that evaluation of $\tilde{\lambda}_{min}(\mu)$ goes through $O(1)$ iterations.

We may also visualize the field computed as described above. For instance, we may visualize $\tilde{u}_{SYS}(\mu)$ over selected regions or surfaces of $\Omega_{SYS}$, S. If these selected regions coincide with ports then no additional cost may be incurred. If, however, these selected regions include parts of $\partial\Omega_{SYS}$ (or $\Omega_{SYS}$) which do not coincide with ports, then additional operations and storage may be used—$O(N|V|)$, where V is the set of points in $\Omega$ at which $\tilde{u}_{SYS}$ may be evaluated in order to render the solution over S.

Figure 10:
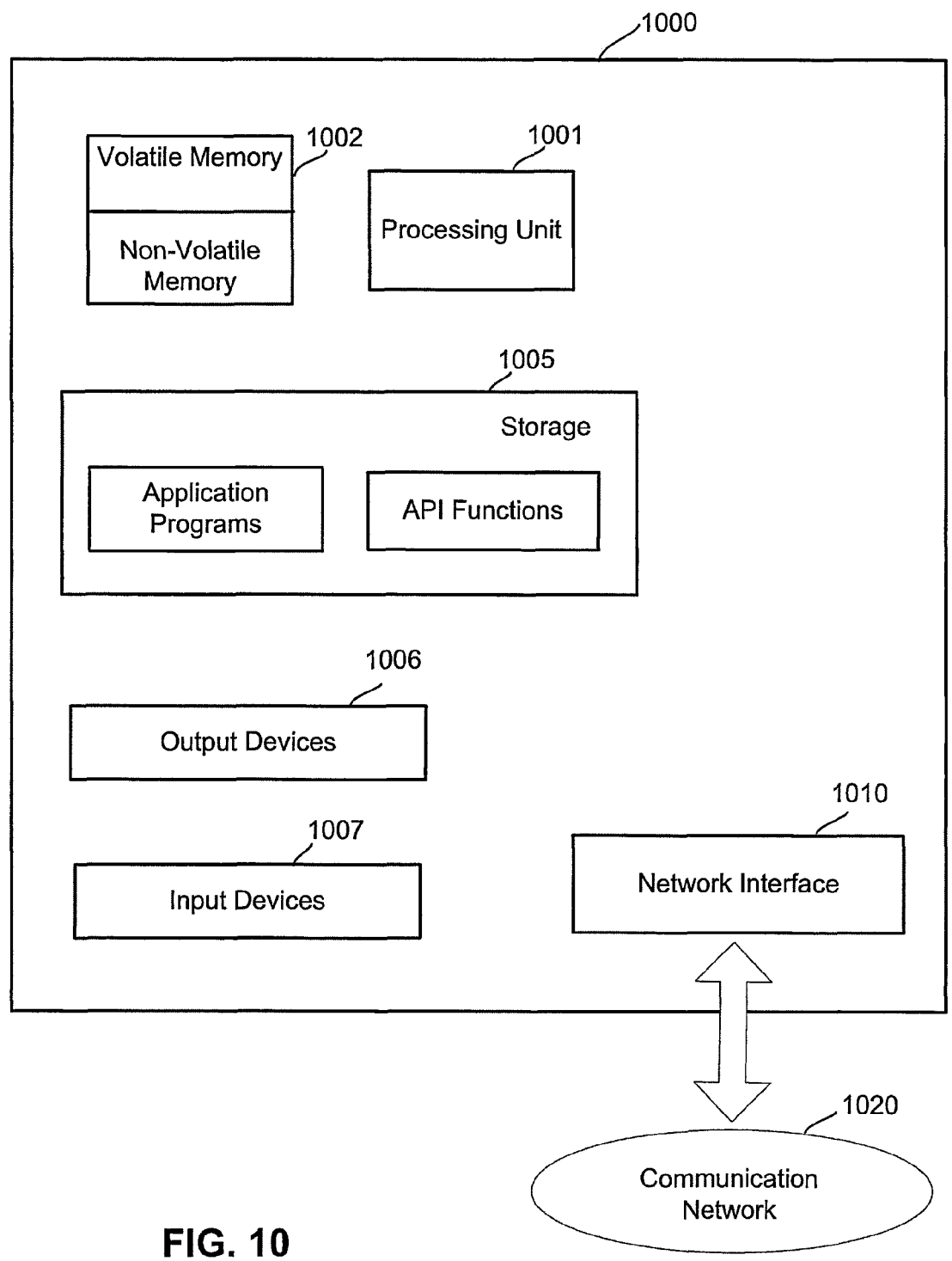
FIG. 10 shows, schematically, an illustrative computer on which various inventive aspects of the present disclosure may be implemented.

FIG. 10 shows, schematically, an illustrative computer 1000 on which various inventive concepts described herein may be implemented. For example, the computer 1000 may be a mobile device on which various features described herein in connection with a simulation tool may be implemented. However, it should be appreciated that the computer 1000 may also be a rack-mounted computer, a desktop computer, a laptop computer, or any other suitable portable or fixed computing device, as aspects of the present disclosure are not so limited.

As used herein, a "mobile device" may be any computing device that is sufficiently small so that it may be carried by a user (e.g., held in a hand of the user). Examples of mobile devices include, but are not limited to, mobile phones, pagers, portable media players, e-book readers, handheld game consoles, personal digital assistants (PDAs) and tablet computers. In some instances, the weight of a mobile device may be at most one pound, one and a half pounds, or two pounds, and/or the largest dimension of a mobile device may be at most six inches, nine inches, or one foot. Additionally, a mobile device may include features that enable the user to use the device at diverse locations. For example, a mobile device may include a power storage (e.g., battery) so that it may be used for some duration without being plugged into a power outlet. As another example, a mobile device may include a wireless network interface configured to provide a network connection without being physically connected to a network connection point.

In the embodiment shown in FIG. 10, the computer 1000 includes a processing unit 1001 that includes one or more processors and a non-transitory computer-readable storage medium 1002 that may include, for example, volatile and/or non-volatile memory. The computer 1000 may also include other types of non-transitory computer-readable medium, such as storage 1005 (e.g., one or more disk drives) in addition to the system memory 1002. The memory 1002 may store one or more instructions to program the processing unit 1001 to perform any of the functions described herein. The memory 1002 may also store one or more application programs and/or Application Programming Interface (API) functions.

The computer 1000 may have one or more input devices and/or output devices, such as devices 1006 and 1007 illustrated in FIG. 10. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards and pointing devices, such as mice, touch pads, and digitizing tablets. As another example, the input devices 1007 may include a microphone for capturing audio signals, and the output devices 1006 may include a display screen for visually rendering, and/or a speaker for audibly rendering, recognized text.

As shown in FIG. 10, the computer 1000 may also include one or more network interfaces (e.g., the network interface 1010) to enable communication via various networks (e.g., the network 1020). Examples of networks include a local area network or a wide area network, such as an enterprise network or the Internet. Such networks may be based on any suitable technology, and may operate according to any suitable protocol and may include wireless networks, wired networks or fiber optic networks.

Having thus described several aspects of at least one embodiment of this invention, it is to be appreciated that various alterations, modifications, and improvements will readily occur to those skilled in the art. Such alterations, modifications, and improvements are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a non-transitory computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various features and aspects of the present invention may be used alone, in any combination of two or more, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A computer-implemented method for modeling and analyzing a physical system comprising a plurality of components, the method comprising acts of:

accessing, based at least in part on a component type of a component of the plurality of components, a dataset from a plurality of datasets, the dataset comprising a representation of at least one partial differential equation, wherein:

the component is an N-dimensional component, N being at least 2, the component comprises an N-dimensional interior region and an (N−1)-dimensional port, the dataset comprises a plurality of basis functions for a reduced basis space associated with an interface function for the (N−1)-dimensional port, and a solution of the at least one partial differential equation represented by the accessed dataset depends on at least two independent spatial variables;

constructing a model of the component based at least in part on the accessed dataset and one or more parameters relating to a physical characteristic of the component, the model being an N-dimensional model, wherein constructing an N-dimensional model of the component comprises selecting coefficients for scaling the plurality of basis functions; and using, by at least one processor, the model of the component to compute at least one output value based on at least one input value, wherein the at least one input value is indicative of at least one physical condition under which the physical system is to be evaluated, and the at least one output value is indicative of a behavior of the physical system under the at least one physical condition.

2. The computer-implemented method of claim 1, wherein the one or more parameters comprise a first parameter relating to a geometric characteristic of the component and a second parameter relating to a non-geometric characteristic of the component.

3. The computer-implemented method of claim 1, wherein the at least one partial differential equation relates to an engineering problem selected from a group consisting of: equilibrium problems, eigenproblems, and time-dependent problems.

4. The computer-implemented method of claim 1, wherein the one or more parameters are received from a user.

5. The computer-implemented method of claim 1, wherein the model of the component comprises an instance of the at least one partial differential equation based at least in part on the one or more parameters relating to the physical characteristic of the component.

6. The computer-implemented method of claim 1, wherein:
the component is a first component; and
the model of the first component comprises information relating to a first port of the first component for connecting to a second port of a second component of the plurality of components.

7. The computer-implemented method of claim 6, wherein the model of the first component is a first model, and wherein the act of using the first model to compute the at least one output value comprises acts of:
constructing a composite model of the physical system comprising the plurality of components, wherein the act of constructing the composite model comprises using the information relating to the first port to define a relationship between the first model of the first component and a second model of the second component; and
using the composite model to compute the at least one output value based at least in part on the at least one input value.

8. The computer-implemented method of claim 7, wherein the act of constructing the composite model of the physical system further comprises an act of verifying whether a consistency criterion is satisfied in connecting the first port of the first component to the second port of the second component.

9. The computer-implemented method of claim 7, wherein the physical system comprises a third component having a third port that is not connected to any other component in the physical system, and wherein the composite model of the physical system is constructed based at least in part on one or more boundary conditions for the third port.

10. The computer-implemented method of claim 7, wherein the composite model of the physical system is a first composite model and the at least one output value is at least one first output value, and wherein the method further comprises an act of:
in response to a user request to modify at least one aspect of the physical system, modifying the first composite model to obtain a second composite model of the physical system; and using the second composite model to compute at least one second output value based at least in part on the at least one input value.

11. The computer-implemented method of claim 10, wherein the user request comprises a request to remove or add a specified component from the physical system.

12. The computer-implemented method of claim 10, wherein the user request comprises a request to change at least one specified parameter of a specified component.

13. The computer-implemented method of claim 10, wherein the user request comprises a request to disconnect two specified ports.

14. The computer-implemented method of claim 10, wherein at least one aspect of the physical system is a first aspect of the physical system, and wherein the method further comprises acts of:
determining whether a consistency criterion is violated due to modifying the first aspect of the physical system as requested; and
if it is determined that a consistency criterion is violated due to modifying the first aspect of the physical system as requested, modifying at least one second aspect of the physical system so that the consistency criterion is no longer violated.

15. The computer-implemented method of claim 1, wherein the method further comprises an act of:
visually rendering the at least one output value.

16. The computer-implemented method of claim 15, wherein the at least one output value comprises a plurality of output values over a three-dimensional (3D) domain, and wherein the method further comprises an act of:
visually rendering the plurality of output values over the 3D domain.

17. The computer-implemented method of claim 1, wherein the component is a first component, the model of the first component is a first model, and the physical system further comprises a second component that is identical to the first component, and wherein the method further comprises an act of:
constructing a second model of the second component based at least in part on the first model.

18. The computer-implemented method of claim 1, further comprising an act of:
estimating a difference between the at least one output value and a result of conducting a Finite Element Analysis (FEA) simulation over the physical system without performing calculation that depends on FEA models.

19. The computer-implemented method of claim 1, wherein the accessed dataset further comprises data generated by solving a plurality of instances of the at least one partial differential equation, each instance corresponding to a different set of one or more parameters for the at least one partial differential equation.

20. The computer-implemented method of claim 3, wherein the at least one partial differential equation comprises a plurality of differential equations relating to at least two different engineering problems selected from the group consisting of: equilibrium problems, eigenproblems, and time-dependent problems.

21. The computer-implemented method of claim 1, wherein the component is a first component, the model of the first component is a first model, and the physical system further comprises a second component, and wherein the method further comprises acts of:

receiving a user request to clone a subsystem of the physical system, the user request identifying the first and second components as being in the subsystem to be cloned;

constructing a third model of a third component based at least in part on the first model;

constructing a fourth model of a fourth component based at least in part on a second model of the second component; and using the first, second, third, and fourth models to construct a composite model of the physical system.

22. The computer-implemented method of claim 1, wherein the coefficients for scaling the plurality of basis functions are selected based on the one or more parameters relating to the physical characteristic of the component.

23. The computer-implemented method of claim 1, wherein:

constructing an N-dimensional model of the component further comprises using the coefficients to compute a linear combination of the plurality of basis functions.

24. The computer-implemented method of claim 23, further comprising:

estimating a difference between the linear combination of the plurality of basis functions and a bubble function associated with the interface function for the (N−1)-dimensional port.

25. A system for modeling and analyzing a physical system comprising a plurality of components, the system comprising:

at least one processor programmed to:

access, based at least in part on a component type of a component of the plurality of components, a dataset from a plurality of datasets, the dataset comprising a representation of at least one partial differential equation, wherein:

the component is an N-dimensional component, N being at least 2, the component comprises an N-dimensional interior region and an (N−1)-dimensional port, the dataset comprises a plurality of basis functions for a reduced basis space associated with an interface function for the (N−1)-dimensional port, and a solution of the at least one partial differential equation represented by the accessed dataset depends on at least two independent spatial variables;

construct a model of the component based at least in part on the accessed dataset and one or more parameters relating to a physical characteristic of the component, the model being an N-dimensional model, wherein constructing an N-dimensional model of the component comprises selecting coefficients for scaling the plurality of basis functions; and use the model of the component to compute at least one output value based on at least one input value, wherein the at least one input value is indicative of at least one physical condition under which the physical system is to be evaluated, and the at least one output value is indicative of a behavior of the physical system under the at least one physical condition.

26. At least one non-transitory computer-readable medium having encoded thereon instructions that, when executed by at least one processor, implement a method for modeling and analyzing a physical system comprising a plurality of components, the method comprising acts of:

accessing, based at least in part on a component type of a component of the plurality of components, a dataset from a plurality of datasets, the dataset comprising a representation of at least one partial differential equation, wherein:

the component is an N-dimensional component, N being at least 2, the component comprises an N-dimensional interior region and an (N−1)-dimensional port, the dataset comprises a plurality of basis functions for a reduced basis space associated with an interface function for the (N−1)-dimensional port, and a solution of the at least one partial differential equation represented by the accessed dataset depends on at least two independent spatial variables;

constructing a model of the component based at least in part on the accessed dataset and one or more parameters relating to a physical characteristic of the component, the model being an N-dimensional model, wherein constructing an N-dimensional model of the component comprises selecting coefficients for scaling the plurality of basis functions; and using the model of the component to compute at least one output value based on at least one input value, wherein the at least one input value is indicative of at least one physical condition under which the physical system is to be evaluated, and the at least one output value is indicative of a behavior of the physical system under the at least one physical condition.

27. A computer-implemented method for modeling and analyzing a physical system comprising a plurality of components the method comprising acts of:

accessing, based at least in part on a component type of a component of the plurality of components, a dataset from a plurality of datasets, the dataset comprising a representation of at least one partial differential equation, wherein:

the component is an N-dimensional component, N being at least 2, a solution of the at least one partial differential equation represented by the accessed dataset depends on at least two independent spatial variables, the component is a first component comprising a first N-dimensional interior region and a first (N−1)-dimensional port, the dataset comprises a first dataset comprising an N-dimensional interface function associated with an (N−1)-dimensional interface function on the first (N−1)-dimensional port, the N-dimensional interface function being a result of lifting the (N−1)-dimensional interface function onto the first N-dimensional interior region, wherein the N-dimensional interface function matches the (N−1)-dimensional interface function at the first (N−1)-dimensional port, diminishes into the first N-dimensional interior region, and becomes zero at at least one other port, the first dataset further comprises a reduced basis space over the first N-dimensional interior region, the reduced basis space being associated with the N-dimensional interface function and comprising a plurality of basis functions, and the first dataset further comprises at least one product of two or more functions, the at least one product being independent of one or more parameters relating to a physical characteristic of the component;

constructing a model of the component based at least in part on the accessed dataset and the one or more parameters, the model being an N-dimensional model; and using, by at least one processor, the model of the component to compute at least one first output value based on at least one input value, wherein the at least one input value is indicative of at least one physical condition under which the physical system is to be evaluated, and the at least one first output value is indicative of a behavior of the physical system under the at least one physical condition.

28. The computer-implemented method of claim 27, wherein the model of the first component is a first model constructed based on the first dataset and a first parameter value of the one or more parameters of the first component, and wherein the method further comprises:
accessing, based at least in part on a second component type of a second component of the plurality of components, a second dataset from the plurality of datasets, wherein the second component comprises a second N-dimensional interior region and a second (N−1)-dimensional port;
constructing a second model of the second component based at least in part on the second dataset; and
constructing a third model of the physical system based at least in part on the first model of the first component and the second model of the second component, comprising connecting the first port of the first component and the second port of the second component, wherein the at least one first output value is computed based on the at least one input value and the third model of the physical system.

29. The computer-implemented method of claim 28, wherein the method further comprises acts of:
receiving at least one user input indicative of a second parameter value of the one or more parameters of the first component, the second parameter value being different from the first parameter value;
constructing a fourth model of the first component based at least in part on the first dataset and the second parameter value;
constructing a fifth model of the physical system based at least in part on the fourth model of the first component and the second model of the second component, without modifying the second model of the second component; and
using the fifth model of the physical system to compute at least one second output value based on the at least one input value.

30. The computer-implemented method of claim 29, further comprising an act of:
automatically checking whether the first component, when instantiated with the second parameter value, is compatible with the physical system.

31. A computer-implemented method for modeling and analyzing a physical system comprising a plurality of components, the method comprising acts of:
accessing, based at least in part on a component type of a component of the plurality of components, a dataset from a plurality of datasets, the dataset comprising a representation of at least one partial differential equation, wherein the component is an N-dimensional component, N being at least 2, and wherein a solution of the at least one partial differential equation represented by the accessed dataset depends on at least two independent spatial variables;
constructing a model of the component based at least in part on the accessed dataset and one or more parameters relating to a physical characteristic of the component, the model being an N-dimensional model; and using, by at least one processor, the model of the component to compute at least one output value based on at least one input value, wherein the at least one input value is indicative of at least one physical condition under which the physical system is to be evaluated, and the at least one output value is indicative of a behavior of the physical system under the at least one physical condition, and wherein the component is a first component, the model of the component is a first model, and the plurality of components comprises a second component, and wherein the method further comprises:
constructing a composite model of the physical system, the composite model being based at least in part on the first model of the first component and a second model of the second component; and
computing an error estimate for the composite model at least in part by accumulating a first error estimate for the first model and a second error estimate for the second model.

32. The computer-implemented method of claim 31, further comprising:
computing the first error estimate at least in part by estimating a difference between a bubble function associated with the first model and an approximation of the bubble function, wherein the approximation comprises a linear combination of a plurality of basis functions.

33. A system for modeling and analyzing a physical system comprising a plurality of components, the system comprising:
at least one processor programmed to:
access, based at least in part on a component type of a component of the plurality of components, a dataset from a plurality of datasets, the dataset comprising a representation of at least one partial differential equation, wherein:
the component is an N-dimensional component, N being at least 2;
a solution of the at least one partial differential equation represented by the accessed dataset depends on at least two independent spatial variables;
the component is a first component comprising a first N-dimensional interior region and a first (N−1)-dimensional port;
the dataset comprises a first dataset comprising an N-dimensional interface function associated with an (N−1)-dimensional interface function on the first (N−1)-dimensional port, the N-dimensional interface function being a result of lifting the (N−1)-dimensional interface function onto the first N-dimensional interior region, wherein the N-dimensional interface function matches the (N−1)-dimensional interface function at the first (N−1)-dimensional port, diminishes into the first N-dimensional interior region, and becomes zero at at least one other port;
the first dataset further comprises a reduced basis space over the first N-dimensional interior region, the reduced basis space being associated with the N-dimensional interface function and comprising a plurality of basis functions; and
the first dataset further comprises at least one product of two or more functions, the at least one product being independent of one or more parameters relating to a physical characteristic of the component;
construct a model of the component based at least in part on the accessed dataset and the one or more parameters, the model being an N-dimensional model; and use the model of the component to compute at least one first output value based on at least one input value, wherein the at least one input value is indicative of at least one physical condition under which the physical system is to be evaluated, and the at least one first output value is indicative of a behavior of the physical system under the at least one physical condition.

34. At least one non-transitory computer-readable medium having encoded thereon instructions that, when executed by at least one processor, implement a method for modeling and analyzing a physical system comprising a plurality of components, the method comprising acts of:
  accessing, based at least in part on a component type of a component of the plurality of components, a dataset from a plurality of datasets, the dataset comprising a representation of at least one partial differential equation, wherein:
    the component is an N-dimensional component, N being at least 2,
    a solution of the at least one partial differential equation represented by the accessed dataset depends on at least two independent spatial variables,
    the component is a first component comprising a first N-dimensional interior region and a first (N−1)-dimensional port,
    the dataset comprises a first dataset comprising an N-dimensional interface function associated with an (N−1)-dimensional interface function on the first (N−1)-dimensional port, the N-dimensional interface function being a result of lifting the (N−1)-dimensional interface function onto the first N-dimensional interior region, wherein the N-dimensional interface function matches the (N−1)-dimensional interface function at the first (N−1)-dimensional port, diminishes into the first N-dimensional interior region, and becomes zero at at least one other port,
    the first dataset further comprises a reduced basis space over the first N-dimensional interior region, the reduced basis space being associated with the N-dimensional interface function and comprising a plurality of basis functions, and
    the first dataset further comprises at least one product of two or more functions, the at least one product being independent of one or more parameters relating to a physical characteristic of the component;
  constructing a model of the component based at least in part on the accessed dataset and the one or more parameters, the model being an N-dimensional model; and
  using the model of the component to compute at least one first output value based on at least one input value, wherein the at least one input value is indicative of at least one physical condition under which the physical system is to be evaluated, and the at least one first output value is indicative of a behavior of the physical system under the at least one physical condition.

35. A system for modeling and analyzing a physical system comprising a plurality of components, the system comprising:
  at least one processor programmed to:
    access, based at least in part on a component type of a component of the plurality of components, a dataset from a plurality of datasets, the dataset comprising a representation of at least one partial differential equation, wherein the component is an N-dimensional component, N being at least 2, and wherein a solution of the at least one partial differential equation represented by the accessed dataset depends on at least two independent spatial variables;
    construct a model of the component based at least in part on the accessed dataset and one or more parameters relating to a physical characteristic of the component, the model being an N-dimensional model; and
    use the model of the component to compute at least one output value based on at least one input value, wherein the at least one input value is indicative of at least one physical condition under which the physical system is to be evaluated, and the at least one output value is indicative of a behavior of the physical system under the at least one physical condition, and wherein the component is a first component, the model of the component is a first model, and the plurality of components comprises a second component, and wherein the at least one processor is further programmed to:
      construct a composite model of the physical system, the composite model being based at least in part on the first model of the first component and a second model of the second component; and
      compute an error estimate for the composite model at least in part by accumulating a first error estimate for the first model and a second error estimate for the second model.

36. At least one non-transitory computer-readable medium having encoded thereon instructions that, when executed by at least one processor, implement a method for modeling and analyzing a physical system comprising a plurality of components, the method comprising acts of:
  accessing, based at least in part on a component type of a component of the plurality of components, a dataset from a plurality of datasets, the dataset comprising a representation of at least one partial differential equation, wherein the component is an N-dimensional component, N being at least 2, and wherein a solution of the at least one partial differential equation represented by the accessed dataset depends on at least two independent spatial variables;
  constructing a model of the component based at least in part on the accessed dataset and one or more parameters relating to a physical characteristic of the component, the model being an N-dimensional model; and
  using the model of the component to compute at least one output value based on at least one input value, wherein the at least one input value is indicative of at least one physical condition under which the physical system is to be evaluated, and the at least one output value is indicative of a behavior of the physical system under the at least one physical condition, and wherein the component is a first component, the model of the component is a first model, and the plurality of components comprises a second component, and wherein the method further comprises:
    constructing a composite model of the physical system, the composite model being based at least in part on the first model of the first component and a second model of the second component; and
    computing an error estimate for the composite model at least in part by accumulating a first error estimate for the first model and a second error estimate for the second model.

* * * * *